United States Patent
Takeuchi et al.

(10) Patent No.: US 7,192,799 B2
(45) Date of Patent: Mar. 20, 2007

(54) MATRIX TYPE PIEZOELECTRIC/ELECTROSTRICTIVE DEVICE AND MANUFACTURING METHOD THEREOF

(75) Inventors: Yukihisa Takeuchi, Nishikamo-Gun (JP); Masashi Watanabe, Nagoya (JP); Koji Kimura, Nagoya (JP); Tatsuo Kawaguchi, Motosu-Gun (JP)

(73) Assignee: NGK Insulators, Ltd., Nagoya (JP)

( * ) Notice: Subject to any disclaimer, the term of this patent is extended or adjusted under 35 U.S.C. 154(b) by 416 days.

(21) Appl. No.: 10/834,297

(22) Filed: Apr. 28, 2004

(65) Prior Publication Data

US 2004/0201324 A1    Oct. 14, 2004

Related U.S. Application Data

(62) Division of application No. 10/212,466, filed on Aug. 5, 2002, now Pat. No. 6,794,723.

(30) Foreign Application Priority Data

Sep. 12, 2001 (JP) ............................ 2001-277206
Jan. 17, 2002 (JP) ............................ 2002-008537

(51) Int. Cl.
*H01L 41/00* (2006.01)
*H01L 21/44* (2006.01)
*H01L 41/047* (2006.01)
*H01L 41/083* (2006.01)

(52) U.S. Cl. .................. 438/51; 438/1; 438/3; 438/660

(58) Field of Classification Search .................... 438/1, 438/3, 21, 51, 53, 660
See application file for complete search history.

(56) References Cited

U.S. PATENT DOCUMENTS

| 6,222,303 B1 | 4/2001 | Nakamura et al. |
| 6,472,799 B2 | 10/2002 | Takeuchi et al. |
| 6,584,660 B1 | 7/2003 | Shimogawa et al. |
| 2002/0140318 A1 | 10/2002 | Takeuchi et al. |

FOREIGN PATENT DOCUMENTS

| EP | 0 609 080 | 8/1994 |
| EP | 0 736 386 A2 | 10/1996 |
| EP | 0 936 684 A1 | 8/1999 |
| JP | 03-243358 A1 | 10/1991 |
| JP | 10-278259 A1 | 10/1998 |
| JP | 2000-168083 A1 | 6/2000 |
| JP | 2002-257845 A1 | 9/2002 |
| WO | 99/56500 | 11/1999 |

*Primary Examiner*—Zandra V. Smith
*Assistant Examiner*—Pamela E Perkins
(74) *Attorney, Agent, or Firm*—Burr & Brown

(57) ABSTRACT

A method of making a matrix type piezoelectric/electrostrictive device having a plurality of pillar shaped piezoelectric/electrostrictive elements, each having a piezoelectric/electrostrictive substance and at least a pair of electrodes being formed on the sides of the substance, are vertically provided on a thick ceramic substrate, such that the device is driven by displacement of the piezoelectric/electrostrictive substance. In this device, the piezoelectric/electrostrictive elements are integrally bonded to the ceramic substrate and independently arranged in two dimensions. The percentage of transgranularly fractured crystal grains on at least the sides of the piezoelectric/electrostrictive substance on which the electrodes are formed is 10% or less. The unit forms a curved surface near a joined section between the substance and the substrate.

13 Claims, 31 Drawing Sheets

DIRECTION Q

DIRECTION R

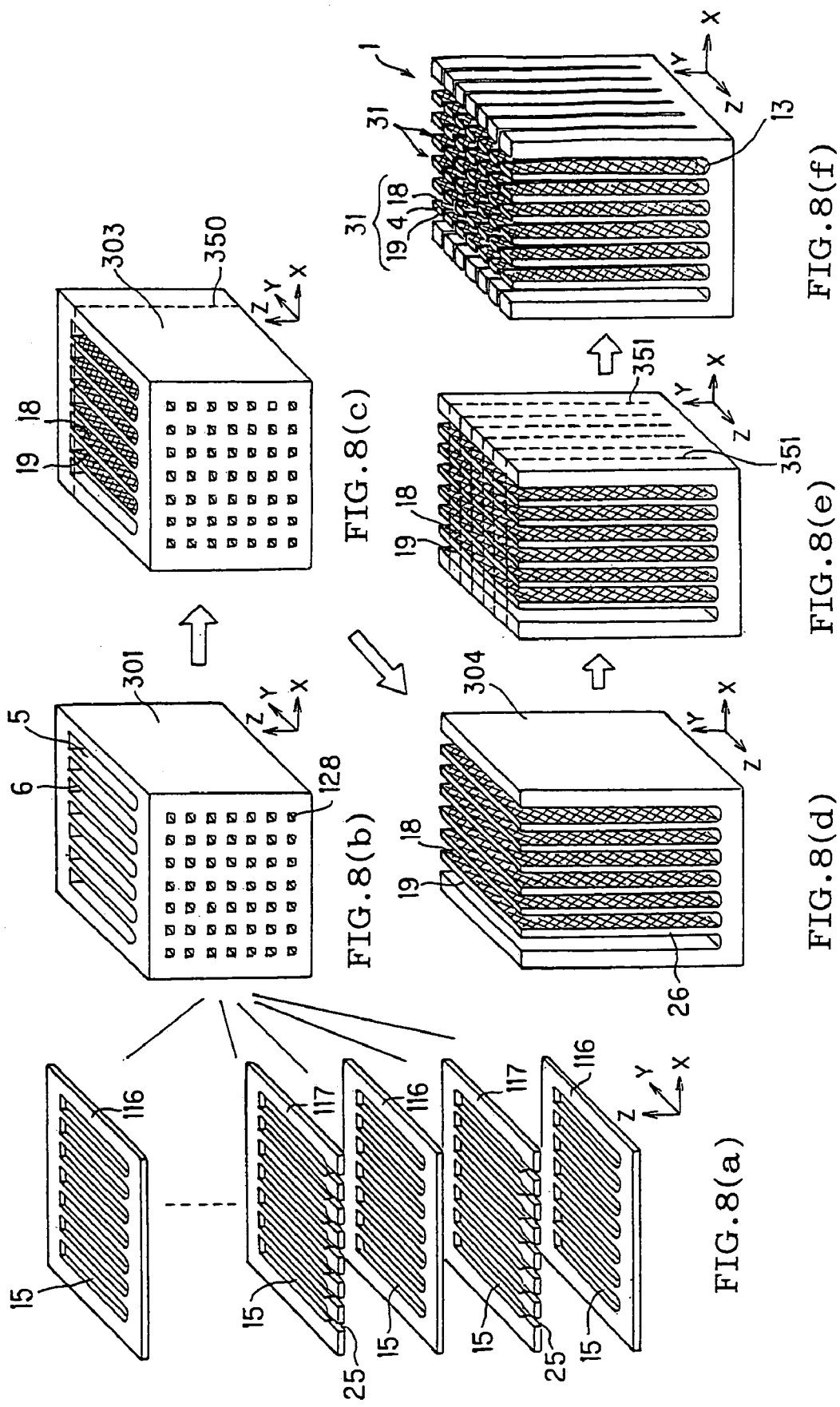

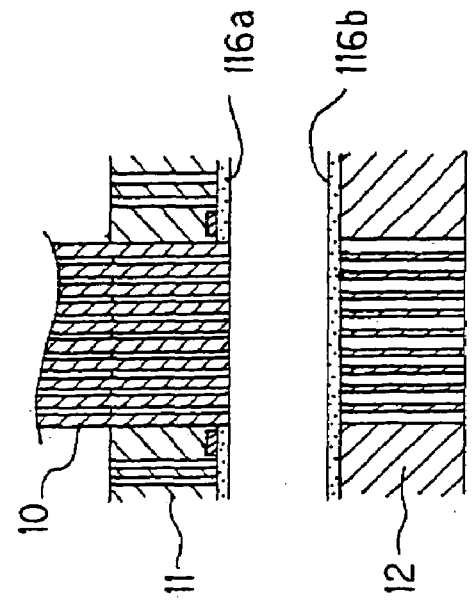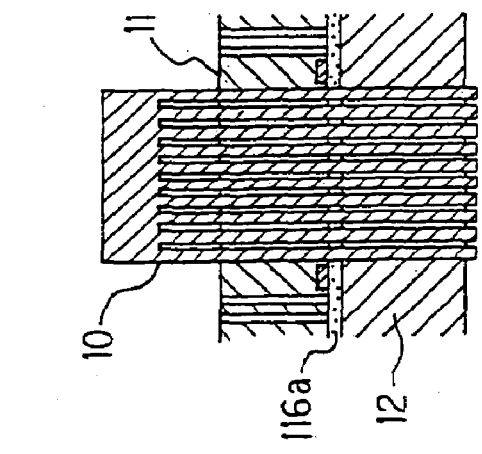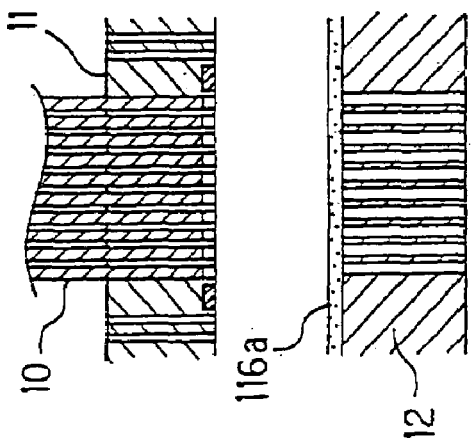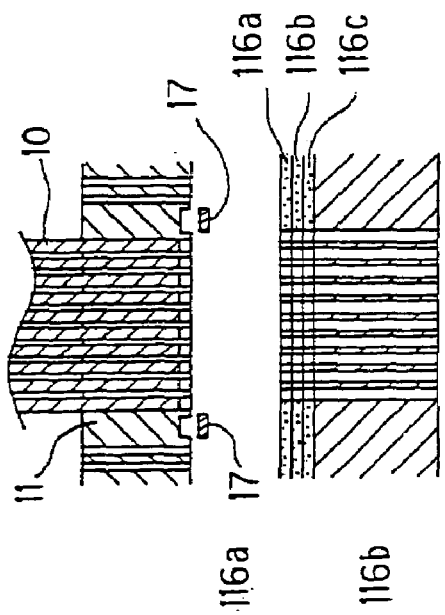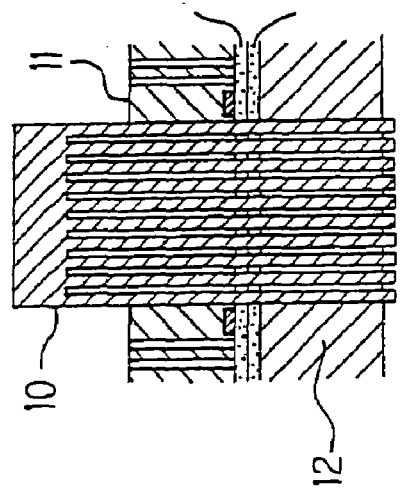

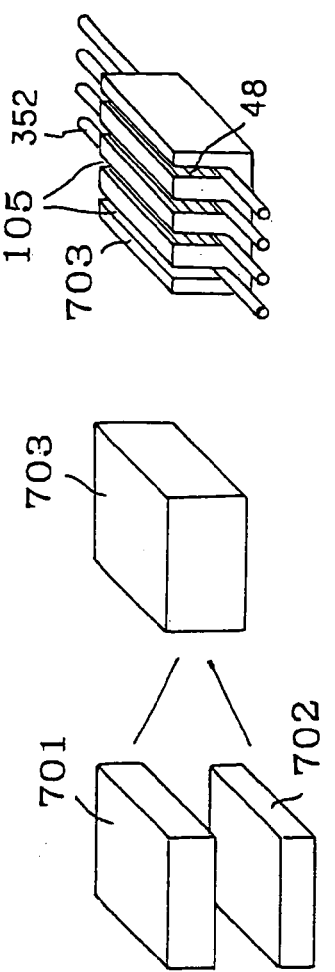
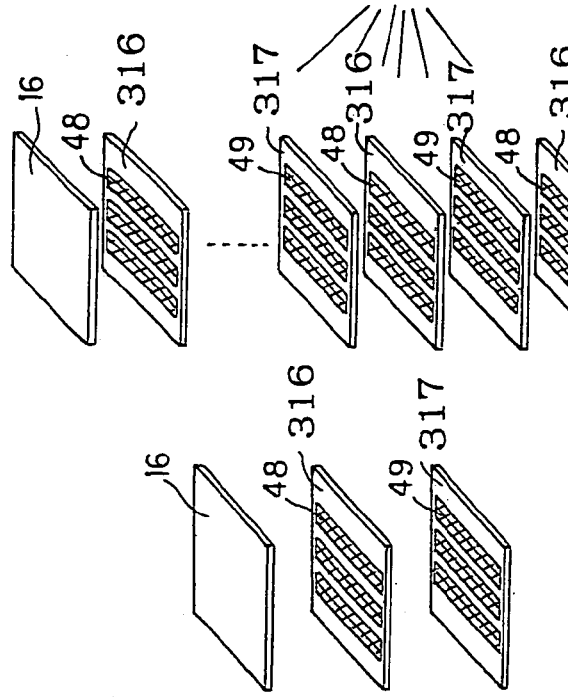
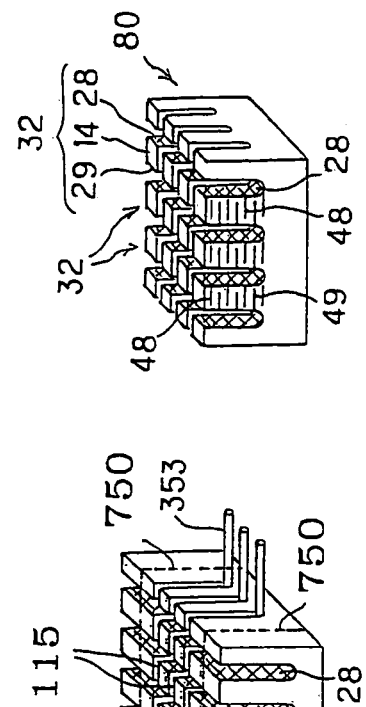
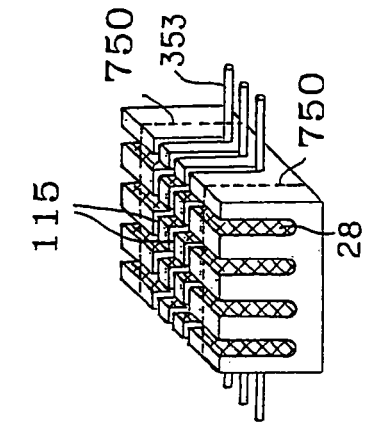
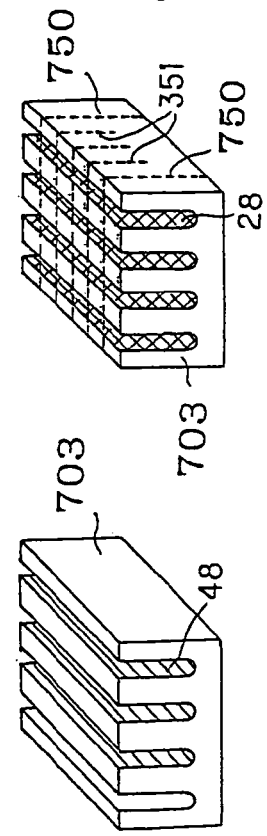

MATRIX TYPE PIEZOELECTRIC/ELECTROSTRICTIVE DEVICE AND MANUFACTURING METHOD THEREOF

CROSS REFERENCE TO RELATED APPLICATION

This application is a division of U.S. application Ser. No. 10/212,466, filed Aug. 5, 2002, now U.S. Pat. No. 6,794,723 the entirety of which is incorporated herein by reference.

BACKGROUND OF THE INVENTION AND RELATED ART

The present invention relates to a matrix type piezoelectric/electrostrictive device. More particularly, the present invention relates to a matrix type piezoelectric/electrostrictive device which is used for an optical modulator, optical switch, electrical switch, microrelay, microvalve, transportation device, image display device such as a display and a projector, image drawing device, micropump, droplet discharge device, micromixer, microstirrer, microreactor, various types of sensors, and the like, generates large force and large displacement, allows a piezoelectric/electrostrictive substance to generate expansion/contraction displacement or expansion/contraction vibration in a direction perpendicular to a main surface of a ceramic substrate by a transverse effect of an electric field induced strain of the piezoelectric/electrostrictive substance, and applies action such as pushing, distorting, moving, striking (impacting), or mixing to an object of action or operates when such action is applied, and to a method of manufacturing the matrix type piezoelectric/electrostrictive device.

In recent years, displacement control elements capable of adjusting the length or position of an optical path on the order of sub-microns have been demanded in the field of optics, precision machining, manufacture of semiconductors, and the like. To deal with this demand, development of piezoelectric/electrostrictive devices such as actuators or sensors which utilize strain based on a reverse piezoelectric effect or an electrostrictive effect occuring when an electric field is applied to ferroelectrics or antiferroelectrics has progressed. The displacement control elements utilizing an electric field induced strain are capable of easily controlling minute displacement, decreasing power consumption due to high mechanical/electrical energy conversion efficiency, and contributing to a decrease in the size and weight of a product due to ultraprecise mounting capability in comparison with a conventional electromagnetic method or the like using a servomotor or a pulsemotor. Therefore, application fields of displacement control elements are expected to be expanded steadily in the future.

Taking an optical switch as an example, use of a piezoelectric/electrostrictive device as an actuator for switching a transmission path of introduced light has been proposed. FIGS. 2(a) and 2(b) show an example of an optical switch. An optical switch 200 shown in FIGS. 2(a) and 2(b) includes a light transmitting section 201, an optical path change section 208, and an actuator section 211. The light transmitting section 201 includes a light reflecting surface 101 provided on part of a surface which faces the optical path change section 208, and light transmitting paths 202, 204, and 205 provided in three directions from the light reflecting surface 101. The optical path change section 208 includes a light introducing member 209 which is moveably provided close to the light reflecting surface 101 in the light transmitting section 201 and formed of a light transmitting material, and a light reflecting member 210 which totally reflects light. The actuator section 211 includes a mechanism which is displaced by an external signal and transmits the displacement to the optical path change section 208.

As shown in FIG. 2(a), the actuator section 211 operates (displaces) by applying an external signal such as a voltage. The optical path change section 208 is separated from the light transmitting section 201 by the displacement of the actuator section 211. Light 221 introduced into the light transmitting path 202 in the light transmitting section 201 is totally reflected by the light reflecting surface 101 in the light transmitting section 201, of which the refractive index is adjusted at a specific value. The reflected light 221 is transmitted to the light transmitting path 204 on the output side.

As shown in FIG. 2(b), the actuator section 211 returns to the original position when the actuator section 211 enters a non-operating state, whereby the light introducing member 209 in the optical path change section 208 comes in contact with the light transmitting section 201 at a distance equal to or less than the wavelength of the light. As a result, the light 221 introduced into the light transmitting path 202 is introduced into the light introducing member 209 from the light transmitting section 201 and transmitted through the light introducing member 209. The light 221 transmitted through the light introducing member 209 reaches the light reflecting member 210. The light 221 is reflected by the light reflecting surface 102 of the light reflecting member 210 and transmitted to the light transmitting path 205, differing from the light reflected by the light reflecting surface 101 in the light transmitting section 201.

As described above, the piezoelectric/electrostrictive device is suitably used as the actuator section of the optical switch having a function of changing the optical path. In particular, in the case of forming a matrix switch which switches between a plurality of channels, a piezoelectric/electrostrictive device in which a plurality of uni-morph or bi-morph piezoelectric/electrostrictive elements (hereinafter may be referred to as "bending displacement elements") are arranged, as disclosed in Japanese Patent No. 2693291 issued to the applicant of the present invention, is suitably employed. The bending displacement element consists of a diaphragm and a piezoelectric/electrostrictive element, and generates bending displacement by converting only a small amount of expansion/contraction strain of the piezoelectric/electrostrictive element produced when applying an electric field into a bending mode. Therefore, a large displacement is easily obtained in proportion to the length of the piezoelectric/electrostrictive element.

However, since the bending displacement element converts strain, stress which causes the strain of the piezoelectric/electrostrictive element cannot be directly utilized. Therefore, it is very difficult to increase displacement and force generation at the same time. Moreover, since the resonance frequency is inevitably decreased as the length of the element is increased, it is also difficult to satisfy a desired response speed.

In order to further improve the performance of the above type of optical switch, there have been at least the following two demands. Specifically, an increase in ON/OFF ratio (contrast) is demanded. In the case of the optical switch 200, it is important to securely perform contact/separation operations between the light transmitting section 201 and the optical path change section 208. Therefore, the actuator section preferably has a large stroke, specifically, generates large displacement.

The other demand is to minimize a loss caused by switching. In this case, it is important to increase a substantial contact area between the optical path change section 208 and the light transmitting section 201 while increasing the area of the optical path change section 208. However, since an increase in the contact area causes reliability relating to separation to be decreased, a piezoelectric/electrostrictive device capable of generating a large force is necessary as the actuator section. Specifically, a piezoelectric/electrostrictive device capable of generating displacement and force at the same time is demanded as the actuator section in order to improve the performance of the optical switch.

It is preferable that each of the piezoelectric/electrostrictive elements be formed independently. This means that each of the piezoelectric/electrostrictive elements does not interfere with the others, specifically, does not restrict displacement and force generated by other piezoelectric/electrostrictive elements.

For example, a piezoelectric/electrostrictive device 145 shown in FIG. 3 shows bending displacement by the operation of piezoelectric/electrostrictive elements 178, as shown in the cross section in FIG. 4. Each of the piezoelectric/electrostrictive elements 178 is formed to be mechanically independent from the adjacent piezoelectric/electrostrictive elements by utilizing the rigidity of a partition 143.

However, a substrate 144 has an integral structure, and a vibration plate, on which the piezoelectric/electrostrictive element 178 acts, is continuously formed. Therefore, it cannot be denied that tension or compressive stress of the vibration plate which occurs by the operation of the piezoelectric/electrostrictive element 178 affects the adjacent piezoelectric/electrostrictive elements, although the adjacent piezoelectric/electrostrictive elements are separated by the partition 143. This particularly applies to a case where the piezoelectric/electrostrictive elements are formed at a high density.

In a piezoelectric/electrostrictive device 155 shown in FIG. 5 (cross section), since side walls 219 which support a vibration plate 218 are separated from the adjacent side walls 219, the adjacent piezoelectric/electrostrictive elements are not affected.

As another embodiment of the piezoelectric/electrostrictive device in which each of the piezoelectric/electrostrictive elements is formed independently, Japanese Patent No. 3058143 proposes an actuator in FIG. 1. This actuator is a piezoelectric actuator suitable for a ink-jet type recording device, in which pillar-shaped piezoelectric elements which function as drive mechanisms are arranged in rows and columns. Japanese Patent No. 3058143 states that a plurality of piezoelectric elements can be highly integrated on a substrate in rows and columns by employing piezoelectric transverse effect type piezoelectric elements having a simple electrode configuration, and the number of ink-jet nozzles per unit area in the ink-jet type recording device can be increased.

The piezoelectric actuator disclosed in this patent is formed by stacking and sintering green sheets to which common electrodes or signal applying electrodes are applied, and by forming grooves using a dicing saw so that the pillar-shaped piezoelectric elements are separated. Therefore, this piezoelectric actuator has at least the following two problems.

Since this piezoelectric actuator has a structure in which driver electrodes are stored in the piezoelectric element in advance, an electrode-piezoelectric material stacked structure of each of the piezoelectric elements becomes non-uniform due to the influence of strain during sintering. This causes characteristics of the elements to become uneven. Since the size (width or thickness) must be increased taking strain during sintering into consideration, it is difficult to decrease the pitch of the elements. According to the configuration example disclosed in Japanese Patent No. 3058143, since the width of the piezoelectric element is 0.3 mm and the width of the groove is 0.209 to 0.718 mm, one piezoelectric element is disposed per $mm^2$. Such a degree of integration is insufficient to deal with the resolution required for ink-jet printers in recent years.

Moreover, the above degree of integration is insufficient for optical switches represented by the embodiment shown in FIGS. 2(a) and 2(b). The number of channels of optical switching devices is expected to be increased as construction of an optical network system without photoelectric conversion progresses. Therefore, a decrease in the size of optical switching devices and an increase in the degree of integration of optical switches used for the optical switching devices will be demanded in order to reduce transmission loss of signals. However, the degree of integration of the above piezoelectric actuator cannot deal with such a demand.

Each of the piezoelectric elements of the piezoelectric actuator disclosed in Japanese Patent No. 3058143 is formed by dicing saw processing. However, the depth of the grooves, specifically, the height of the piezoelectric elements is limited due to limitations relating to the processing. Since displacement of the transverse effect type elements depends on the height of the piezoelectric element, sufficient displacement cannot be obtained if the height of the element is limited. Specifically, the aspect ratio (height/thickness) of the piezoelectric element (piezoelectric), which is an index of the degree of integration and characteristics, cannot be increased. Therefore, the above piezoelectric actuator is not suitable as the actuator section for not only ink-jet printers, but also optical switches and the like.

As described above, a piezoelectric/electrostrictive device such as an actuator which is capable of generating displacement and force and in which piezoelectric/electrostrictive elements can be disposed independently at an extremely high density is demanded. The present invention has been achieved to deal with this demand. Specifically, an object of the present invention achieved in view of the above situation is to provide a piezoelectric/electrostrictive device which generates large displacement at a low voltage, has a high response speed, generates a large force, excels in mounting capability, enables a higher degree of integration, and applies action such as pushing, distorting, moving, striking (impacting), or mixing to an object of action, or operates when such action is applied, and a method of manufacturing the piezoelectric/electrostrictive device.

The present invention aims at improving the performance of an optical modulator, optical switch, electrical switch, microrelay, microvalve, transportation device, image display device such as a display and a projector, image drawing device, micropump, droplet discharge device, micromixer, microstirrer, microreactor, various types of sensors, or the like by applying the piezoelectric/electrostrictive device thereto. As a result of extensive studies, the present inventors have found that the above object can be achieved by the following matrix type piezoelectric/electrostrictive device and a manufacturing method thereof.

SUMMARY OF THE INVENTION

The present invention provides a matrix type piezoelectric/electrostrictive device in which a plurality of piezoelectric/electrostrictive elements almost in the shape of a pillar, each having a piezoelectric/electrostrictive substance and at least a pair of electrodes, are vertically provided on a thick ceramic substrate, and which is driven by displacement of the piezoelectric/electrostrictive substance. This matrix type piezoelectric/electrostrictive device is characterized in that a plurality of the piezoelectric/electrostrictive elements are jointed integrally to the ceramic substrate and are independently arranged in two dimensions, the pair of electrodes is formed on the sides of the piezoelectric/electrostrictive substance, the crystal grains on at least the sides of the piezoelectric/electrostrictive substance on which the electrodes are formed is in such a state that the percentage of transgranularly fractured crystal grains is 10% or less, and a curved surface is formed at the vicinity of a joining section between the piezoelectric/electrostrictive substance and the ceramic substrate.

In the matrix type piezoelectric/electrostrictive device according to the present invention, the degree of surface profile of the piezoelectric/electrostrictive substance of the piezoelectric/electrostrictive element is preferably about 8 μm or less. The ratio of the height of the piezoelectric/electrostrictive element almost in the shape of a pillar to the shortest distance through the center axis in the horizontal cross section of the piezoelectric/electrostrictive element (hereinafter may be called "the thickness of the piezoelectric/electrostrictive element") is preferably about 20:1 to 200:1. The shortest distance through the center axis in the horizontal cross section of the piezoelectric/electrostrictive element is preferably 300 μm or less.

In the matrix type piezoelectric/electrostrictive device according to the present invention, the ratio of the height of the piezoelectric/electrostrictive element almost in the shape of a pillar to an interval between the adjacent piezoelectric/electrostrictive elements is preferably about 20:1 to 200:1. The sides of the piezoelectric/electrostrictive substance preferably have an almost uniform surface state, and surface roughness represented by Rt of the sides of the piezoelectric/electrostrictive substance is preferably 9 μm or less, and surface roughness represented by Ra of the sides of the piezoelectric/electrostrictive substance is preferably 0.1 to 0.5 μm. The radius of curvature of the curved surface formed near the joined section between the piezoelectric/electrostrictive substance and the ceramic substrate is preferably 20 to 100 μm.

In the matrix type piezoelectric/electrostrictive device according to the present invention, the horizontal cross section of the piezoelectric/electrostrictive substance of the piezoelectric/electrostrictive element almost in the shape of a pillar is preferably in the shape of a parallelogram, and the electrodes are preferably formed on the sides including the long sides of the cross section of the piezoelectric/electrostrictive substance. The matrix type piezoelectric/electrostrictive device according to the present invention is a piezoelectric/electrostrictive device capable of utilizing either a longitudinal effect or a transverse effect of an electric field induced strain of the piezoelectric/electrostrictive substance. The piezoelectric/electrostrictive element is preferably expanded/contracted in a direction vertical to a main surface of the ceramic substrate based on displacement caused by the transverse effect.

As materials for the matrix type piezoelectric electrostrictive device according to the present invention, the ceramic substrate and the piezoelectric/electrostrictive substance which makes up the piezoelectric/electrostrictive element are preferably formed of the same material. As the material for the piezoelectric/electrostrictive substance, any of piezoelectric ceramics, electrostrictive ceramics, and antiferroelectric ceramics, or a composite material of these ceramics and a polymer piezoelectric material may be suitably used.

In the above matrix type piezoelectric/electrostrictive device, wall sections may be formed between the adjacent piezoelectric/electrostrictive elements. Electrode terminals are preferably formed on the side of the ceramic substrate opposite to the side on which the piezoelectric/electrostrictive elements are disposed. The electrodes and the electrode terminals are preferably connected via through holes or via holes formed in the ceramic substrate.

The present invention also provides the following first and second methods of manufacturing a matrix type piezoelectric/electrostrictive device.

A first method of manufacturing a matrix type piezoelectric/electrostrictive device according to the present invention is a method of manufacturing a matrix type piezoelectric/electrostrictive device in which a plurality of piezoelectric/electrostrictive elements almost in the shape of a pillar are two-dimensionally arranged on a thick ceramic substrate, wherein each of the piezoelectric/electrostrictive elements includes a piezoelectric/electrostrictive substance and at least a pair of electrodes, the percentage of transgranularly fractured crystal grains on at least the sides of the piezoelectric/electrostrictive substance on which the electrodes are formed is 1% or less, and the piezoelectric/electrostrictive substance forms a curved surface near a joined section between the piezoelectric/electrostrictive substance and the ceramic substrate. This manufacturing method comprises a first step of providing a plurality of ceramic green sheets containing a piezoelectric/electrostrictive material as a major component, a second step of forming opening sections having an almost right-angled quadrilateral shape, in which at least two corners are curved, at specific positions of a plurality of the ceramic green sheets, a third step of stacking a plurality of the ceramic green sheets in which the opening sections are formed to obtain a ceramic green laminate having holes, a fourth step of integrally sintering the ceramic green laminate to obtain a ceramic laminate having holes, a fifth step of forming electrodes at least on side walls which make up the holes in the ceramic laminate, a sixth step of cutting the ceramic laminate on the holes in a direction perpendicular to the arrangement of the holes and perpendicular to the openings of the holes to obtain a comb tooth-shaped ceramic laminate, and a seventh step of cutting the comb tooth of the comb tooth-shaped ceramic laminate in a direction perpendicular to the cutting surface obtained in the sixth step and perpendicularly to the arrangement of the comb tooth.

In the first method of manufacturing a matrix type piezoelectric/electrostrictive device according to the present invention, the ceramic green laminate preferably consists of at least two types of ceramic green sheets. One of the two types of ceramic green sheets is preferably a specific number of ceramic green sheets in which a plurality of opening sections almost in the shape of a right-angled quadrilateral in which two corners are curved are formed. The other of the two types of ceramic green sheets is preferably a specific number of ceramic green sheets in which a plurality of opening sections almost in the shape of a right-angled quadrilateral and a plurality of other opening sections connected with the opening sections in the shape of a right-angled quadrilateral are formed. The other opening sections are preferably connected with the opening sections almost in the shape of a right-angled quadrilateral and connected with the ends of the ceramic green sheets.

The first method of manufacturing a matrix type piezoelectric/electrostrictive device according to the present invention preferably comprises a step of cutting the ceramic laminate, thereby opening each of the other opening sections. The cutting in the seventh step is preferably performed by wire sawing. The first method preferably comprises a step of filling space between the comb tooth with fillers after the fifth step, but before the seventh step.

A second method of manufacturing a matrix type piezoelectric/electrostrictive device according to the present invention is a method of manufacturing a piezoelectric/electrostrictive device in which a plurality of piezoelectric/electrostrictive elements almost in the shape of a pillar are formed on a thick ceramic substrate, wherein each of the piezoelectric/electrostrictive elements includes a piezoelectric/electrostrictive substance and at least a pair of electrodes, the percentage of transgranularly fractured crystal grains on at least the sides of the piezoelectric/electrostrictive substance on which the electrodes are formed is 10% or less, and the piezoelectric/electrostrictive substance forms a curved surface near a joined section between the piezoelectric/electrostrictive substance and the ceramic substrate. This manufacturing method comprises a step A of providing a ceramic green formed product containing a piezoelectric/electrostrictive material as a major component, a step B of sintering a ceramic precursor including at least the ceramic green formed product to obtain an integral ceramic sintered product, a step C of forming a plurality of first slits in the ceramic sintered product by a machining method utilizing loose abrasives as processing media, a step D of forming the electrodes on the sides of the first slits, and a step E of forming a plurality of second slits which intersect the first slits.

In the second method of manufacturing a matrix type piezoelectric/electrostrictive device according to the present invention, the ceramic green formed product is preferably formed by stacking a plurality of ceramic green sheets. The ceramic precursor is preferably formed of at least a ceramic green substrate having through holes or via holes and the ceramic green formed product. The second method preferably comprises a step of filling the first slits with fillers after the step C, but before the step E.

In the second method of manufacturing a matrix type piezoelectric/electrostrictive device according to the present invention, it is preferable to use a wire sawing method as the machining method. In the case of using the wire saw processing method, it is preferable to form the first slits and/or the second slits by performing first cutting which includes processing the ceramic sintered product in the direction of the thickness of the ceramic sintered product to obtain first cut grooves, second cutting which includes processing the ceramic sintered product in the direction of the thickness at a specific distance from the first cutting position to obtain second cut grooves, and third cutting which includes cutting the ceramic sintered product from the inside of the second cut grooves toward the inside of the first cut grooves, thereby removing regions between the first cut grooves and the second cut grooves. In this case, it is preferable to fill the first cut grooves with fillers after the first cutting, but before the second cutting.

BRIEF DESCRIPTION OF THE DRAWINGS

FIGS. 1(a) to 1(c) are views showing one embodiment of a matrix type piezoelectric/electrostrictive device according to the present invention, wherein FIG. 1(a) is an oblique view, FIG. 1(b) is a side view in a direction Q shown in FIG. 1(a), and FIG. 1(c) is a side view in a direction R shown in FIG. 1(a).

FIGS. 2(a) and 2(b) are vertical cross-sectional views showing an application example of a conventional piezoelectric/electrostrictive device, wherein FIG. 2(a) shows an actuator section in an operating state in an optical switch which is the application example, and FIG. 2(b) shows the actuator section in a non-operating state in the optical switch which is the application example.

FIGS. 6(a) and 6(b) are views showing an application example of the matrix type piezoelectric/electrostrictive device according to the present invention, wherein FIG. 6(a) is an oblique view showing an actuator section in a microvalve which is the application example, and FIG. 6(b) is a vertical cross-sectional view showing the actuator section in an operating state in the microvalve which is the application example.

FIGS. 7(a) and 7(b) are views showing an application example of the matrix type piezoelectric/electrostrictive device according to the present invention, wherein FIG. 7(a) is a plan view showing an optical modulator which is the application example, and FIG. 7(b) is a view showing a cross section along the line A—A shown in FIG. 7(a).

FIGS. 8(a) to 8(f) are explanatory diagrams showing an example of a first method of manufacturing the matrix type piezoelectric/electrostrictive device according to the present invention.

FIGS. 27(*a*) to 27(*e*) are explanatory diagrams showing steps of one embodiment of a method punching and stacking ceramic green sheets at the same time in the first method of manufacturing of the matrix type piezoelectric/electrostrictive device according to the present invention; wherein FIG. 27(*a*) shows a first sheet preparation step in which a first ceramic green sheet is placed on a die, FIG. 27(*b*) shows a step of punching the first ceramic green sheet, FIG. 27(*c*) shows a second sheet preparation step in which a second ceramic green sheet is placed, FIG. 27(*d*) shows a step of punching the second ceramic green sheet, and FIG. 27(*e*) shows a punching completion step of separating the stacked ceramic green sheets by using a stripper after completing punching and stacking all the sheets.

FIGS. 37(*a*) to 37(*i*) are explanatory diagrams showing steps of another example of the second method of manufacturing the matrix type piezoelectric/electrostrictive device according to the present invention.

DETAILED DESCRIPTION OF THE INVENTION

Embodiments of a matrix type piezoelectric/electrostrictive device of the present invention and a method of manufacturing the same are described below in detail. However, these embodiments should not be construed as limiting the scope of the present invention. Various modifications, revisions, and improvements are possible within the scope of the present invention based on the knowledge of a person skilled in the art.

The matrix type piezoelectric/electrostrictive device according to the present invention is a unit which attains collective functions by utilizing strain induced by an electric field. The matrix type piezoelectric/electrostrictive device includes an actuator, a sensor, and the like having a piezoelectric/electrostrictive element as a constituent element. The matrix type piezoelectric/electrostrictive device according to the present invention is not limited to piezoelectric/electrostrictive devices which utilize a piezoelectric effect which produces strain in an amount almost proportional to an applied electric field, or an electrostrictive effect which produces strain in an amount almost proportional to the square of an applied electric field. The matrix type piezoelectric/electrostrictive device also includes piezoelectric/electrostrictive devices which utilize a phenomenon such as polarization inversion observed in ferroelectric materials or phase transition between an antiferroelectric phase and a ferroelectric phase observed in antiferroelectric materials. Therefore, "piezoelectric characteristics" used herein also include characteristics based on these phenomena. Necessity of polarization processing is appropriately determined based on properties of a material used for a piezoelectric/electrostrictive substance of the piezoelectric/electrostrictive element which makes up the piezoelectric/electrostrictive device. Therefore, in the present specification, only a material for which polarization processing is necessary is subjected to polarization processing.

Figure 1A:
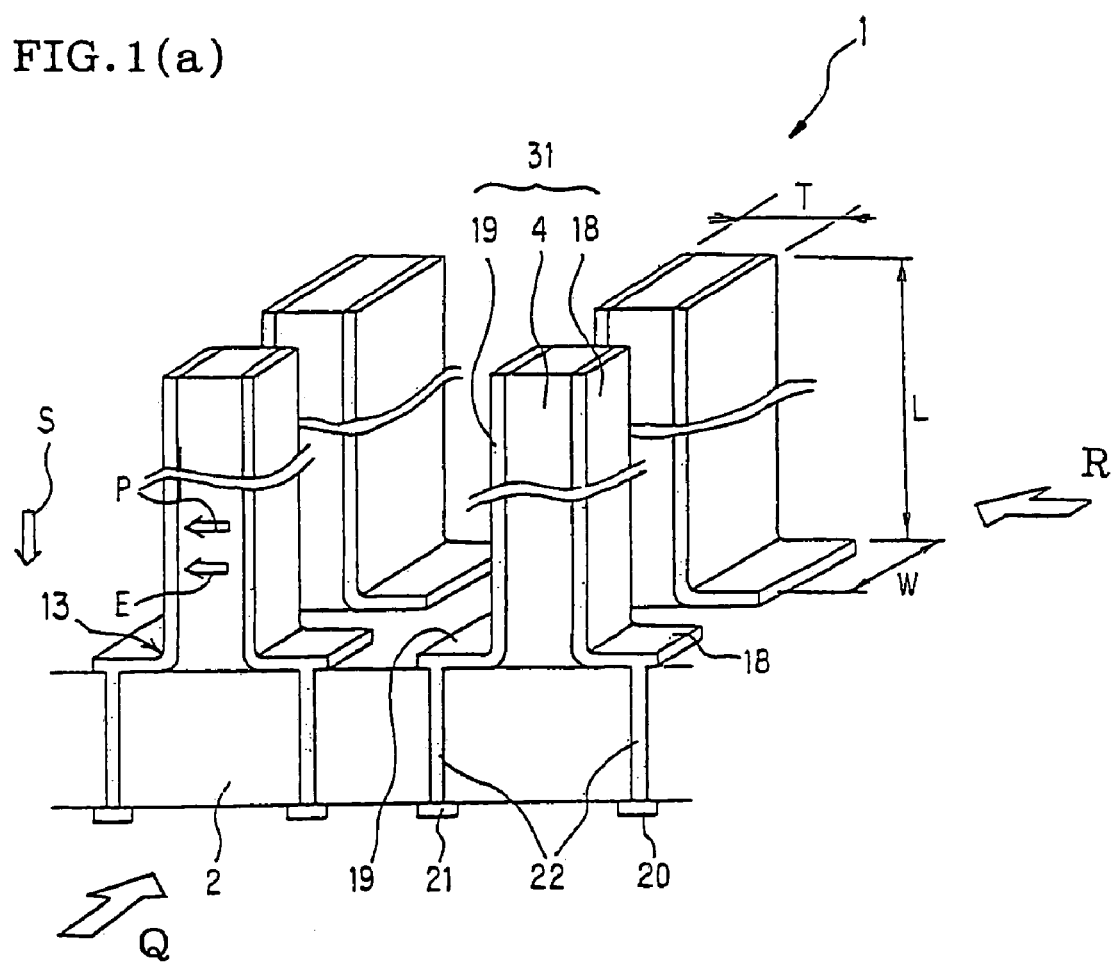
Figure 1B:
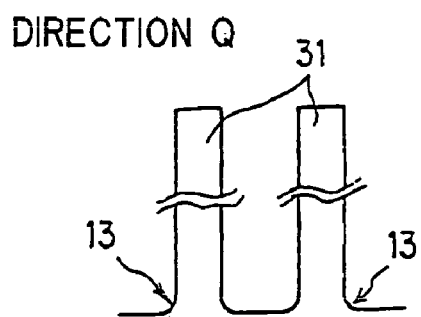
Figure 1C:
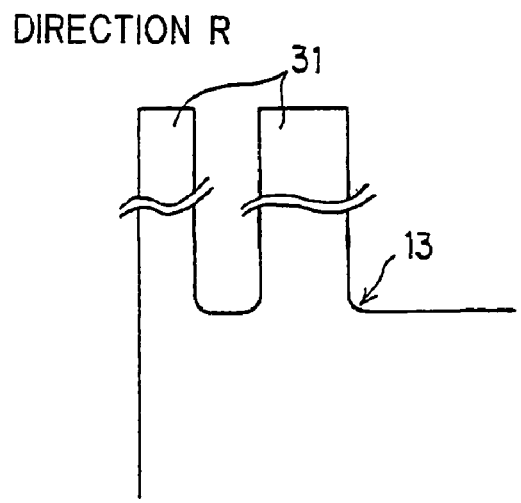

The embodiments of the present invention are described below with reference to the drawings. FIG. 1(a) is an oblique view showing one embodiment of a matrix type piezoelectric/electrostrictive device according to the present invention. FIG. 1(b) is a side view in a direction Q shown in FIG. 1(a). FIG. 1(c) is a side view in a direction R shown in FIG. 1(a). As shown in FIGS. 1(a) to 1(c), in a matrix type piezoelectric/electrostrictive device 1, a plurality of piezoelectric/electrostrictive elements 31, each having a piezoelectric/electrostrictive substance 4 and a pair of electrodes 18 and 19, are formed on a ceramic substrate 2. The matrix type piezoelectric/electrostrictive device 1 is driven by allowing the piezoelectric/electrostrictive substance 4 to be displaced on the ceramic substrate 2. The matrix type piezoelectric/electrostrictive device 1 has the following characteristics common to matrix type piezoelectric/electrostrictive devices according to the present invention.

1) Two-Dimensional Arrangement of Piezoelectric/Electrostrictive Element

Figure 3:
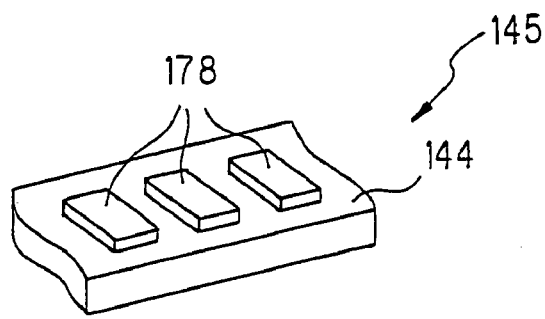
FIG. 3 is an oblique view showing one embodiment of a piezoelectric/electrostrictive device.
Figure 4:
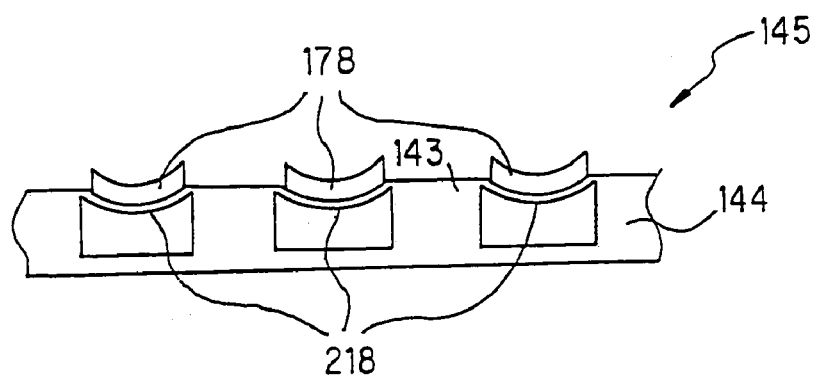
FIG. 4 is a vertical cross-sectional view showing one embodiment of the piezoelectric/electrostrictive device.
Figure 5:
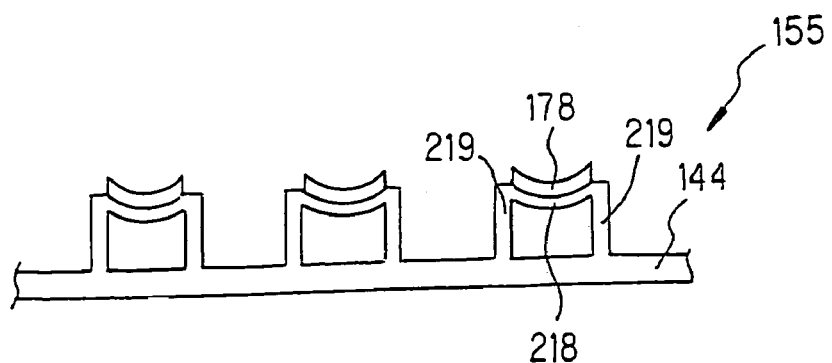
FIG. 5 is a vertical cross-sectional view showing another embodiment of the piezoelectric/electrostrictive device.

In the above-described conventional piezoelectric/electrostrictive device 145 shown in FIG. 3, the uni-morph or bi-morph piezoelectric/electrostrictive elements are arranged on the substrate. In the matrix type piezoelectric/electrostrictive device 1, a plurality of piezoelectric/electrostrictive elements 31 are arranged independently and integrally with the thick and substantially solid ceramic substrate 2 in the shape of a two-dimensional matrix. The matrix type piezoelectric/electrostrictive device 1 has a structure in which an adhesive or the like is not interposed in a region relating to arrangement of the elements and a region which becomes a base point for displacement of the piezoelectric/electrostrictive element. Therefore, precision of the initial element dimensions, element pitch, and the like is increased and deterioration of interposed materials does not occur. As a result, high dimensional accuracy and piezoelectric/electrostrictive element characteristics can be maintained for a long period of time.

In the case of using the matrix type piezoelectric/electrostrictive device 1 as a piezoelectric/electrostrictive device for optical switches, microvalves, image display devices, and the like, the matrix type piezoelectric/electrostrictive device 1 can be mounted with higher accuracy. Moreover, since the matrix type piezoelectric/electrostrictive device 1 has an integrated structure, the matrix type piezoelectric/electrostrictive device 1 excels in strength. This facilitates the mounting procedure.

The two-dimensional arrangement of the matrix type piezoelectric/electrostrictive device 1 is not limited to that in which the piezoelectric/electrostrictive elements are arranged at right angles. The intersection angle may be 30° or 45°. The intersection angle may be determined depending on the object and purpose of use.

Since the substrate is not allowed to function as a diaphragm, the thick ceramic substrate 2 is used. The thickness of the ceramic substrate may be appropriately determined insofar as the ceramic substrate 2 is not deformed due to stress applied from the piezoelectric/electrostrictive element formed thereon. It is preferable to bond other members to the ceramic substrate in order to improve strength of the ceramic substrate, handling capability of the piezoelectric/electrostrictive device, and the like.

2) Complete Independence of Piezoelectric/Electrostrictive Element

In the matrix type piezoelectric/electrostrictive device 1, only the piezoelectric/electrostrictive element 31 exposed on the ceramic substrate 2 is displaced. The ceramic substrate 2 is not deformed due to an electric field induced strain produced by the piezoelectric/electrostrictive substance 4. Therefore, each of the piezoelectric/electrostrictive elements 31 is completely independent from the adjacent piezoelectric/electrostrictive elements 31 and does not hinder displacement of the others, even if the piezoelectric/electrostrictive elements 31 are integrated with the ceramic substrate. Therefore, a greater amount of displacement can be stably obtained at a lower voltage.

3) Formation of Electrode on Low Transgranularly Fractured Surface

In the matrix type piezoelectric/electrostrictive device 1, crystal grains of a piezoelectric/electrostrictive material which form at least the electrode formation sides of the piezoelectric/electrostrictive substance 4 which makes up the piezoelectric/electrostrictive element 31 are designed so that the percentage of transgranularly fractured grains is 10% or less, and preferably 1% or less. The surface phase is almost uniform and homogeneous. The differential distribution of the surface state is extremely small.

Since the surface phase is homogeneous, the stress distribution is small. Therefore, the amount of deformation of the element is small even if the element has a high aspect ratio as described later, whereby precision of the dimensions and pitch of the element is easily maintained. Moreover, defects such as cracks rarely occur in the piezoelectric ceramic grains even if the ratio of the surface to the volume of the piezoelectric/electrostrictive element (piezoelectric/electrostrictive substance) is increased by decreasing the thickness of the piezoelectric/electrostrictive element in order to decrease the drive voltage. Therefore, original characteristics of the piezoelectric/electrostrictive material can be advantageously brought out.

Moreover, a moderate anchoring effect is obtained when forming the film-shaped electrodes on the sides of the piezoelectric/electrostrictive substance 4. This also enables the entire surface of the electrodes to be in a stable bonding state. Since only a small amount of transgranularly fractured grains are present on the surface of the electrodes, strain produced by applying a signal voltage is obtained from all the crystal grains and transmission loss of strain is small. Therefore, large displacement, large force generation, and large charge generation of the piezoelectric/electrostrictive element can be obtained in addition to the effect of adhesion of the electrode.

In the present invention, the percentage of transgranularly fractured crystal grains (10% or less, for example) refers to the percentage of crystal grains which do not have unevenness of the original crystal grains, but are fractured in the shape of a plane surface (flat) due to processing such as grinding or cutting. The percentage of the transgranularly fractured crystal grains is determined by observing the sides of the piezoelectric/electrostrictive substance (surface to which the electrode is formed) using a scanning electron microscope, and calculating the percentage of the area of regions in the above state occupying the area of the observation field of view in the microscope image. For example, the percentage of the transgranularly fractured crystal grains may be determined by dividing the microscope image into the regions in the above state and other regions by light and shade.

4) Formation of Curved Surface at Joined Section

As shown in FIGS. 1(b) and 1(c), in the matrix type piezoelectric/electrostrictive device 1, a curved surface 13 is formed near the joined section between the piezoelectric/electrostrictive element 31 (piezoelectric/electrostrictive substance 4) and the ceramic substrate 2. Specifically, the piezoelectric/electrostrictive substance 4 has a shape in which the cross section of the side parallel to the ceramic substrate 2 near an area in which the piezoelectric/electrostrictive substance 4 is joined to the ceramic substrate 2 is larger than the cross section in an area apart from the ceramic substrate 2 (uppermost side, for example) (area near the joined section between the piezoelectric/electrostrictive substance and the ceramic substrate may be hereinafter called "foot section"). Therefore, the direction of action is easily fixed and the piezoelectric/electrostrictive substance 4 is rarely damaged. Moreover, continuity of the electrode film is improved at the joined section between the substrate and the piezoelectric/electrostrictive substance, whereby reliability of bonding between the side electrodes of the piezoelectric/electrostrictive substance 4 and external wiring is increased.

In particular, since the thickness of the electrode film is increased at the joined section, a non-uniform state is easily formed. Therefore, disconnection during a heat treatment for increasing adhesion or disconnection due to displacement or the like when driving the piezoelectric/electrostrictive element is easily caused to occur. Furthermore, tolerance to reaction applied from an object of action to the matrix type piezoelectric/electrostrictive device 1 is improved. As a result, the piezoelectric/electrostrictive substance 4 is rarely buckled or bent, for example.

The radius of the curved surface 13 near the joined section is preferably 20–100 µm. If the radius of the curved surface 13 is less than 20 µm, an effect of making the area near the joined section in the shape of the letter R may not be obtained. If the radius exceeds 100 µm, the distance between the electrodes of the piezoelectric/electrostrictive element 31 is increased in the foot section and the percentage of the foot section is increased, although this is effective for increasing the strength. As a result, it becomes difficult to efficiently drive the piezoelectric/electrostrictive element 31.

5) Formation of Electrode Terminal

In the matrix type piezoelectric/electrostrictive device 1, the piezoelectric/electrostrictive element 31 is vertically provided on the ceramic substrate 2. The electrodes 18 and 19 are formed on the closer opposite sides of the piezoelectric/electrostrictive substance 4. In other words, the electrodes 18 and 19 are formed on the sides including the long sides of a cross-sectional shape of the piezoelectric/electrostrictive substance 4 of the piezoelectric/electrostrictive element 31 in the direction parallel to the ceramic substrate 2, specifically, a rectangle which is one type of parallelogram.

Electrode terminals 20 and 21 are formed on the side of the ceramic substrate 2 opposite to the side on which the piezoelectric/electrostrictive elements 31 are disposed. The electrode 18 and the electrode terminal 20 and the electrode 19 and the electrode terminal 21 are respectively connected through via holes 22 which are formed in the ceramic substrate 2 and filled with a conductive material. Through holes in which a conductive material is applied to the inner surface may be used instead of the via holes 22. A subsequent procedure for connecting a power supply for applying an electric field is facilitated by forming the electrode terminals on the side opposite to the piezoelectric/electrostrictive elements 31 (drive sections). This prevents a decrease in yield due to the manufacturing steps.

6) Expansion/Contraction Displacement

The matrix type piezoelectric/electrostrictive device 1 does not convert an expanded/contracted electric field induced strain of the piezoelectric/electrostrictive substance 4 into displacement in a bending mode. The matrix type piezoelectric/electrostrictive device 1 directly utilizes the expansion/contraction as displacement. Therefore, design values for obtaining large displacement are easily determined without decreasing force generation and response.

7) Parallelism Between Polarization and Driving Field

In the matrix type piezoelectric/electrostrictive device 1, the piezoelectric/electrostrictive substance 4 which makes up the piezoelectric/electrostrictive element 31 is polarized in a direction P shown in FIG. 1(a) parallel to the main surface of the ceramic substrate 2. A driving electric field is formed in a direction E by connecting a power supply to the electrode terminals 20 and 21 and applying a voltage between the electrode 18 as a positive electrode and the electrode 19 as a negative electrode. Specifically, the polarization field and the driving electric field of the piezoelectric/electrostrictive substance 4 are in the same direction.

As a result, the piezoelectric/electrostrictive element 31 is contracted in a direction S vertical to the main surface of the ceramic substrate 2 based on the transverse effect of the electric field induced strain of the piezoelectric/electrostrictive substance 4. The piezoelectric/electrostrictive element 31 is expanded when an electric field at 180° opposite to the polarization direction P (at a field intensity which does not cause polarization inversion) is applied. The main surface refers to the side of the ceramic substrate 2 on which the piezoelectric/electrostrictive substances are formed.

Since the polarization field is parallel to the driving electric field of the piezoelectric/electrostrictive substance 4 which makes up the piezoelectric/electrostrictive element 31, it is unnecessary to apply an electric field by forming a temporal polarization electrode which is necessary when utilizing a mode in which the polarization direction is not parallel to the driving field such as a shear mode (d15), whereby throughput can be improved.

Moreover, a manufacturing process accompanying heating at a high temperature equal to or more than the Curie temperature can be applied regardless of polarization processing. Therefore, the piezoelectric/electrostrictive device can be secured and wired to a circuit board by soldering using solder reflow or thermoset bonding, for example. This enables the throughput to be further improved including manufacturing steps for a product to which the piezoelectric/electrostrictive device is applied, whereby the manufacturing cost can be decreased. The polarization is not changed even if the piezoelectric/electrostrictive device is driven at a high field intensity. The polarization can be in a better state, whereby a large amount of strain can be stably obtained. Therefore, the size of the piezoelectric/electrostrictive device can be further decreased.

8) Piezoelectric/Electrostrictive Substance Excelling in Degree of Profile

The matrix type piezoelectric/electrostrictive device 1 is in the shape of a rectangular parallelepiped except for the curved surface near the joined section, as shown in FIG. 1(a). The matrix type piezoelectric/electrostrictive device 1 is formed so that the degree of surface profile of the piezoelectric/electrostrictive substance 4 of the piezoelectric/electrostrictive element 31 is about 8 µm or less. Therefore, a desired amount of displacement or force generation can be allowed to act in a desired direction, whereby the characteristics of the piezoelectric/electrostrictive element 31 can be efficiently utilized. The piezoelectric/electrostrictive element 31 exhibits high tolerance to reaction applied by action such as pushing or striking an object by operating the piezoelectric/electrostrictive element 31 due to an excellent degree of profile. Therefore, damage such as breaking or cracking rarely occurs even in the case of using thin and tall piezoelectric/electrostrictive elements having a high aspect ratio.

The degree of surface profile is defined in Japanese Industrial Standards (JIS) B0621 "Definitions And Designations Of Geometrical Deviations". The surface profile refers to a surface designated to have a shape specified from the viewpoint of the function. The degree of surface profile refers to the amount of deviation of the surface profile from a geometrical profile specified by theoretically accurate dimensions.

9) Piezoelectric/Electrostrictive Element Having High Aspect Ratio

Each of the piezoelectric/electrostrictive elements which make up the matrix type piezoelectric/electrostrictive device generally generates displacement shown by an equation (1) and stress $F_B$ shown by an equation (2).

$$X_B = \frac{L}{T} \times d_{31} \times V \quad (1)$$

$$F_B = W \times \frac{d_{31}}{S_{11}^E} \times V \quad (2)$$

Specifically, displacement and force generation can be designed individually. T, L, and W respectively represent the thickness, length, and width of the piezoelectric/electrostrictive substance.

$S_{11}^E$ represents elastic compliance. Therefore, it is advantageous to decrease the thickness T and increase the height L of the piezoelectric/electrostrictive substance in order to secure both displacement and force generation. However, it is very difficult to handle such a plate-shaped member having a high aspect ratio (L/T). Moreover, it is impossible to arrange the plate-shaped members with high accuracy.

The matrix type piezoelectric/electrostrictive device 1 according to the present invention is manufactured by a method described later so that the piezoelectric/electrostrictive elements 31 are integrally formed with the substrate 2 and have an aspect ratio as high as 20–200 without individually handling or arranging each of the piezoelectric/electrostrictive elements 31 (direction of height is omitted in FIGS. 1(a) to 1(c)). The matrix type piezoelectric/electrostrictive device 1 is formed so that large displacement and large force generation are obtained at a low drive voltage.

10) Highly Integrated Piezoelectric/Electrostrictive Element

The matrix type piezoelectric/electrostrictive device 1 is manufactured by a method described later so that the thickness T of the piezoelectric/electrostrictive substance 4 of the piezoelectric/electrostrictive element 31 is as thin as 300 μm or less. The matrix type piezoelectric/electrostrictive device 1 has a structure in which the driver electrodes are formed on the outer surface of the piezoelectric/electrostrictive substance 4. Therefore, the piezoelectric/electrostrictive elements 31 can be disposed at a high degree of integration in comparison with conventional piezoelectric/electrostrictive elements. The piezoelectric/electrostrictive elements 31 can be two-dimensionally arranged on the substrate 2 at a pitch of 1 mm, or even at a pitch of 0.5 mm or less.

As described in the section 9) "piezoelectric/electrostrictive element having high aspect ratio", since the piezoelectric/electrostrictive elements 31 are formed integrally with the substrate 2 without individually handling or arranging each of the piezoelectric/electrostrictive elements 31, the piezoelectric/electrostrictive elements having a high aspect ratio can be disposed at a high density. In more detail, the piezoelectric/electrostrictive elements 31 are disposed at a density whereby the ratio of the height L of the piezoelectric/electrostrictive element 31 to an interval between the adjacent piezoelectric/electrostrictive elements 31 is about 20:1 to 200:1. The matrix type piezoelectric/electrostrictive device 1 having such a high degree of integration is suitable as an actuator used for optical switches for optical switching systems, print heads for ink jet printers, and the like, which will be developed in the future.

11) Smoothness of Side of Piezoelectric/Electrostrictive Substance

In the matrix type piezoelectric/electrostrictive device 1, a surface roughness Rt of the sides of the piezoelectric/electrostrictive substance 4 which makes up the piezoelectric/electrostrictive element 31 is 9 μm or less, and a surface roughness Ra of the sides of the piezoelectric/electrostrictive substance 4 is 0.1 to 0.5 μm. Therefore, since the surface of the piezoelectric/electrostrictive substance 4 is almost smooth, uniform, and homogenous, variation of the thickness of the piezoelectric/electrostrictive substance 4 is small. Moreover, the electrodes 18 and 19 in the shape of a film exhibit good adhesion to the sides of the piezoelectric/electrostrictive substance 4 and can be formed uniformly. Because of this, the piezoelectric/electrostrictive substance 4 can be driven effectively. In other words, the piezoelectric/electrostrictive element 31 has a small stress distribution when an electric field is applied, is rarely damaged, has high reliability, has small inclination of displacement and force generation, and shows a uniform direction of action.

If the surface roughness Rt exceeds 9 μm or the surface roughness Ra exceeds 0.5 μm, it is difficult to uniformly coat the sides (surface) of the piezoelectric/electrostrictive substance 4, whereby formation of dense electrodes having a uniform thickness becomes difficult. Moreover, if the surface roughness Rt and the surface roughness Ra are increased, the distance between the electrodes which face each other with the piezoelectric/electrostrictive substance interposed therebetween may become non-uniform, whereby a field concentration or field distribution may easily occur.

If the surface roughness Ra is less than 0.1 μm, internal stress of the electrodes (films) is increased, whereby delamination due to drive of the piezoelectric/electrostrictive element may easily occur with the passage of time. Therefore, piezoelectric characteristics and the like cannot be effectively obtained due to a decrease in adhesion between the sides of the piezoelectric/electrostrictive substance and the electrodes, a decrease in the effective electrode area of the piezoelectric/electrostrictive element 31, and nonuniform electric field induced strain. Moreover, the piezoelectric characteristics may become unstable.

In particular, if the surface roughness Rt exceeds 9 μm, the matrix type piezoelectric/electrostrictive device 1 may not be stably driven, because variation of strength against reaction when applying action, such as buckling strength and flexural strength, is increased between the piezoelectric/electrostrictive elements 31.

The surface roughness used herein refers to a surface roughness defined in JIS B0601 "Definitions And Designations Of Surface Roughness". The surface roughness Ra used herein refers to a centerline average roughness defined in JIS B0601-1982 and corresponds to a value obtained by folding a roughness profile from the center line and dividing the area obtained by the roughness profile and the center line by the length L. Generally, the surface roughness Ra is directly read from the divisions indicated in a surface roughness measuring device. The surface roughness Rt is the same as a maximum height Rmax defined by the difference between the highest point and the lowest point on the measured surface.

The embodiments of the matrix type piezoelectric/electrostrictive device according to the present invention are further described below with reference to the drawings. Matrix type piezoelectric/electrostrictive devices described below have at least the above characteristics 1) to 7), and preferably the above characteristics 8) to 11).

Figure 9:
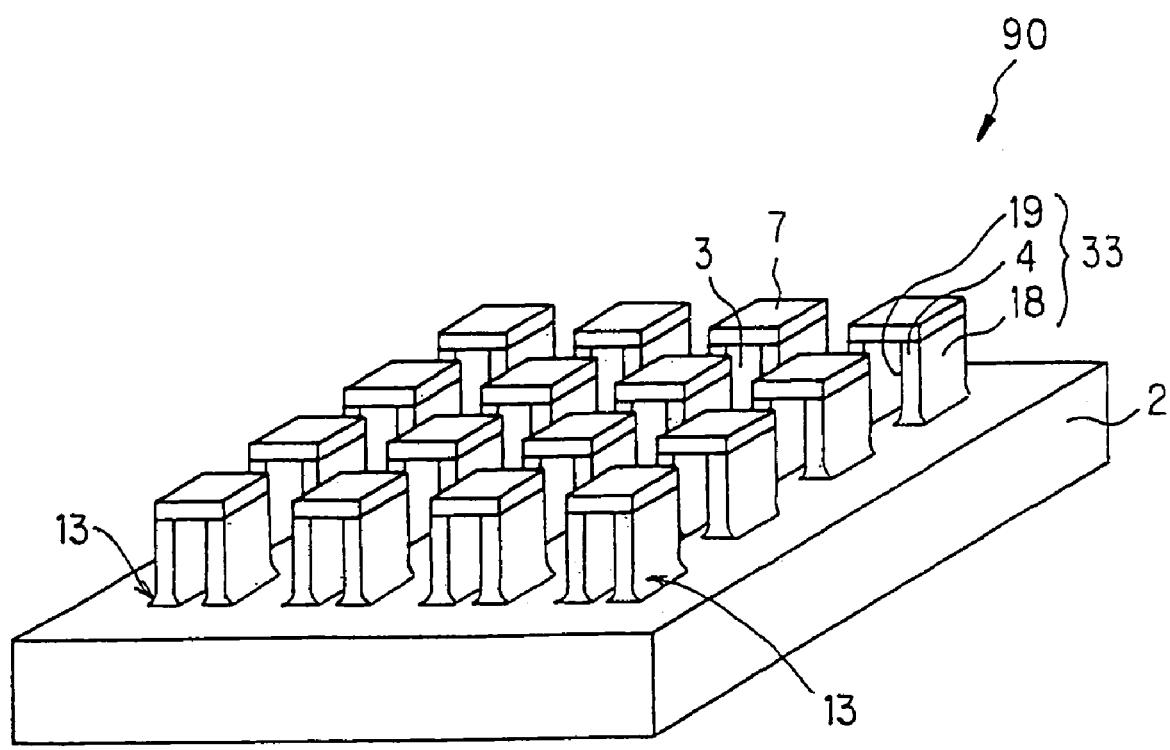
FIG. 9 is an oblique view showing another embodiment of the matrix type piezoelectric/electrostrictive device according to the present invention.

FIG. 9 is an oblique view showing another embodiment of the matrix type piezoelectric/electrostrictive device according to the present invention. In a matrix type piezoelectric/electrostrictive device 90, a plurality of piezoelectric/electrostrictive elements 33, each having the piezoelectric/electrostrictive substance 4, in which the foot section forms the curved surface 13, and a pair of the electrodes 18 and 19, are formed on the ceramic substrate 2. A pair of the adjacent piezoelectric/electrostrictive elements 33 is covered with a planar plate 7 on the sides opposite to the ceramic substrate 2 to make up a cell 3. The piezoelectric/electrostrictive substance 4 produces strain on the ceramic substrate 2 by an applied electric field, whereby the piezoelectric/electrostrictive element 33 is expanded/contracted (driven).

One pair of the piezoelectric/electrostrictive elements 33 may be expanded/contracted at the same time, or only one of the pair of piezoelectric/electrostrictive elements 33 may be expanded/contracted. It is preferable to allow one of the pair of piezoelectric/electrostrictive elements 33 to be expanded and the other piezoelectric/electrostrictive element 33 to be contracted. If the pair of piezoelectric/electrostrictive elements 33 is expanded at the same time when pressing an object by the planar plate 7 (active side), the object can be pressed by a greater amount of driving force through the planar plate 7 in comparison with the case where only one piezoelectric/electrostrictive element 33 is expanded.

This means that the width W of the piezoelectric/electrostrictive element is increased to 2W as is clear from the above equations (1) to (2). This cell structure enables mechanical strength, displacement, and force generation to be increased due to the presence of the planar plate 7, even if the thickness T of the piezoelectric/electrostrictive substances is decreased. If one of the pair of piezoelectric/electrostrictive elements 33 is expanded and the other piezoelectric/electrostrictive element 33 is contracted, or only one of the piezoelectric/electrostrictive elements 33 is driven, the planar plate 7 can be tilted at an angle from the horizontal surface of the planar plate 7. This widens application to optical systems used for projectors and optical switches by forming the planar plate 7 using a micromirror and changing the reflection angle of incident light by using the micromirror, for example.

Figure 26:
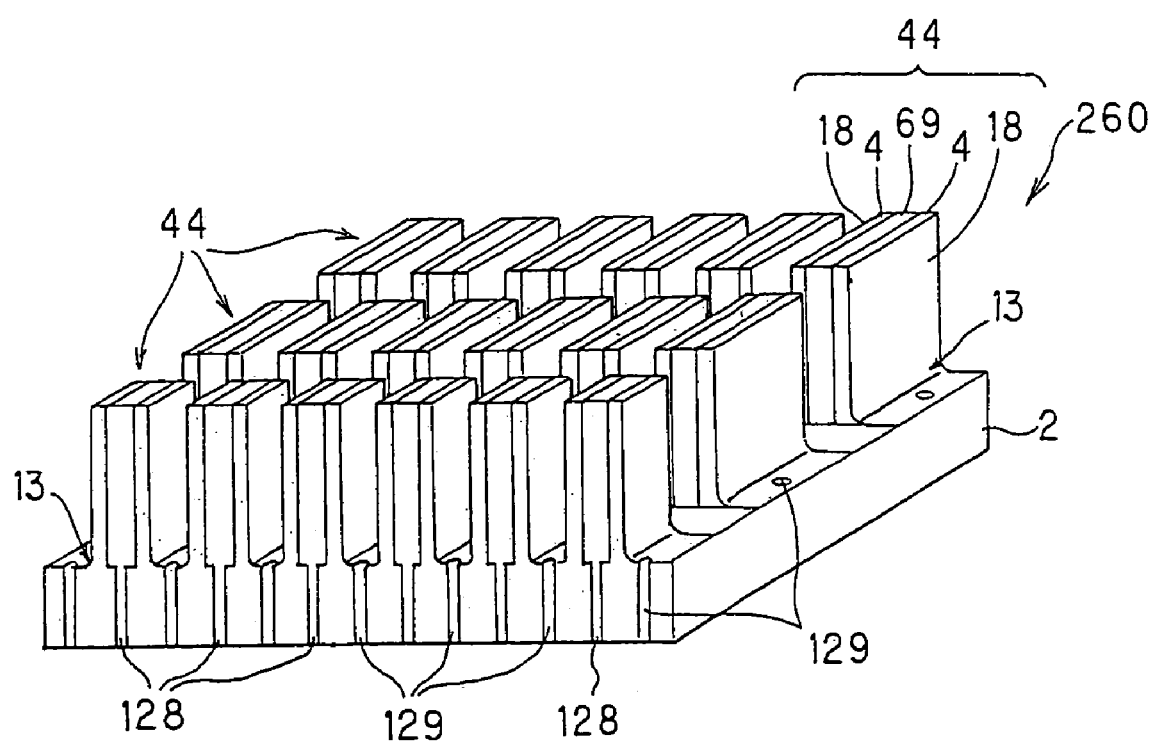
FIG. 26 is an oblique view showing another embodiment of the matrix type piezoelectric/electrostrictive device according to the present invention.

FIG. 26 is an oblique view showing still another embodiment of the matrix type piezoelectric/electrostrictive device according to the present invention. In a matrix type piezoelectric/electrostrictive device 260, a plurality of piezoelectric/electrostrictive elements 44, each having a pair of the piezoelectric/electrostrictive substance 4 in which the foot section forms the curved surface 13, the electrode 18, and an electrode 69, are formed on the ceramic substrate 2. Through holes 128 and 129 which are formed through the ceramic substrate 2 and to which a conductive material is applied are formed toward the side of the ceramic substrate 2 opposite to the side on which the piezoelectric/electrostrictive elements 44. The through holes 128 and 129 are connected with electrode terminals (not shown).

A highly flexible conductor such as a conductive resin having adhesion is inserted between the pair of piezoelectric/electrostrictive substances 4 in which the foot section forms the curved surface 13. This conductor is allowed to function as the electrode 69. The electrode 69 has a degree of flexibility which does not inhibit strain produced by the piezoelectric/electrostrictive substance 4. The electrodes 18 are formed on the sides of the pair of piezoelectric/electrostrictive substances 4 opposite to the side on which the electrode 69 is formed. Specifically, the piezoelectric/electrostrictive elements, each having the piezoelectric/electrostrictive substance 4 and the electrodes 18 and 69, share the electrode 69 to make up the piezoelectric/electrostrictive element 44.

In the matrix type piezoelectric/electrostrictive device 260, since each of the pair of piezoelectric/electrostrictive substances 4 which makes up the piezoelectric/electrostrictive element 44 can be formed thinner and higher, the piezoelectric/electrostrictive element 44 easily produces displacement. The piezoelectric/electrostrictive element 44 consists of the pair of piezoelectric/electrostrictive substances 4 which faces each other through the flexible conductor (electrode 69). Moreover, the foot sections of the pair of piezoelectric/electrostrictive substances 4 form the curved surfaces 13. This enables mechanical strength of the piezoelectric/electrostrictive element 44 to be secured. Therefore, large displacement and large stress can be obtained at a low drive voltage, whereby the piezoelectric/electrostrictive element 44 is capable of functioning as a high performance piezoelectric/electrostrictive element. The effect of the shape of the piezoelectric/electrostrictive element 44 in the matrix type piezoelectric/electrostrictive device 260 can be further advantageously applied in comparison with the matrix type piezoelectric/electrostrictive device 90.

Three or more piezoelectric/electrostrictive elements 33 may be connected as one set and the sides of the piezoelectric/electrostrictive elements 33 opposite to the ceramic substrate 2 may be covered with the planar plate 7 (not shown). A closed cell 3 may be formed so that the four sides of the cell 3 are formed by the piezoelectric/electrostrictive elements 33.

Figure 21:
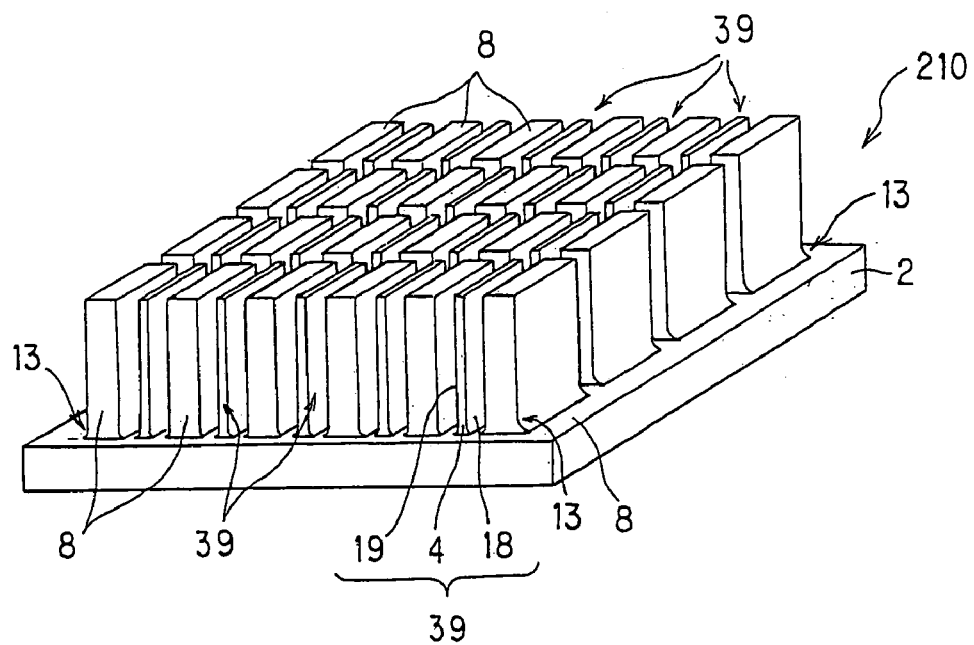
FIG. 21 is an oblique view showing another embodiment of the matrix type piezoelectric/electrostrictive device according to the present invention.

FIG. 21 is an oblique view showing still another embodiment of the matrix type piezoelectric/electrostrictive device according to the present invention. In a matrix type piezoelectric/electrostrictive device 210, wall sections 8 are provided between the piezoelectric/electrostrictive elements 39 adjacent in the uniaxial direction. According to this structure, electrical interference between the adjacent piezoelectric/electrostrictive elements 39 can be prevented. Moreover, the wall section 8 can be used as a joined section between an object of action and the matrix type piezoelectric/electrostrictive device. Therefore, propagation of action from the neighboring region to the object of action can be effectively controlled when operating the piezoelectric/electrostrictive device. In addition to extremely small operational interference between the piezoelectric/electrostrictive elements, which is one of the features of the matrix type piezoelectric/electrostrictive device of the present invention, displacement or force to be generated can be allowed to intensively act on a specific region. Therefore, a piezoelectric/electrostrictive device exhibiting high efficiency of action is realized.

The wall section and the piezoelectric/electrostrictive element are not necessarily at the same height in a state in which a voltage is not applied, differing from the matrix type piezoelectric/electrostrictive device 210 shown in FIG. 21. For example, the wall section may be lower than the piezoelectric/electrostrictive element as in a matrix type piezoelectric/electrostrictive device 220 shown in FIG. 22. Or, the wall section may be higher than the piezoelectric/ electrostrictive element as in a matrix type piezoelectric/ electrostrictive device 230 shown in FIG. 23. The configuration of the wall section and the piezoelectric/ electrostrictive element may be appropriately selected depending on the object of action.

Figure 24:
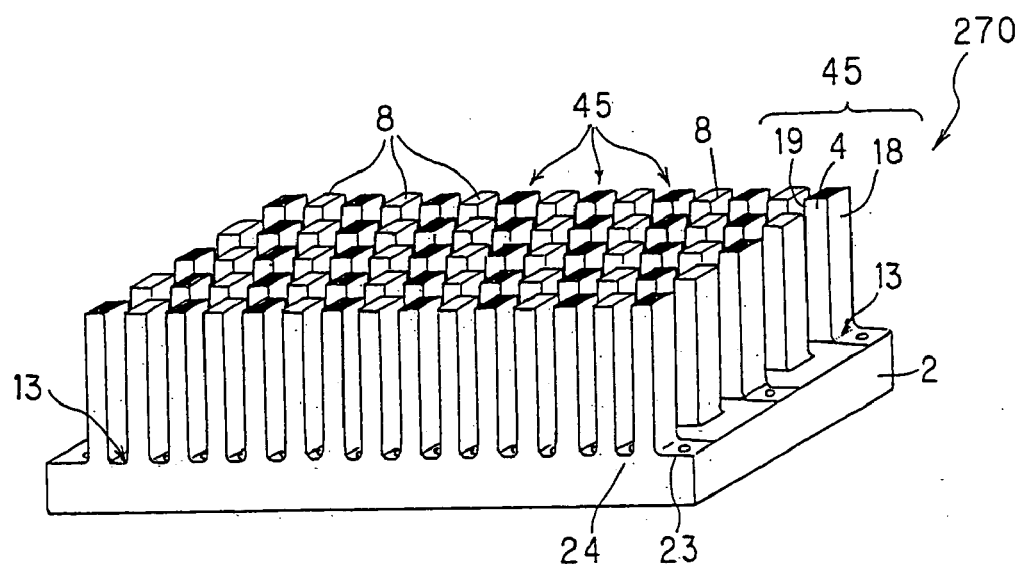
FIG. 24 is an oblique view showing another embodiment of the matrix type piezoelectric/electrostrictive device according to the present invention.

The wall section may be provided not only between the piezoelectric/electrostrictive elements adjacent in the uniaxial direction, but also between the piezoelectric/electrostrictive elements adjacent in the biaxial direction. A matrix type piezoelectric/electrostrictive device 270 shown in FIG. 24 is one embodiment of such a structure. In the matrix type piezoelectric/electrostrictive device 270, the wall sections 8 are adjacent to piezoelectric/electrostrictive elements 45 in the biaxial direction. Therefore, action applied from the piezoelectric/electrostrictive element 45 rarely released in comparison with the matrix type piezoelectric/electrostrictive devices 210, 220, and 230.

Since the wall section is formed of the same material as the piezoelectric/electrostrictive element, the wall section may have the following configuration. The piezoelectric/ electrostrictive device may be formed so that the wiring area such as via holes or through holes is not provided to the wall section. The wall section may be provided with wiring or the like as the piezoelectric/electrostrictive element, but allowed to only function as the wall section instead of the element.

Figure 25:
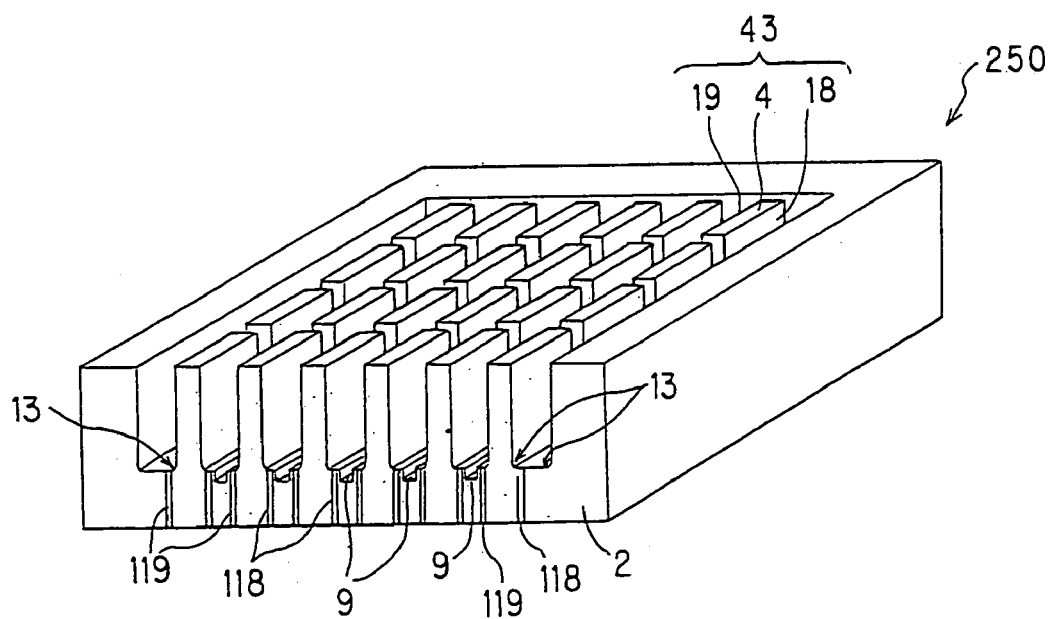
FIG. 25 is an oblique view showing another embodiment of the matrix type piezoelectric/electrostrictive device according to the present invention.

FIG. 25 is an oblique view showing still another embodiment of the matrix type piezoelectric/electrostrictive device according to the present invention. In a matrix type piezoelectric/electrostrictive device 250, a groove section 9 is formed on the surface of the ceramic substrate 2 between adjacent piezoelectric/electrostrictive elements 43. According to this structure, electrodes of the adjacent piezoelectric/ electrostrictive elements 43 opposite to each other can be easily allowed to have different polarities by the presence of the groove-section 9. Moreover, since the insulation distance between the piezoelectric/electrostrictive elements 43 can be increased by forming the groove section 9, occurrence of short circuits or the like can be prevented even if the pitch of the piezoelectric/electrostrictive elements 43 is decreased.

Figure 30:
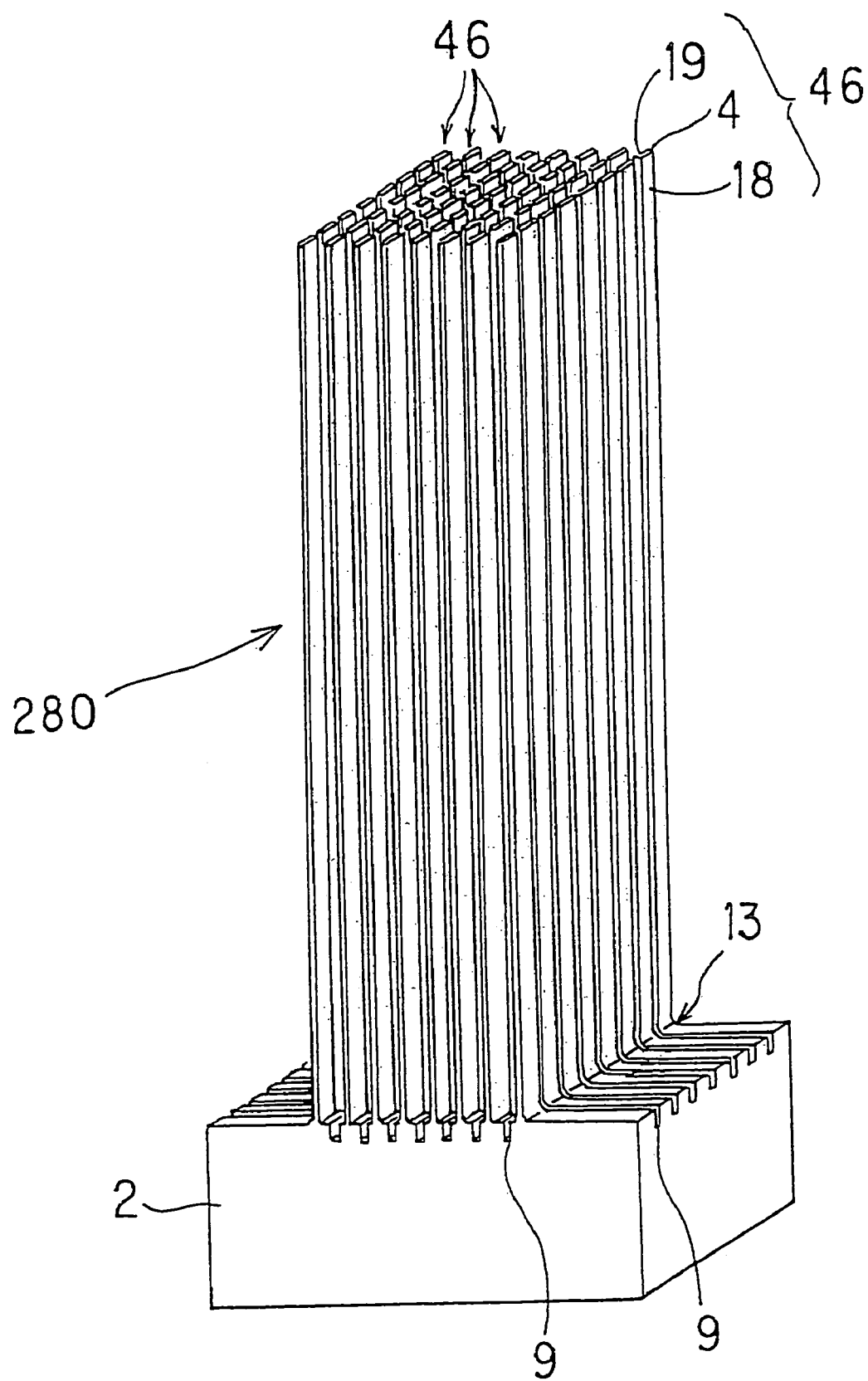
FIG. 30 is an oblique view showing another embodiment of the matrix type piezoelectric/electrostrictive device according to the present invention.

In a matrix type piezoelectric/electrostrictive device 280 shown in FIG. 30, piezoelectric/electrostrictive elements 46 having a high aspect ratio are arranged at a high pitch (high density). According to the present invention, even if the piezoelectric/electrostrictive elements 46 have large dimensions in one direction, the piezoelectric/electrostrictive elements 46 can be two-dimensionally arranged at a desired pitch and high yield without handling each of the piezoelectric/electrostrictive elements, specifically, without attaching the piezoelectric/electrostrictive elements 46 to the substrate 2 or attaching the two substrates 2.

In the practical application, it is preferable to fill the space between the piezoelectric/electrostrictive elements 46 with an insulator having flexibility which does not impair displacement and force generation in order to prevent a decrease in insulation due to entrance of foreign matter between the piezoelectric/electrostrictive elements 46, to improve handling capability, and the like. The pitch advantageously employed in the present invention is 2 mm or less, preferably 1 mm or less, and still more preferably 0.1 to 0.5 mm.

Figure 12:
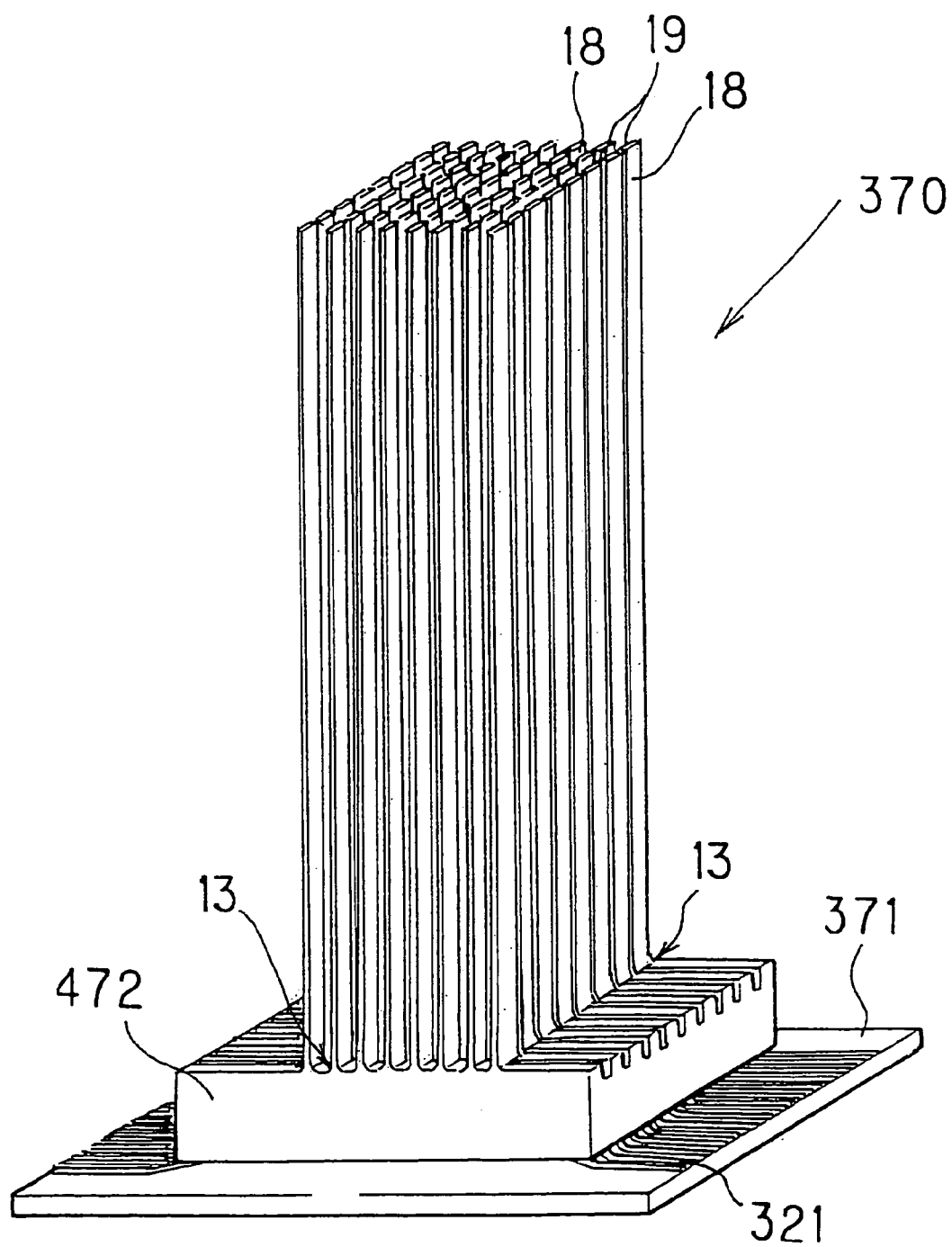
FIG. 12 is an oblique view showing another embodiment of the matrix type piezoelectric/electrostrictive device according to the present invention.

In a matrix type piezoelectric/electrostrictive device 370 shown in FIG. 12, piezoelectric/electrostrictive elements having a high aspect ratio are arranged at a high density in the same manner as in the matrix type piezoelectric/electrostrictive device 280. Electrode terminals 321 are disposed on the front side of the piezoelectric/electrostrictive device using via holes (not shown) formed through a ceramic substrate 472 and a wiring substrate 371 mounted on the side of the ceramic substrate 472 opposite to the side on which the piezoelectric/electrostrictive elements are disposed. Such a configuration facilitates bonding between the electrode terminals 321 and the power supply and enables utilization of the wiring substrate 371 for handling.

Figure 33:
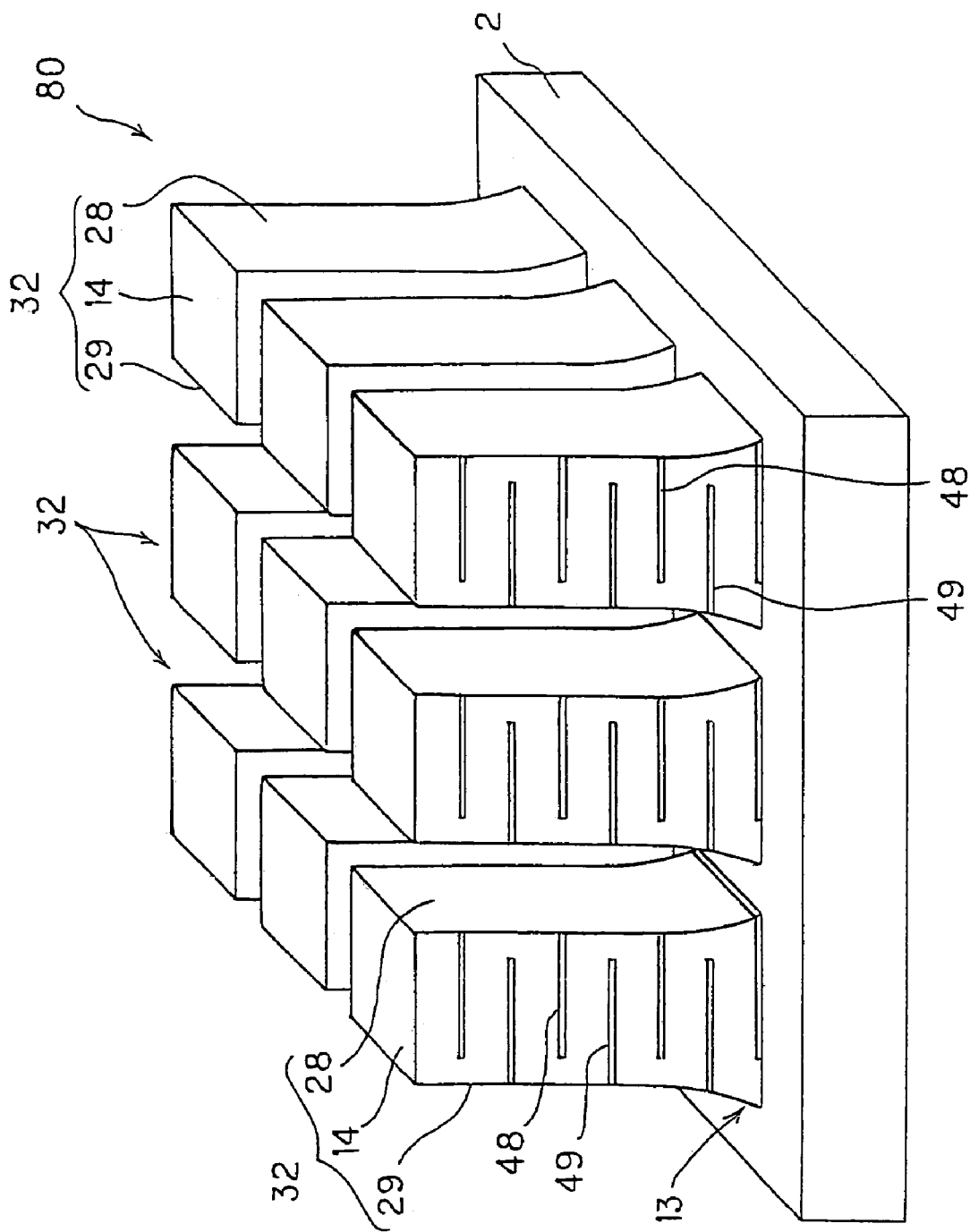
FIG. 33 is an oblique view showing another embodiment of the matrix type piezoelectric/electrostrictive device according to the present invention.

FIG. 33 is an oblique view showing still another embodiment of the matrix type piezoelectric/electrostrictive device according to the present invention. In a matrix type piezoelectric/electrostrictive device 80, a plurality of piezoelectric/electrostrictive elements 32, each having the piezoelectric/electrostrictive substance 14, in which the foot section forms the curved surface 13, a pair of electrodes, specifically, a pair of common electrodes 28 and 29, and internal electrodes 48 and 49, are formed on the ceramic substrate 2. The matrix type piezoelectric/electrostrictive device 80 is driven by allowing the piezoelectric/electrostrictive substance 14 to produce strain on the ceramic substrate 2 by an applied electric field.

The matrix type piezoelectric/electrostrictive device 80 according to the present invention has at least the characteristics 1) two-dimensional arrangement of piezoelectric/ electrostrictive element, 2) complete independence of piezoelectric/electrostrictive element, 3) formation of electrode on low transgranularly fractured surface, 4) formation of curved surface at joined section, 5) formation of electrode terminal, 6) expansion/contraction displacement, and 7) parallelism between polarization and driving electric field, and preferably the characteristics 8) piezoelectric/electrostrictive substance excelling in degree of profile, 9) piezoelectric/electrostrictive element having high aspect ratio, 10) highly integrated piezoelectric/electrostrictive element, and 11) smoothness of side of piezoelectric/electrostrictive element in the same manner as the above-described matrix type piezoelectric/electrostrictive devices.

However, the matrix type piezoelectric/electrostrictive device 80 differs from the above-described matrix type piezoelectric/electrostrictive devices in the following two features.

The matrix type piezoelectric/electrostrictive device 80 may have a configuration in which the electrode terminals are formed on the side of the ceramic substrate 2 opposite to the side on which the piezoelectric/electrostrictive elements 32 are disposed, and each of the electrodes is electrically connected with each of the electrode terminals through the via holes in the same manner as in the matrix type piezoelectric/electrostrictive device 1. However, in the piezoelectric/electrostrictive device 80, a plurality of layer-shaped piezoelectric/electrostrictive substances and a plurality of layer-shaped internal electrodes are alternately stacked on the ceramic substrate, differing from the piezoelectric/electrostrictive device in which the piezoelectric/electrostrictive elements in the shape of a rectangular parallelepiped are provided vertically to the ceramic substrate and a pair of electrodes is formed on the sides of the piezoelectric/ electrostrictive substance. Specifically, in the matrix type piezoelectric/electrostrictive device 80 shown in FIG. 33, the electrodes are formed on the sides (low transgranularly fractured surfaces) of the piezoelectric/electrostrictive element in the same manner as in the matrix type piezoelectric/ electrostrictive device 1. However, the electrodes are connected with the internal electrodes at every other layer and function as common electrodes for applying the same signal to the internal electrodes at every other layer.

In the matrix type piezoelectric/electrostrictive device 80, the polarization electric field and the driving electric field are parallel in the same manner as in the matrix type piezoelectric/electrostrictive device 1. In the matrix type piezoelectric/electrostrictive device 1, the piezoelectric/electrostrictive element is expanded/contracted vertically to the main surface of the ceramic substrate based on displacement caused by the transverse effect of the electric field induced strain of the piezoelectric/electrostrictive substance. However, in the matrix type piezoelectric/electrostrictive device 80, the piezoelectric/electrostrictive element is expanded/contracted vertically to the main surface of the ceramic substrate based on displacement caused by a longitudinal effect of the electric field induced strain of the piezoelectric/electrostrictive substance.

Figure 34:
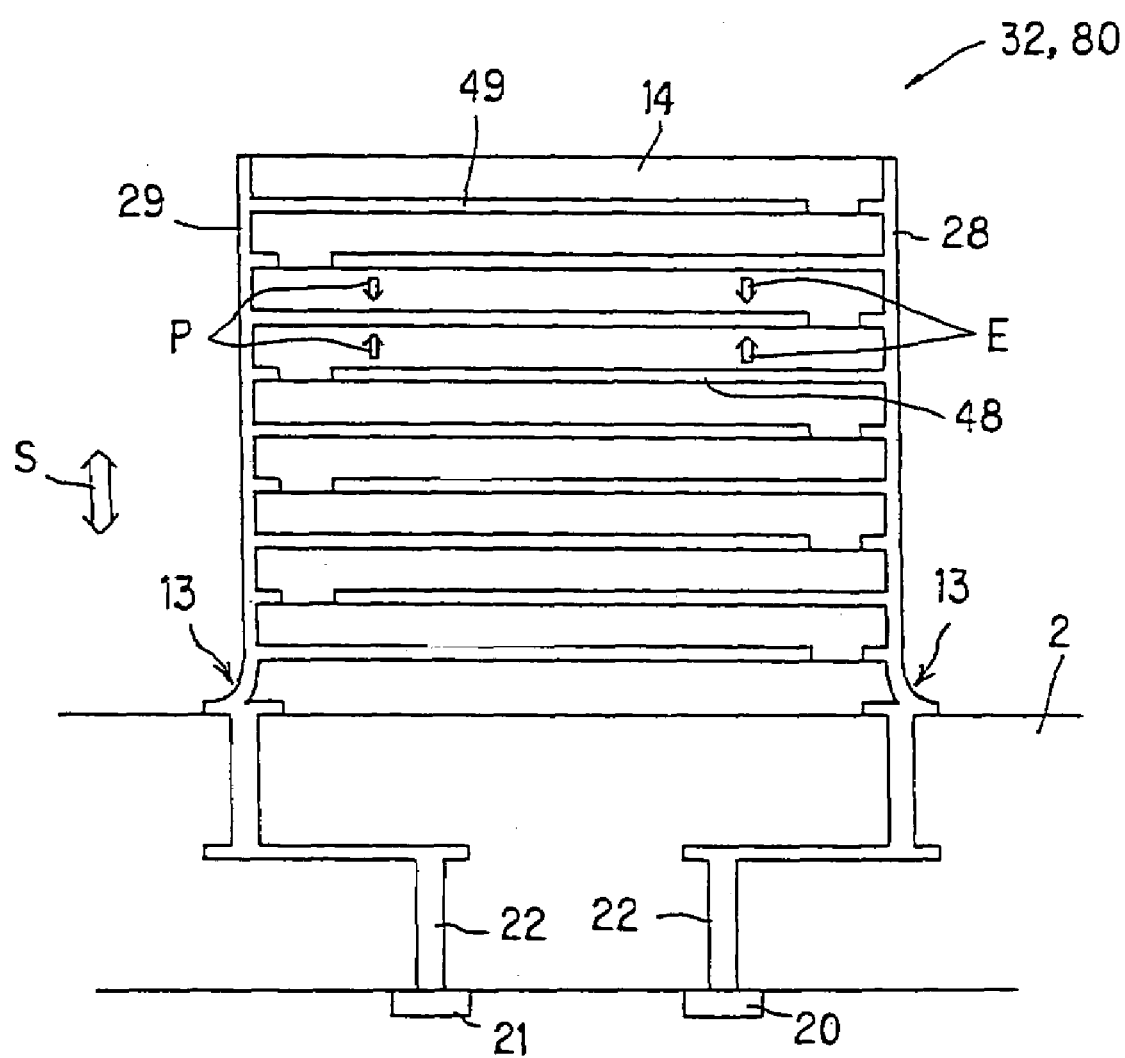
FIG. 34 is a vertical cross-sectional view showing the matrix type piezoelectric/electrostrictive device shown in FIG. 33.

FIG. 34 is a side view showing the piezoelectric/electrostrictive element 32 of the matrix type piezoelectric/electrostrictive device 80 illustrated in FIG. 33 along a cross section passing through the common electrodes 28 and 29 and the internal electrodes 48 and 49. In the matrix type piezoelectric/electrostrictive device 80, the layer-shaped piezoelectric/electrostrictive substances 14 and the layer-shaped internal electrodes 48 and 49 which are alternately stacked to make up the piezoelectric/electrostrictive element 32. The piezoelectric/electrostrictive element 32 has ten layers of the piezoelectric/electrostrictive substances 14. The number of stacked piezoelectric/electrostrictive layers is appropriately determined depending on the application and object. The number of stacked piezoelectric/electrostrictive layers is preferably 10 to 200 in view of stability of characteristics of the actuator and ease of manufacture.

In the matrix type piezoelectric/electrostrictive device 80, the piezoelectric/electrostrictive substance 14 which makes up the piezoelectric/electrostrictive element 32 is polarized in the direction P in FIG. 34, for example. An electric field in the direction E is formed by connecting the power supply to the electrode terminals 20 and 21 and applying a voltage between the common electrode 28 (positive) and the common electrode 29 (negative). Specifically, the layer-shaped piezoelectric/electrostrictive substances 14 having a polarization in the opposite directions are stacked with the internal electrodes 48 and 49 interposed therebetween. The polarization and the driving electric field are in the same direction in each of the piezoelectric/electrostrictive substances 14. As a result, electric field induced strain is produced in the piezoelectric/electrostrictive substances 14. The piezoelectric/electrostrictive element 32 is expanded/contracted in the direction S, which is the stacking direction with respect to the main surface of the ceramic substrate 2, based on displacement caused by the longitudinal effect of the strain. Since the expansion/contraction displacement directly utilizes electric field induced strain differing from conventional uni-morph or bi-morph bending displacement, force generation and the response speed are increased.

This type of piezoelectric/electrostrictive element excels in force generation and response speed in comparison with the element shown in FIG. 1(*a*) and the like which utilize the transverse effect of the electric field induced strain. Although the amount of displacement produced by each layer is small, the amount of displacement is increased in proportion to the number of piezoelectric/electrostrictive layers, more precisely, the number of sets consisting of the piezoelectric/electrostrictive layer and a pair of electrodes. Therefore, large displacement can be obtained by increasing the total number of sets. However, an increase in the number of layers results in a decrease in reliability of connection between the common electrodes and the internal electrodes, an increase in power consumption due to an increase in electrostatic capacitance, and an increase in the number of manufacturing steps.

In the matrix type piezoelectric/electrostrictive device 80 shown in FIG. 33, the thickness of one layer of the piezoelectric/electrostrictive substance 14 is preferably 100 μm or less, and still more preferably 10 to 80 μm in order to enable the matrix type piezoelectric/electrostrictive device 80 to be driven at a low voltage.

Application examples of the matrix type piezoelectric/electrostrictive device according to the present invention are described below with reference to the drawings.

Figure 6A:
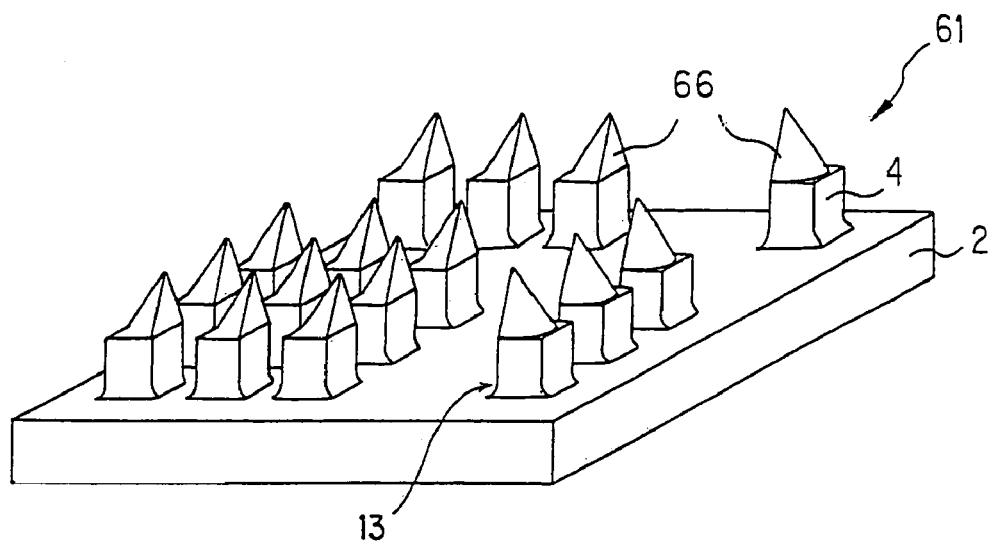
Figure 6B:
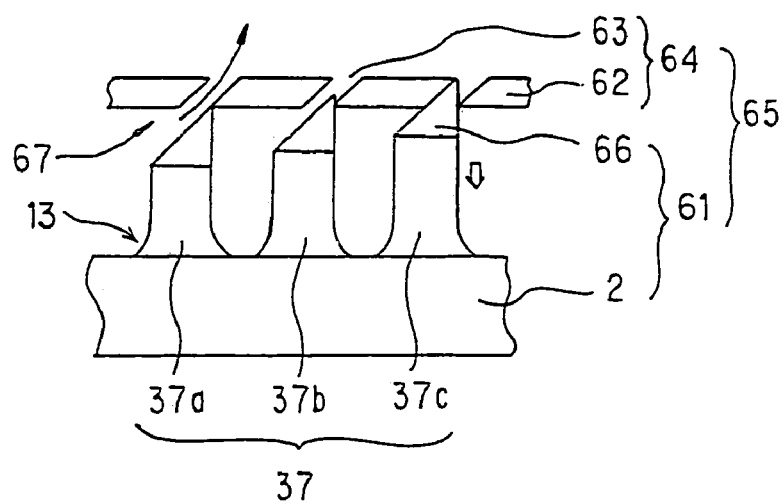

FIGS. 6(*a*) and 6(*b*) are views showing an example in which the matrix type piezoelectric/electrostrictive device of the present invention is applied to a microvalve as an actuator. FIG. 6(*a*) is an oblique view showing an actuator section of the microvalve. FIG. 6(*b*) is a vertical cross-sectional view of the microvalve. A microvalve 65 includes a valve seat section 64 and an actuator section 61, in which the matrix type piezoelectric/electrostrictive device is used as the actuator section 61.

The valve seat section 64 has openings 63 which pair up with a plurality of piezoelectric/electrostrictive elements 37 in the actuator section 61. In the actuator section 61, the piezoelectric/electrostrictive element 37 is displaced by an external signal. A valve plug section 66 is provided on the side of the piezoelectric/electrostrictive element 37 opposite to the ceramic substrate 2. The passage cross sectional area of the opening 63 can be changed by allowing the valve plug section 66 to approach to or separate from the opening 63 in the valve seat section 64 through displacement of the piezoelectric/electrostrictive element 37 in the actuator section 61. The flow rate of a fluid 67 or the like passing through the opening 63 can be adjusted by this operation.

The microvalve 65 is capable of adjusting the passage cross sectional area of the opening 63 by changing the amount of displacement of the piezoelectric/electrostrictive element 37. FIG. 6(*b*) schematically shows a state of the piezoelectric/electrostrictive element 37. In the case where the piezoelectric/electrostrictive element is the type of element shown in FIG. 1(*a*), the piezoelectric/electrostrictive element 37*a* shown on the left in FIG. 6(*b*) is in a contracted state by a specific applied voltage. The valve plug section 66 opens the opening 63 to its full width, thereby maximizing the flow rate of the fluid 67 passing through the opening 63. A piezoelectric/electrostrictive element 37*c* shown on the right in FIG. 6(*b*) is in a non-operating state. The valve plug section 66 closes the opening 63, whereby the fluid 67 cannot pass through the opening 63. The piezoelectric/electrostrictive element 37 can be allowed to be in one of the states shown by the piezoelectric/electrostrictive elements 37*a* to 37*c* by changing the amount of displacement of the piezoelectric/electrostrictive element 37. As a result, the passage cross sectional area of the opening 63 is adjusted freely, whereby the flow rate of the fluid 67 or the like passing through the opening 63 is adjusted. The state of the piezoelectric/electrostrictive element 37*b* shown at the center in FIG. 6(*b*) is one example. Therefore, the microvalve 65 is capable of functioning as not only an ON-OFF valve but also a control valve.

The shape of the opening 63 and the shape of the valve plug section 66 are not limited to those this example. The shape of the opening 63 and the shape of the valve plug section 66 may be determined in the same manner as in generally used valves by setting the relation between the displacement of the piezoelectric/electrostrictive element 37 and the flow rate of the fluid 67 or the like to be linear or in the shape of a quadric curve, or the like.

Since the microvalve is capable of freely changing the flow rate of the fluid or the like passing through the opening, the pressure at which the fluid such as air is blown from the opening can be freely changed. Therefore, the microvalve may be used as a transportation device which transports an object placed on the upper side of the opening while positioning the object from a specific position to another specific position by changing the pressure on the upper side of the opening so as to wave by utilizing the pressure. A lightweight object such as paper can be transported in a floating state without contacting the microvalve. Therefore, such a transportation device is suitable for transportation of printed matter or the like, of which the printed side must be prevented from being held.

Figure 7A:
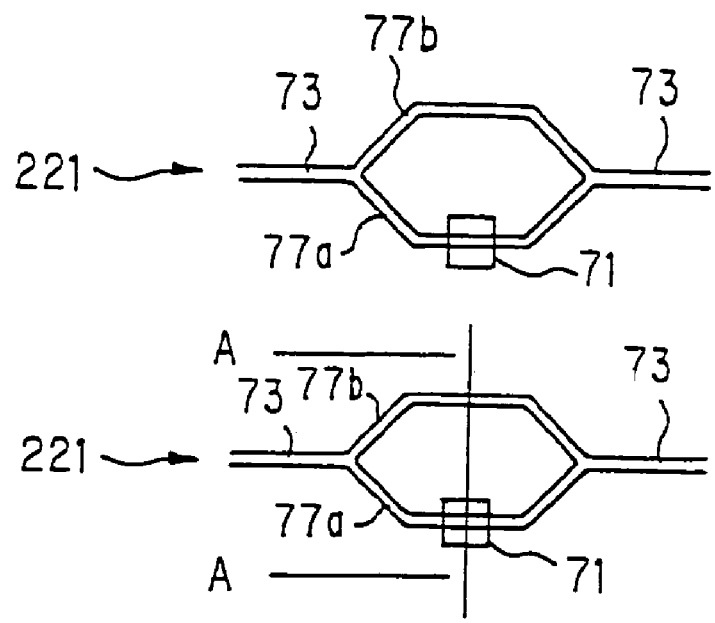
Figure 7B:
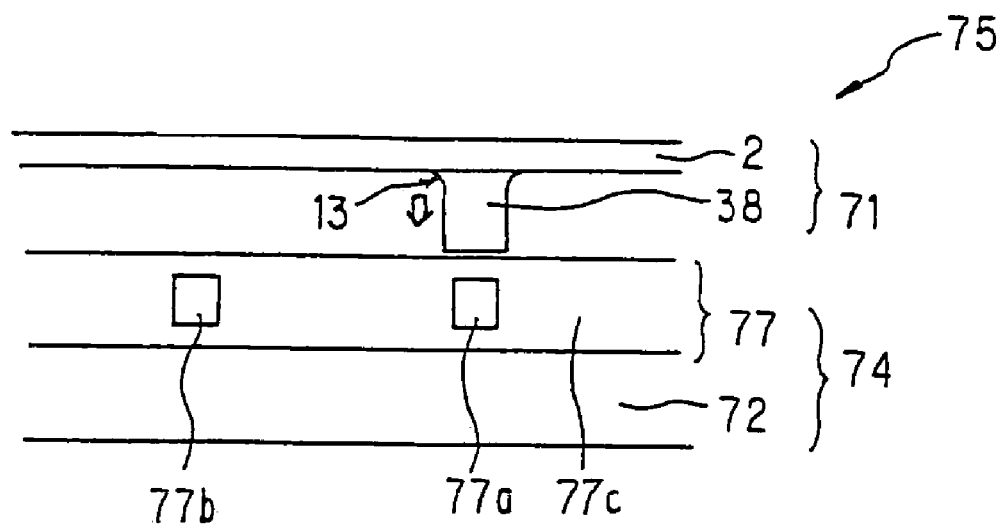

FIGS. 7(*a*) and 7(*b*) are views showing an example in which an optical modulator is formed by combining the matrix type piezoelectric/electrostrictive device of the present invention with an optical interferometer. FIG. 7(*a*) is a top view showing an optical interferometer. FIG. 7(*b*) is a cross-sectional view along the line A—A shown in FIG. 7(*a*). An optical interferometer 74 is formed by connecting two directional couplers 73 by using two arm optical waveguide core sections 77*a* and 77*b*. An optical modulator 75 includes the optical interferometer 74 and an actuator section 71 for applying stress to at least part of one of the optical waveguide core sections 77*a* and 77*b*.

As shown in FIG. 7(*b*), the actuator section 71 is disposed on an optical waveguide 77 (quartz waveguide or polymer waveguide made of polyimide, for example) consisting of a cladding section 77*c* and the optical waveguide core sections 77*a* and 77*b* on a substrate 72 (silicon, for example) so as to face the optical waveguide core section 77*a* on one side. The optical modulator 75 may have a configuration in which a space is formed between the actuator section 71 and the optical waveguide 77, and stress is applied by allowing the actuator section 71 to come in contact with the optical waveguide 77. The optical modulator 75 may have a configuration in which stress is applied in a state in which the actuator section 71 is always in contact with the optical waveguide 77. In the former case, the space may be removed and stress may be applied by applying a voltage, or stress may be applied in an initial state and the space may be formed due to a decrease in stress by application of a voltage.

The refractive index of the optical waveguide core section 77*a* is changed by applying stress to the optical waveguide core section 77*a*. This causes retardation to be produced between light transmitted through the arm optical waveguide core section 77*a* and light transmitted through the arm optical waveguide core section 77*b*, whereby light at an intensity corresponding to the retardation can be output. Binary values consisting of OFF and ON of the transmitted light can be output by setting the retardation to a specific value.

Therefore, a transmission path can be switched by utilizing the ON-OFF function, if the optical modulators are two-dimensionally arranged. Since the matrix type piezoelectric/electrostrictive device according to the present invention includes the substrate and is formed as a face, the matrix type piezoelectric/electrostrictive device is suitably disposed to face such two-dimensionally arranged optical interferometers. Moreover, since the matrix type piezoelectric/electrostrictive device according to the present invention produces large displacement, the space between the piezoelectric/electrostrictive device and the optical interferometers need not necessarily be as precise as possible. A comparatively large amount of stress is necessary for changing the refractive index of the optical waveguide core. However, such a large amount of stress can be easily realized by large force generation of the matrix type piezoelectric/electrostrictive device according to the present invention.

Generally, the refractive index is changed by utilizing a thermooptic effect of the optical waveguide material. However, a heat removal mechanism for reducing crosstalk or increasing response is indispensable for a switch utilizing heat. Moreover, use conditions, such as the necessity of air conditioning such as cooling in order to prevent malfunction due to an increase in temperature of the switch, may be limited. However, such limitations can be eliminated by controlling the refractive index by utilizing stress. Therefore, since no heat source is necessary, a switch advantageous for decreasing power consumption can be realized.

Figure 2A:
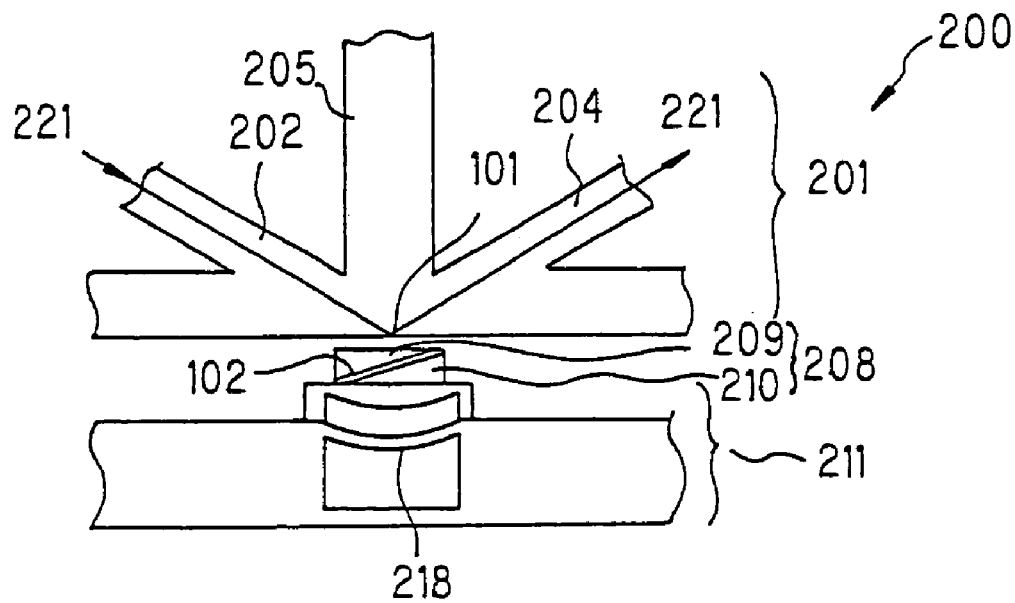
Figure 2B:
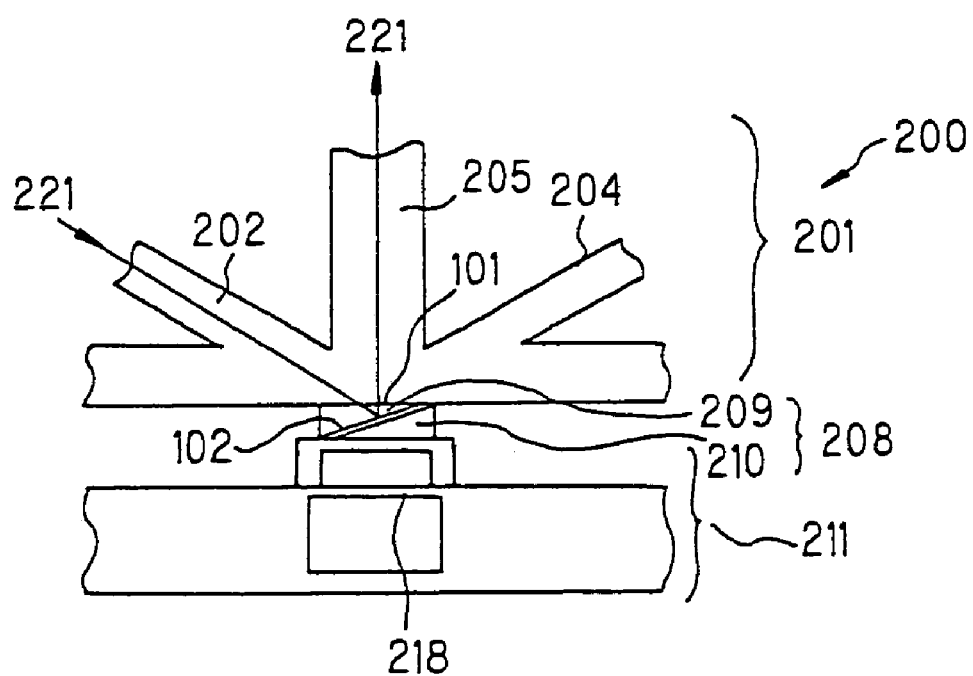

The matrix type piezoelectric/electrostrictive device of the present invention may be employed as an actuator section of the optical switch 200 shown in FIGS. 2(*a*) and 2(*b*) instead of an actuator section 211.

The optical switch 200 shown in FIGS. 2(*a*) and 2(*b*) includes a light transmitting section 201, an optical path change section 208, and the actuator section 211. The light transmitting section 201 includes a light reflecting surface 101 provided on part of the side opposite to the optical path change section 208, and light transmitting paths 202, 204, and 205 provided in three directions from the light reflecting surface 101. The optical path change section 208 includes a light introducing member 209 which is movably provided close to the light reflecting surface 101 in the light transmitting section 201 and formed of a transparent material, and a light reflecting member 210 which causes light to be totally reflected. The actuator section 211 includes a mechanism which is displaced by an external signal and transmits the displacement to the optical path change section 208. The optical path change section 208 comes in contact with or is separated from the light reflecting surface 101 in the light transmitting section 201 by the operation of the actuator section 211, whereby light 221 input to the light transmitting path 202 is totally reflected by the light reflecting surface 101 in the light transmitting section 201 and transmitted to the specific light transmitting path 204 on the output side. The light 221 is extracted and introduced into the light introducing member 209, totally reflected by the light reflecting surface 102 in the light reflecting member 210, and transmitted to the specific light transmitting path 205 on the output side. An optical switch at high contrast and small loss can be formed by employing the matrix type piezoelectric/electrostrictive device of the present invention as the actuator section of the optical switch 200 instead of the actuator section 211 which produces bending displacement.

Another embodiment of the optical switch in which the matrix type piezoelectric/electrostrictive device according to the present invention is applied as the actuator section is described below.

Figure 16:
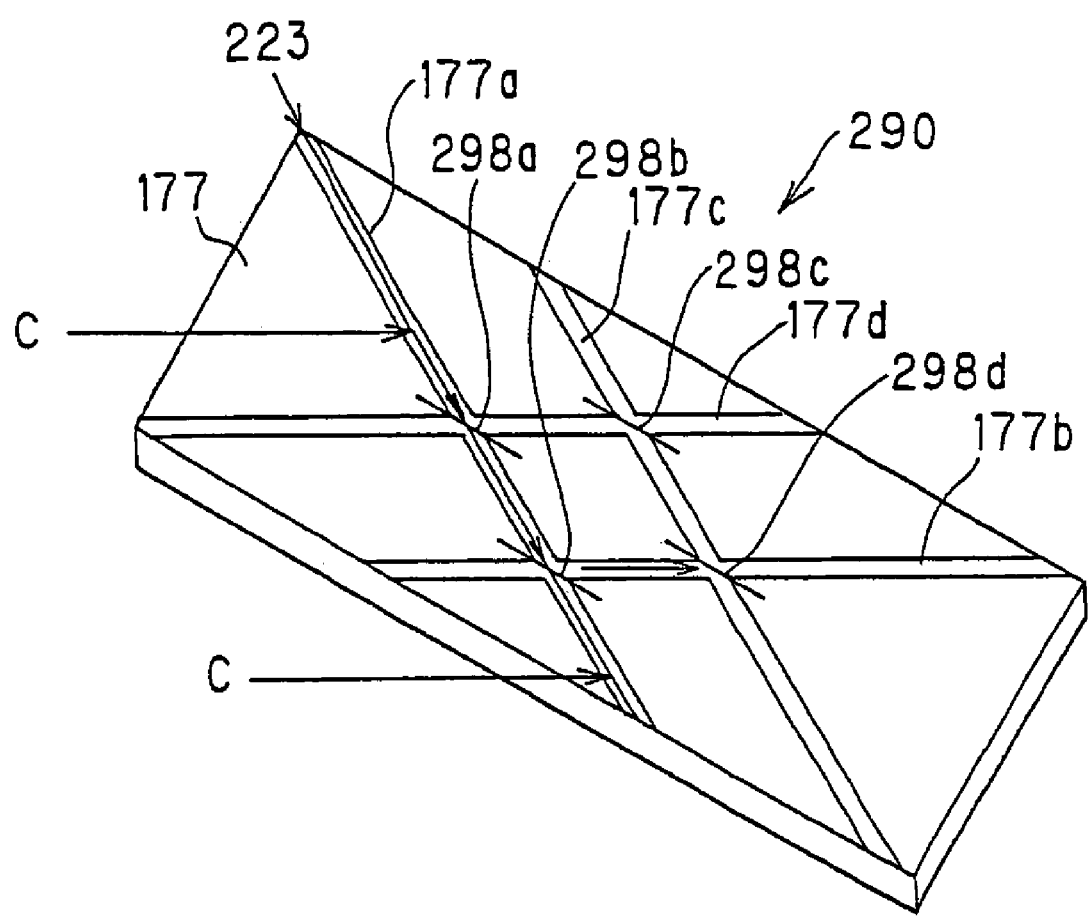
FIG. 16 is an oblique view showing another embodiment of an optical switch which is an application example of the matrix type piezoelectric/electrostrictive device according to the present invention.

An optical switch 290 shown in FIG. 16 is disclosed in the Institute of Electronics, Information and Communication Engineers (IEICE), Electronics Society Conference 2001, Advance Materials, p. 182. In the optical switch 290, optical waveguide core sections 177*a* to 177*d* are formed in an optical waveguide member 177 so as to intersect one another. Notches are formed in optical path change sections (intersection points) 298*a* to 298*d*.

The optical switch 290 is a matrix switch capable of changing the transmission path of light input to one of the optical waveguide core sections 177a to 177d in the optical path change sections 298a to 298d by forming an optically discontinuous area by deforming the notches utilizing the operation of a drive mechanism such as an actuator section. FIG. 16 shows a state in which the transmission path of light 223 input to the optical waveguide core section 177a is changed to the optical waveguide core section 177b in the optical path change section 298b.

In the optical switch 290, it is important to increase the widths of the notches in the optical path change sections 298a to 298d in order to reduce crosstalk. Therefore, large displacement is necessary for the actuator section (drive mechanism).

Moreover, it is important that the optical path change sections 298a to 298d are capable of accurately reproducing the optically discontinuous state and the optically continuous state. Therefore, it is preferable to apply a material having a comparatively high Young's modulus as a material for the optical waveguide member 177 so that the notches in the optical path change sections 298a to 298d are restored advantageously. Therefore, large force generation is required as the actuator section in order to cause the material having a high Young's modulus to be distorted.

The optical waveguide core sections 177a to 177d are generally formed by using a photolithographic method which enables formation of a highly accurate and highly integrated pattern. Therefore, an increase in positional accuracy and density is required for the actuator section.

Since the matrix type piezoelectric/electrostrictive device according to the present invention directly utilizes the electric field induced strain of the piezoelectric/electrostrictive substance, the matrix type piezoelectric/electrostrictive device produces large force generation. Since the aspect ratio of the piezoelectric/electrostrictive element is easily increased, displacement can also be increased. Moreover, since the piezoelectric/electrostrictive elements are not individually attached to the ceramic substrate but are integrally formed in the shape of a matrix, dimensional deviation and inclination due to bonding are small. Therefore, a configuration at high density can be easily realized. Since the piezoelectric/electrostrictive substances which make up the piezoelectric/electrostrictive elements are formed in the shape of a foot near the joined section between the piezoelectric/electrostrictive substances and the ceramic substrate, the direction of action is easily fixed and the strength is increased. Since the sides of the piezoelectric/electrostrictive substances which make up the piezoelectric/electrostrictive elements are almost uniform, the electrodes are bonded with good adhesion. This decreases the stress distribution when applying an electric field, whereby the piezoelectric/electrostrictive substances are rarely damaged. Therefore, reliability of the piezoelectric/electrostrictive elements is increased. Therefore, the matrix type piezoelectric/electrostrictive device according to the present invention is suitable as the actuator section of the optical switch 290.

Figure 17:
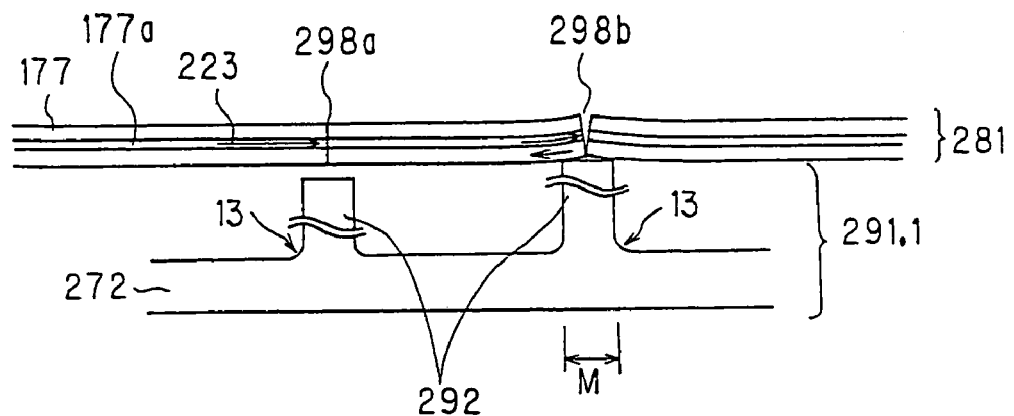
FIG. 17 is a cross-sectional view showing the embodiment of the optical switch which is the application example of the matrix type piezoelectric/electrostrictive device according to the present invention, which shows a cross section along the line C—C shown in FIG. 16.

FIG. 17 is a cross-sectional view showing the optical switch 290 shown in FIG. 16 along the line C—C. In FIG. 17, a light transmitting section 281 including the optical waveguide core section 177a and an actuator section 291 including piezoelectric/electrostrictive elements 292 are illustrated. The matrix type piezoelectric/electrostrictive device 1 shown in FIG. 1(a) is employed as the actuator section 291, for example. The matrix type piezoelectric/electrostrictive devices 1 are disposed corresponding to the optical path change sections 298a to 298d (notches).

The following description illustrates an embodiment of the matrix type piezoelectric/electrostrictive device applied as the actuator section 291 of the optical switch 290 as an example. However, any of the embodiments of the matrix type piezoelectric/electrostrictive devices according to the present invention may be applied as the actuator section 291.

FIG. 17 shows an example in which the matrix type piezoelectric/electrostrictive device 1 shown in FIG. 1(a) is applied as the actuator section of the optical switch. In the optical switch 290 shown in FIG. 17, the piezoelectric/electrostrictive element 292 in the actuator section 291 in the optical path change section 298a is in a non-operating state and does not act on the optical waveguide core section 177a. Therefore, the notch in the optical path change section 298a is closed, whereby the optical waveguide core section 177a maintains an optically continuous state. In this case, the introduced light 223 goes straight through the optical path change section 298a.

The piezoelectric/electrostrictive element 292 in the actuator section 291 in the optical path change section 298b is in an operating state and allows the notch in the optical path change section 298b to be opened by applying displacement and stress to the optical waveguide core section 177a. Specifically, the optical waveguide core section 177a is in an optically discontinuous state in the optical path change section 298b. The introduced light 223 is totally reflected in the optical path change section 298b and transmitted to the optical waveguide core section 177b.

The operating state or non-operating state of the actuator section (piezoelectric/electrostrictive element) and the presence or absence of action on the optical waveguide core section may be the reverse of that in the above-described case. Specifically, action on the optical waveguide core section may be absent when the actuator section is in an operating state (state of the optical path change section 298a in FIG. 17), and action on the optical waveguide core section may be present when the actuator section is in a non-operating state (state of the optical path change section 298b in FIG. 17). The thickness M (see FIG. 17) of the piezoelectric/electrostrictive element which applies action on the optical path change section is preferably as small as possible insofar as the open or close operation of the notch in the optical path change section is not hindered. This is because the amount of displacement required for the piezoelectric/electrostrictive element is decreased.

Figure 18:
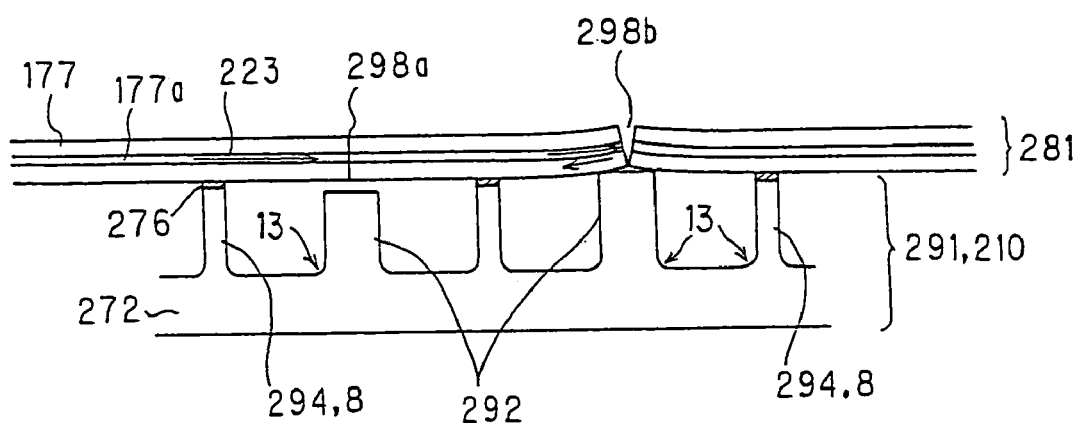
FIG. 18 is a cross-sectional view showing another embodiment of the optical switch which is the application example of the matrix type piezoelectric/electrostrictive device according to the present invention.

FIG. 18 shows an example in which the matrix type piezoelectric/electrostrictive device 210 shown in FIG. 21 is applied as the actuator section of the optical switch. The amount of displacement necessary for opening or closing the notches in the optical path change sections 298a to 298d can be decreased by using the wall sections 8 of the matrix type piezoelectric/electrostrictive device 210 as optical waveguide support sections 294. Specifically, since the radius of curvature for opening the notches in the optical path change sections 298a to 298d is decreased by providing the optical waveguide support sections 294, the notches can be opened even if the displacement of the piezoelectric/electrostrictive element 292 in the actuator section 291 is small. This bears some allowance in the operation required for opening the notch, whereby leakage and loss of a switching signal can be decreased.

Figure 19:
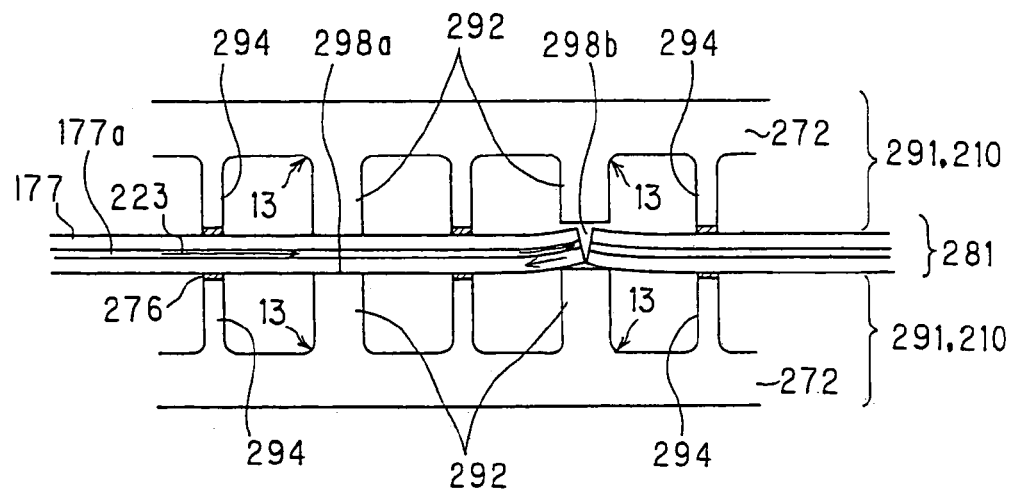
FIG. 19 is a cross-sectional view showing another embodiment of the optical switch which is the application example of the matrix type piezoelectric/electrostrictive device according to the present invention.

FIG. 19 shows an example in which the actuator sections are provided on each side (upper side and lower side) of the optical waveguide member. As the matrix type piezoelectric/electrostrictive device which can be applied to the actuator section 291, any of the embodiments of the matrix type piezoelectric/electrostrictive devices according to the present invention may be applied. For example, the matrix type piezoelectric/electrostrictive device 210 shown in FIG. 21 is preferably used. The notch in the optical path change section can be closed with higher accuracy by providing the actuator sections 291 on the upper side and the lower side of the optical waveguide member 177. Moreover, a response speed for switching can be increased.

In the case where the actuator section is provided only on one side of the optical waveguide member as shown in FIGS. 17 and 18, the change from the opened state to the closed state of the notch in the optical path change section depends on elastic restorability of the material used for the optical waveguide member. Therefore, if a soft material is used for the optical waveguide member, a comparatively long time is necessary for the restoration (change in state). Since this affects the time necessary for shifting to the next switching operation, restoration is preferably as fast as possible. Restoration used herein means that the material returns to an optically continuous state. Accuracy of restoration may be decreased during the operation for a long period of time due to deterioration of the material, whereby leakage or loss of the signal may be increased.

However, in the case where the actuator sections are provided on each side of the optical waveguide member as shown in FIG. 19, the above problems can be solved by forcibly putting the notch in the optical path change section between actions of the piezoelectric/electrostrictive elements 292 in the actuator section 291 disposed in the upper and lower directions of the notch in the optical path change section. Specifically, the notch can be closed with high accuracy by pressing the optical waveguide member 177 from each side. Moreover, the change from the opened state to the closed state can be performed at the response speed of the actuator sections 291 (piezoelectric/electrostrictive elements 292). Therefore, the configuration in which the actuator sections are provided on each side of the optical waveguide member is advantageous for realization of a small-loss, small-leakage, and high-speed switch.

Figure 20:
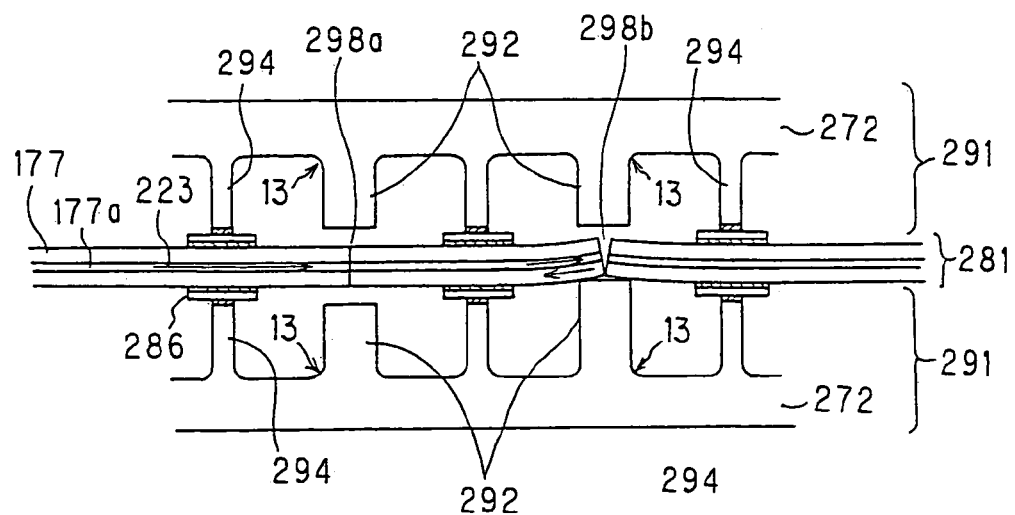
FIG. 20 is a cross-sectional view showing another embodiment of the optical switch which is the application example of the matrix type piezoelectric/electrostrictive device according to the present invention.

An optical switch shown in FIG. 20 is almost the same as the example shown in FIG. 19. However, in the example shown in FIG. 20, the actuator section 291 is bonded to the optical waveguide member 177 through rigid optical waveguide securing plates 286 provided between the wall sections 8 which make up the actuator section 291 and the optical waveguide member 177. According to this structure, since flatness of the optical waveguide core section is improved, the interval between the upper side (active side) of the piezoelectric/electrostrictive element 292 in the actuator section 291 and the optical waveguide member 177 can be maintained with high accuracy, whereby accuracy of the switch operation can be increased.

In FIGS. 19 and 20, the actuator sections 291 provided on the upper side and the lower side of the optical waveguide member 177 need not necessarily have the same structure. For example, the matrix type piezoelectric/electrostrictive device 1 shown in FIG. 1(a) may be provided on the upper side and the matrix type piezoelectric/electrostrictive device 210 shown in FIG. 21 may be provided on the lower side.

A light reflection mechanism to which the matrix type piezoelectric/electrostrictive device according to the present invention is applied is described below.

Figure 13:
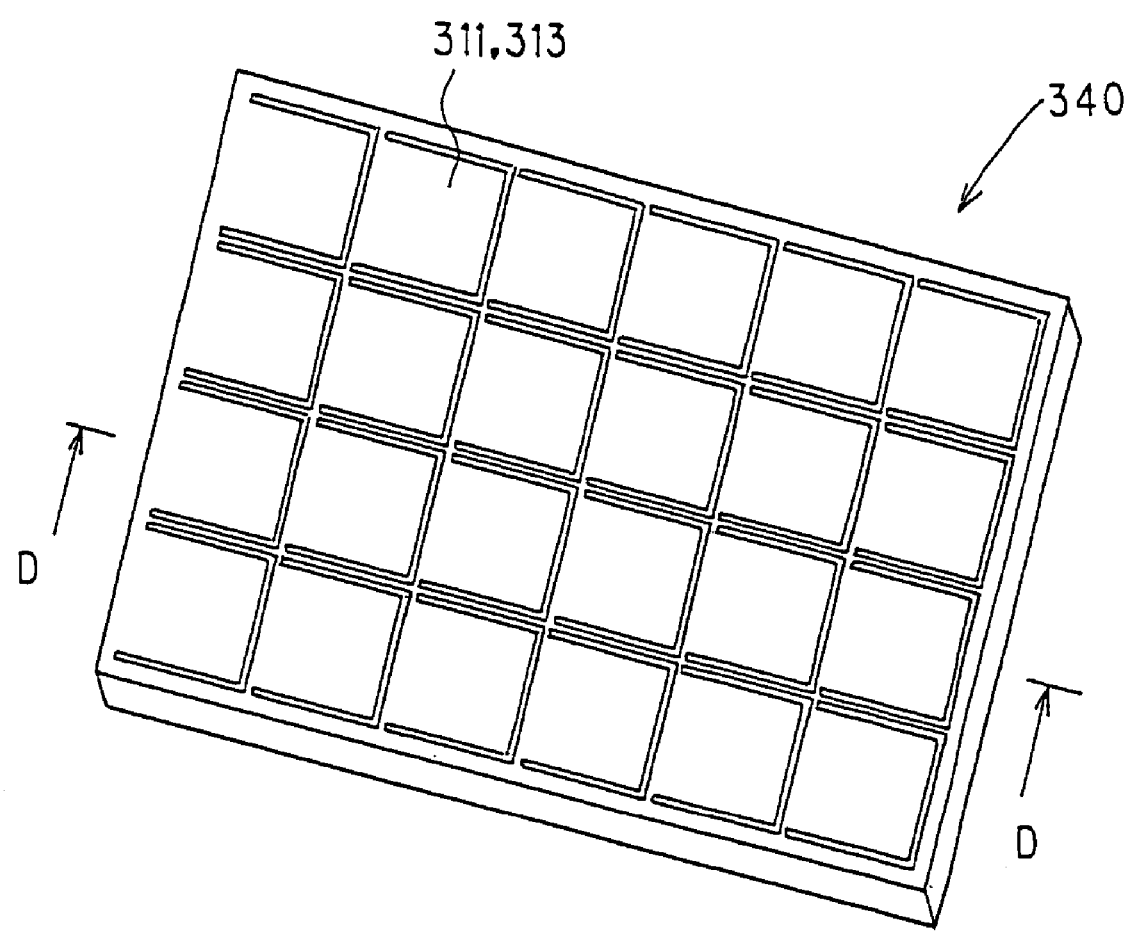
FIG. 13 is an oblique view showing one embodiment of a light reflection mechanism which is an application example of the matrix type piezoelectric/electrostrictive device according to the present invention.
Figure 14:
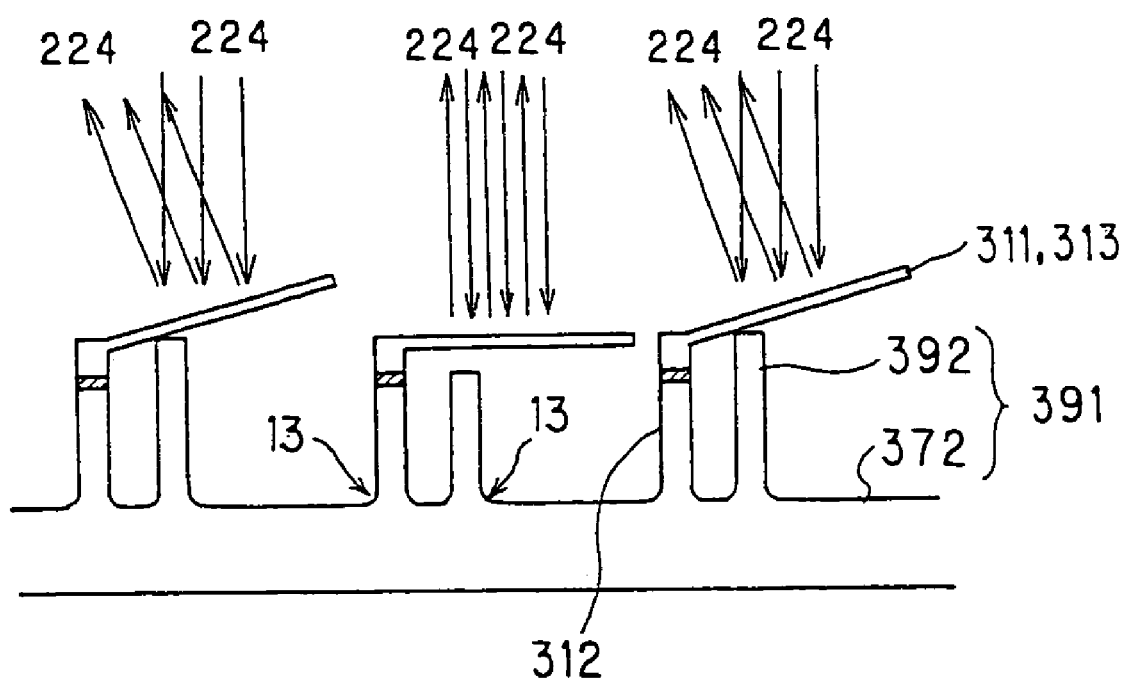
FIG. 14 is a cross-sectional view showing the embodiment of the light reflection mechanism which is the application example of the matrix type piezoelectric/electrostrictive device according to the present invention, which shows part of a cross section along the line D—D shown in FIG. 13.
Figure 15:
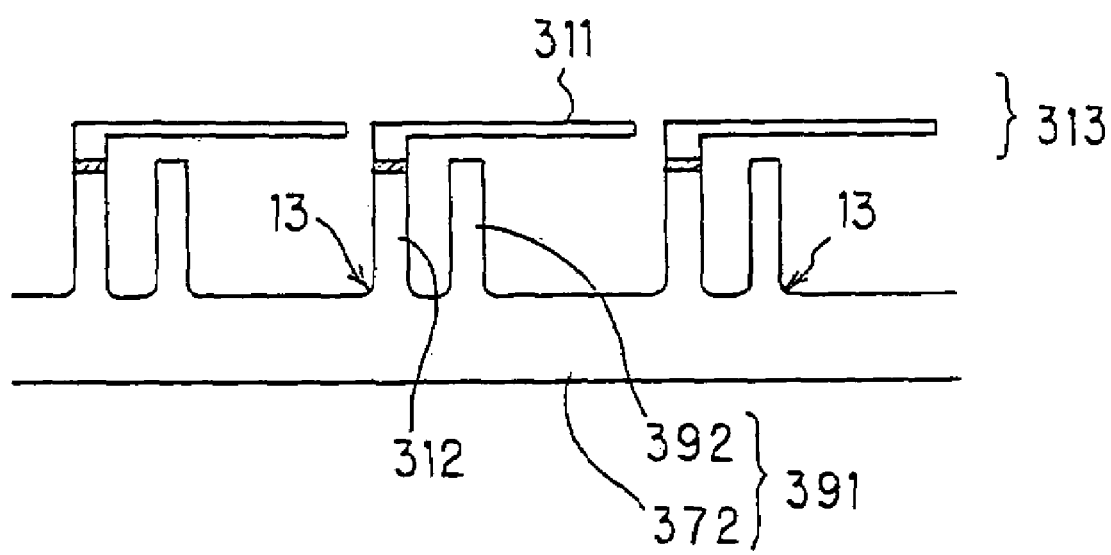
FIG. 15 is a cross-sectional view showing the embodiment of the light reflection mechanism which is the application example of the matrix type piezoelectric/electrostrictive device according to the present invention, which shows part of the cross section along the line D—D shown in FIG. 13.

FIG. 13 is an oblique view showing one embodiment of a light reflection mechanism. FIGS. 14 and 15 are views showing part of the cross section of a light reflection mechanism 340 shown along the line D—D in FIG. 13. FIGS. 14 and 15 show specific operating states of the light reflection mechanism 340. The light reflection mechanism 340 is used for projectors, optical switches, and the like. The matrix type piezoelectric/electrostrictive device according to the present invention can be suitably used as an actuator section 391 of the light reflection mechanism 340.

The light reflection mechanism 340 includes light reflecting sections 313 in which light reflecting plates 311 such as micromirrors are arranged in a matrix, and the actuator sections 391. Piezoelectric/electrostrictive elements 392 are disposed at position facing the light reflecting plates 311. For example, the matrix type piezoelectric/electrostrictive device according to the present invention having wall sections represented by the matrix type piezoelectric/electrostrictive device 210 shown in FIG. 21 is used as the actuator section 391. One end of the light reflecting plate 311 is supported by a light reflecting plate support section (wall section) 312. The light reflecting plate 311 is tilted with respect to the light reflecting plate support section 312 by the operation of the actuator section 391 (piezoelectric/electrostrictive element 392), thereby causing the reflection angle of incident light 224 to be changed. In the case of a projector, the color of each pixel is formed depending on the presence or absence of the reflection angle. In the case of an optical switch, a transmission path of a signal is switched depending on the presence or absence of the reflection angle.

As shown in FIGS. 13 to 15, in the actuator section to which the matrix type piezoelectric/electrostrictive device according to the present invention is applied, the pitch between the adjacent piezoelectric/electrostrictive elements 392 and the pitch between the wall sections which make up the light reflecting plate support sections 312 are the same. However, the actuator section may have a configuration in which the piezoelectric/electrostrictive elements 392 and the wall sections adjacent thereto are arranged at a different pitch. The piezoelectric/electrostrictive elements 392 are not necessarily arranged at the same pitch.

Since the matrix type piezoelectric/electrostrictive device of the present invention which is applied to the actuator section has large force generation, a light reflecting surface excelling in flatness can be formed by applying a highly rigid light reflecting plate. Therefore, this is very advantageous as a light reflection mechanism. Moreover, since the distance between the wall section (light reflecting plate support section) and the piezoelectric/electrostrictive element can be decreased by the force generation, a light reflection mechanism having a large reflection angle can be easily realized.

The light reflection mechanism is not limited to the embodiment of the light reflection mechanism 340 shown in FIGS. 13 to 15. The light reflection mechanism may have a configuration in which the actuator section is not bonded to the light reflecting section, and the reflection angle is changed by causing part of the light reflecting plate to be displaced by the operation of the piezoelectric/electrostrictive element. As the type of piezoelectric/electrostrictive element, a piezoelectric/electrostrictive element which is either contracted or expanded by applying a voltage may be used.

In addition to the above specific examples, the matrix type piezoelectric/electrostrictive device of the present invention may be used for various types of devices in which liquid and liquid, liquid and solid, or liquid and gas are mixed, stirred, reacted, or the like in a very minute area and a very small amount by using action based on displacement and vibration of the matrix type piezoelectric/electrostrictive device. The matrix type piezoelectric/electrostrictive device may also be used as a two-dimensional pressure sensor which sensors external stress.

A method of manufacturing the matrix type piezoelectric/electrostrictive device according to the present invention is described below. The method of manufacturing the matrix type piezoelectric/electrostrictive device according to the present invention includes a first manufacturing method and a second manufacturing method. The method of manufacturing the matrix type piezoelectric/electrostrictive device is described below in the order from the first manufacturing method. The method of manufacturing the matrix type piezoelectric/electrostrictive device according to the present invention used herein refers to both the first manufacturing method and the second manufacturing method.

The first method of manufacturing the matrix type piezoelectric/electrostrictive device according to the present invention comprises a first step of providing a plurality of ceramic green sheets containing a piezoelectric/electrostrictive material as a major component, a second step of forming opening sections having an almost right-angled quadrilateral shape, in which at least two corners are curved, at specific positions of a plurality of the ceramic green sheets, a third step of stacking a plurality of the ceramic green sheets in which the opening sections are formed to obtain a ceramic green laminate having holes, a fourth step of integrally sintering the ceramic green laminate to obtain a ceramic laminate having holes, a fifth step of forming electrodes at least on the side walls which make up the holes in the ceramic laminate, a sixth step of cutting the ceramic laminate on the holes in a direction perpendicular to the arrangement of the holes and perpendicular to the openings of the holes to obtain a comb tooth-shaped ceramic laminate, and a seventh step of cutting the comb tooth of the comb tooth-shaped ceramic laminate in a direction perpendicular to the cutting surface obtained in the sixth step and perpendicularly to the arrangement of the comb tooth. In the first method of manufacturing the matrix type piezoelectric/electrostrictive device according to the present invention, it is preferable to use a ceramic green sheet stacking method in this manner. When forming the opening sections in the ceramic green sheet, it is preferable to use punching which utilizes a mold consisting of a die and a punch. The opening sections may be formed by using an ultrasonic processing method instead of using the punch and the die.

In the first manufacturing method, the regions which are the side walls which make up the holes (up to fifth step) and are the comb tooth (after sixth step) become a plurality of the piezoelectric/electrostrictive elements (piezoelectric/electrostrictive substances) which are almost in the shape of a pillar. A plurality of the piezoelectric/electrostrictive elements are two-dimensionally arranged and part of the cross section of the holes is curved (second and third steps), whereby a matrix type piezoelectric/electrostrictive device in which the curved surfaces are formed near the joined section between the individual piezoelectric/electrostrictive substances and the ceramic substrate can be formed. The percentage of transgranularly fractured crystal grains on at least the sides of the piezoelectric/electrostrictive substances on which the electrodes are formed may be 0 to 1% or less.

FIGS. 8(a) to 8(f) are views showing an example of the steps of the first method of manufacturing the matrix type piezoelectric/electrostrictive device according to the present invention. This example is illustrated as a method of manufacturing the matrix type piezoelectric/electrostrictive device 1 shown in FIG. 1(a). The first method is described below in detail by using this example.

A specific number of ceramic green sheets (hereinafter may be simply called "sheets") containing a piezoelectric/electrostrictive material described later as a major component are provided. The ceramic green sheets may be manufactured by using a conventional method of manufacturing ceramics. For example, the ceramic green sheets may be manufactured by providing powder of a piezoelectric/electrostrictive material described later, forming a slurry by mixing a binder, a solvent, a dispersant, a plasticizer, and the like with the powder in a desired composition, defoaming the slurry, and forming the slurry into a sheet by using a sheet formation method such as a doctor blade method or a reverse roll coater method.

The sheets are subjected to punching by using a punch and a die in FIG. 8(a) to obtain sheets 116 and 117 in which a plurality of long, narrow opening sections 15, in which two corners are curved, are formed. In the sheets 117, slit-shaped opening sections 25 which connect each of the opening sections 15 with the ends of the sheets to open each of the opening sections 15 are formed. A specific number of sheets 116 and 117 are alternately stacked and compression bonded so that the sheets 116 are present at the uppermost side and the lowermost side to form a ceramic green laminate 301 shown in FIG. 8(b) which has a specific thickness, has holes 5 and through holes 128 formed therein, and contains the piezoelectric/electrostrictive material as a major component. The ceramic green laminate 301 is integrally sintered to obtain a ceramic laminate 303.

As shown in FIG. 8(c), electrodes 18 and 19 are formed on side walls 6 (comb tooth 26) which face the holes 5, and a conductive film is formed on the inner walls of the through holes 128. Unnecessary portions are removed along a cutting line 350 by using a means such as dicing, slicing, wire sawing, or grinding to obtain a comb tooth-shaped ceramic laminate 304, as shown in FIG. 8(d).

A comb tooth-shaped ceramic laminate 304 shown in FIG. 8(d) is the ceramic laminate 303 shown in FIG. 8(c) rotated 90°. In the ceramic laminate 303 shown in FIG. 8(c), the openings of the through holes 128 (front in FIG. 8(c), XZ surface) make up the side. In the comb tooth-shaped ceramic laminate 304 shown in FIG. 8(d), the openings of the through holes 128 make up the lower side.

Unnecessary portions are removed along cutting lines 351 shown in FIG. 8(e) to obtain individual piezoelectric/electrostrictive substances 4. Polarization processing is optionally performed to complete the matrix type piezoelectric/electrostrictive device 1 (FIG. 8(f)).

In this method, the opening sections 25 formed in the green sheets 117 corresponding to the through holes are connected with the ends of the green sheets. However, as shown in FIGS. 32(a) to 32(d), the opening sections may be formed so as not to be connected with the ends (opening sections 125 shown in FIG. 32(a)), and the through holes may be formed by cutting in the step shown in FIG. 32(c).

A specific number of ceramic green sheets are provided. The sheets are subjected to punching by using a punch and a die in FIG. 32(a) to obtain the sheets 116 and 217 in which a plurality of the long, narrow opening sections 15, in which two corners are curved, are formed. The slit-shaped opening sections 125 are formed in the sheets 217 in addition to the opening sections 15. A specific number of the sheets 116 and 217 are alternately stacked and compression bonded so that the sheets 116 are present at the uppermost side and the lowermost side to form a ceramic green laminate 401 shown in FIG. 32(b).

Figure 32:
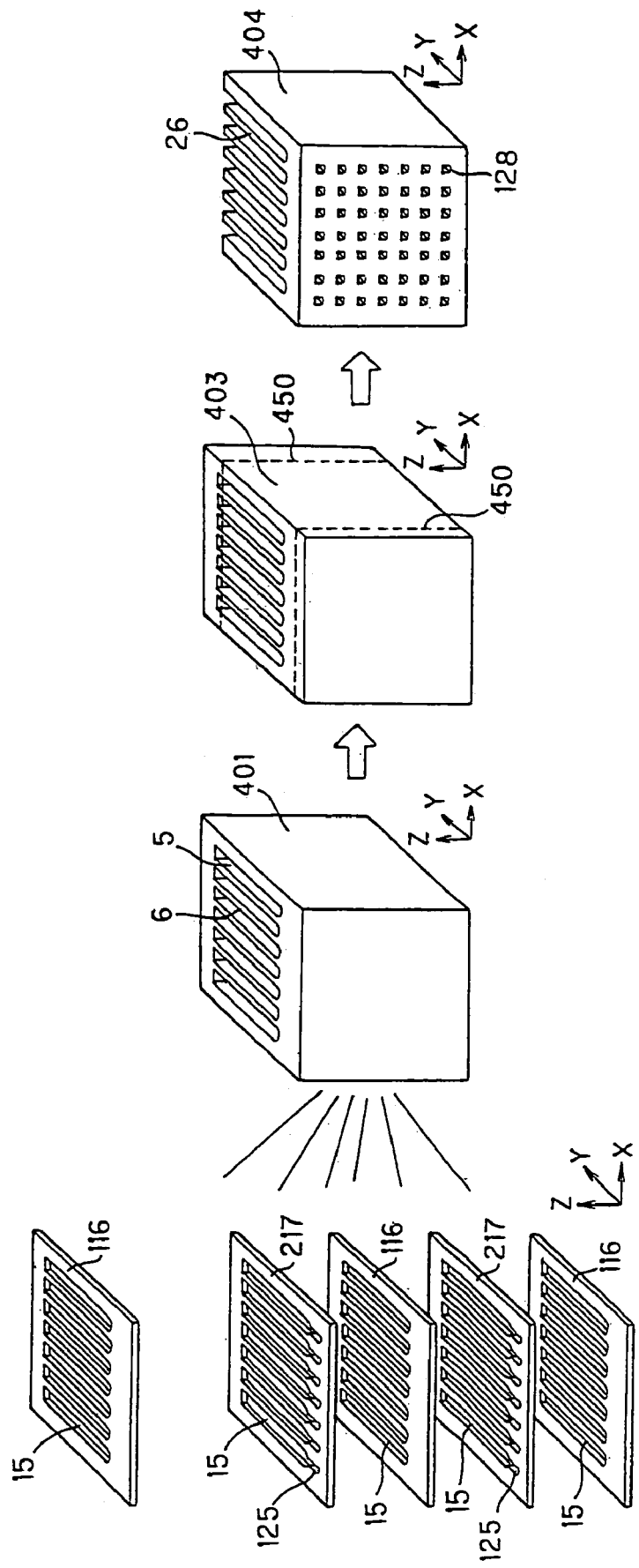
FIGS. 32(*a*) to 32(*d*) are explanatory diagrams showing steps of another example of the first method of manufacturing the matrix type piezoelectric/electrostrictive device according to the present invention.

The ceramic green laminate 401 is integrally sintered to obtain a ceramic laminate 403. As shown in FIG. 32(c), unnecessary portions are removed along two cutting lines 450 by using a means such as dicing, slicing, wire sawing, or grinding to obtain a comb tooth-shaped ceramic laminate 404, as shown in FIG. 32(d). The matrix type piezoelectric/electrostrictive device 1 is completed according to FIGS. 8(e) and 8(f).

In the method according to FIGS. 32(a) to 32(d), since the opening sections 125 are formed inside the sheets 217, handling capability is improved. Moreover, since deformation of the sheets is prevented, positioning accuracy during stacking is improved. The opening sections for the holes are not indispensable. Sheets having only the opening sections 15 may be stacked to form a laminate, and the holes may be formed at specific positions before or after sintering. The matrix type piezoelectric/electrostrictive device may be driven from the side of the ceramic substrate on which the piezoelectric/electrostrictive elements are formed without forming the through holes. In FIGS. 32(a) to 32(d), the electrode formation procedure is omitted.

According to the first method of manufacturing the matrix type piezoelectric/electrostrictive device according to the present invention, the direction of displacement of the piezoelectric/electrostrictive element 31 in the resulting matrix type piezoelectric/electrostrictive device 1 is the Y axis direction (FIG. 8(f)). The direction of displacement differs from the stacking direction of the ceramic green sheets 116 and 117 (Z axis direction, FIG. 8(a)). Specifically, displacement of the piezoelectric/electrostrictive element 31 does not depend on the number of the stacked sheets 116 and 117, but depends on the shape of the opening sections 15 (Y axis direction, FIG. 8(a)).

The shape of the piezoelectric/electrostrictive element 31 is mainly determined by the processed shape of the ceramic green sheets 116 and 117. The piezoelectric/electrostrictive element 31 having a high aspect ratio can be formed with high accuracy and high reproducibility by increasing the longitudinal direction of the opening sections 15. Therefore, the piezoelectric/electrostrictive element 31 which produces large displacement can be easily obtained. The thickness of the sheets 116 and 117 may optionally be selected. Highly accurate punching can be performed without causing the processed cross section to be tapered by appropriately setting the clearance of the punch and die used to process the openings depending on the thickness of the sheets 116 and 117. As a result, the degree of surface profile of the piezoelectric/electrostrictive substance 4 can be limited to 8 μm or less.

Since the opening sections 15 in the ceramic green sheets 116 and 117 can be processed into an optional shape, the foot section of the piezoelectric/electrostrictive element 31 is easily formed into a curved surface having a radius of curvature corresponding to the thickness by forming the opening sections 15 almost in the shape of a right-angled quadrilateral in which two corners are curved (two corners at the front in FIG. 8(a) are curved). Moreover, since the sides of the piezoelectric/electrostrictive substance 4 (sides of the comb tooth 26) are formed by the sintered surfaces, the surface roughness shown by Rt can be limited to 9 μm or less and the surface roughness shown by Ra can be limited to 0.1 to 0.5 μm. Therefore, the sides of the piezoelectric/electrostrictive substance 4 which is the drive section of the piezoelectric/electrostrictive element 31 can be made flat and smooth.

In the first method of manufacturing the matrix type piezoelectric/electrostrictive device according to the present invention, it is preferable to use machining utilizing loose abrasives, in particular, wire sawing as the processing method for cutting or removal from the viewpoint of processing quality (removal of grains, presence or absence of crack, and the like). In the case where openings are formed in an object of processing, the openings (holes 5 or space between the comb tooth 26, for example) are preferably filled with a removable resin or the like before processing, thereby preventing occurrence of damage during processing.

In the first method of manufacturing the matrix type piezoelectric/electrostrictive device according to the present invention, since the ceramic green laminate is sintered after punching (or ultrasonic processing, etc.) and is not subjected to processing after sintering, damage to the object of processing is small in comparison with the case of performing processing using fixed abrasives such as a dicer or slicer after sintering. This enables a minute structure to be easily formed. Therefore, the processed surface has little roughness and is homogenous, whereby adhesion between the electrodes and the piezoelectric/electrostrictive substance is increased when forming the electrodes on the processed sides (surfaces) of the piezoelectric/electrostrictive substance. This enables the piezoelectric characteristics to be obtained more effectively.

Figure 10:
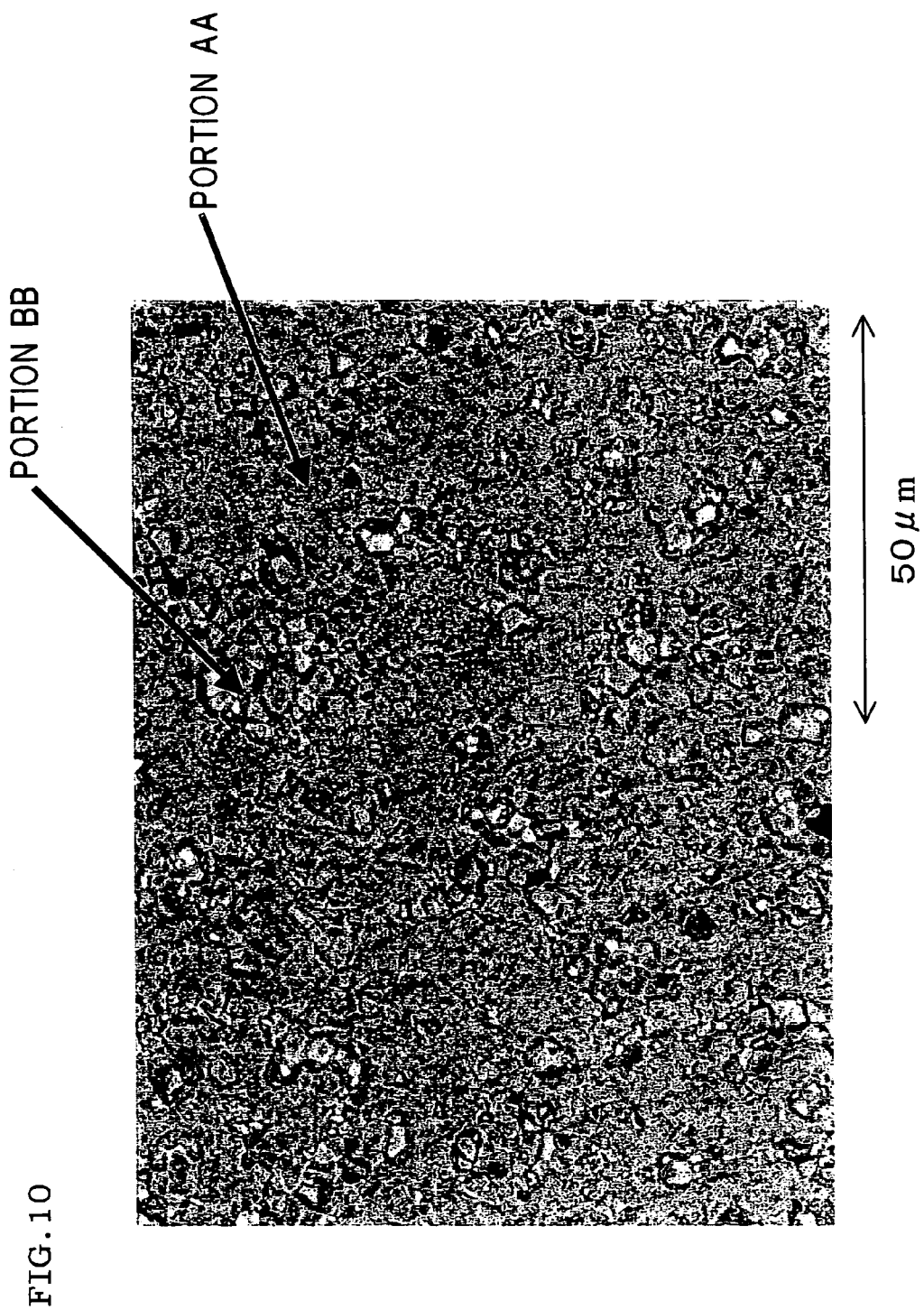
FIG. 10 is a photograph showing a processed surface by a conventional manufacturing method.
Figure 11:
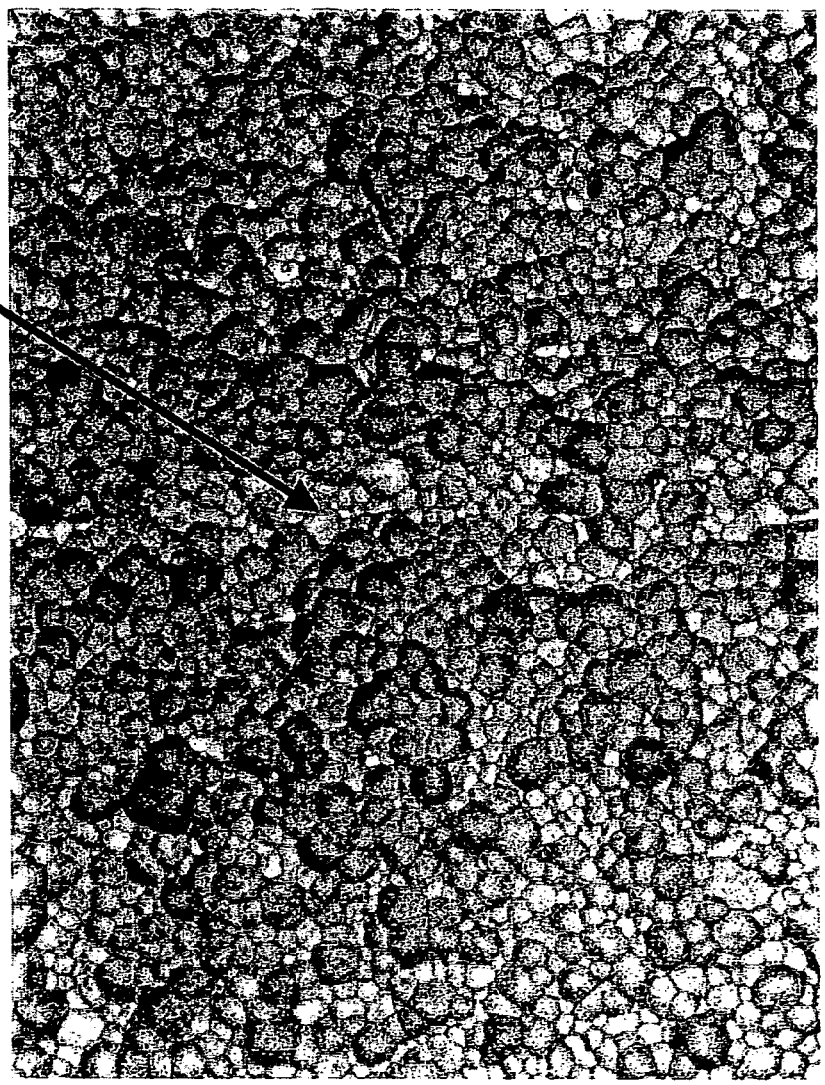
FIG. 11 is a photograph showing a processed surface by the first method of manufacturing the matrix type piezoelectric/electrostrictive device according to the present invention.
Figure 28:
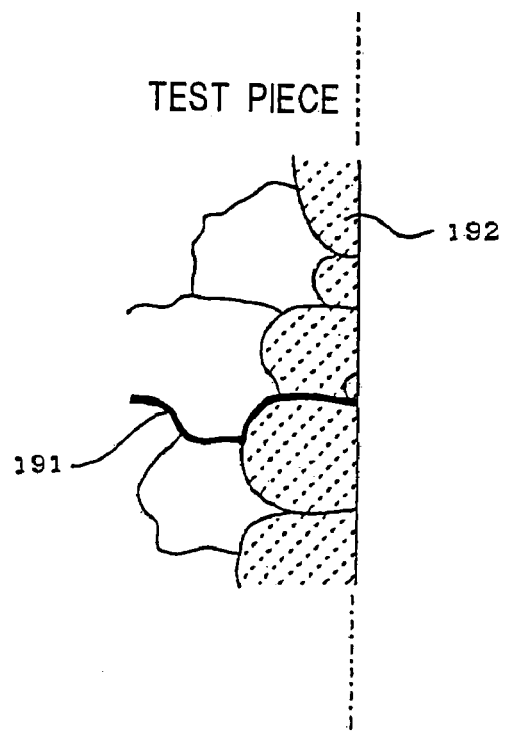
FIG. 28 is a view showing a processed surface by a conventional manufacturing method, which is an enlarged schematic side view of the processed surface.
Figure 29:
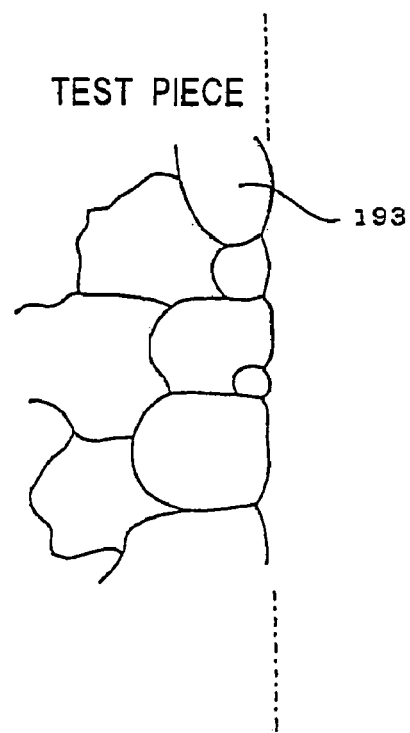
FIG. 29 is a view showing a processed surface by the first method of manufacturing the matrix type piezoelectric/electrostrictive device according to the present invention, which is an enlarged schematic side view of the processed surface.

FIG. 10 shows an enlarged SEM photograph (magnification: 1000) showing the processed surface of a sintered specimen consisting of a piezoelectric/electrostrictive material subjected to slicing processing (example of abrasive #1000). FIG. 28 is an enlarged schematic cross-sectional view showing the processed surface of the specimen. FIG. 11 shows an enlarged SEM photograph (magnification: 1000) showing the processed surface of a specimen consisting of the same material sintered after punching using a punch and a die. FIG. 29 is an enlarged schematic cross-sectional view showing the processed surface of the specimen.

As shown in FIG. 10, a region AA and a region BB are observed in the specimen subjected to slicing processing. The region AA is a flat ground surface condition in which piezoelectric/electrostrictive crystal grains are transgranularly fractured. The region BB is a surface condition in which the surface of the grains appears. These conditions are present in a mixed state, whereby the surface of the specimen is not uniform. The surface condition can be made uniform by increasing the count of the grindstone. However, such a surface condition is dominated by the region AA. Specifically, the surface of the piezoelectric/electrostrictive substance consists of transgranularly fractured crystals. As shown in FIG. 28, the presence of a microcrack 191 and a transgranularly fractured ceramic crystal grain 192 is observed in the specimen subjected to slicing processing.

A region such as the region AA shown in FIG. 10 is not recognized in a sample subjected to punching using a punch and a die (FIG. 11). Almost no transgranularly fractured condition is present in this sample. A homogeneous surface in which a region DD is uniformly present is observed. As shown in FIG. 29, no microcracks occur and ceramic crystal grains 193 are in a state in which transgranularly fractured crystal grains are substantially absent. As described above, the percentage of transgranularly fractured crystal grains on the cross section of the sample is limited to 1% or less by sintering the sample after punching. Therefore, deterioration of characteristics due to compression residual stress and the like is eliminated.

The percentage of the transgranularly fractured crystal grains is determined by observing the surface of an objective piezoelectric/electrostrictive substance as an example of the sample shown in FIG. 10 using an electron microscope, and calculating the percentage of a transgranularly fractured region (region AA in FIG. 10) occupying the entire observation field of view as an area ratio.

In the first method of manufacturing the matrix type piezoelectric/electrostrictive device according to the present invention, the ceramic laminate is cut after sintering in order to obtain the individual piezoelectric/electrostrictive substances 4. However, the electrodes 18 and 19 are not formed on the side to be cut, and this side does not become the main surface for allowing the piezoelectric/electrostrictive element 31 to function, as shown in FIG. 8(e). Therefore, the matrix type piezoelectric/electrostrictive device is not substantially affected even if such a cut side is present. In addition, occurrence of such a phenomenon is eliminated by cutting before sintering.

In the first method of manufacturing the matrix type piezoelectric/electrostrictive device according to the present invention, the ceramic green sheets 116 and 117 may be positioned by sequentially stacking the sheets 116 and 117 in a frame having almost the same shape as the external shape of the sheets 116 and 117, stacking the sheets 116 and 117 by passing guide pins through guide holes formed in the sheets 116 and 117, or arranging a specific number of guide pins having the same shape as the opening sections at a specific pitch and stacking the sheets 116 and 117 while passing the guide pins through the opening sections as the guide holes. The sheets 116 and 117 are compression bonded while heating, whereby the ceramic green laminate 301 is formed.

Since the stacking deviation of the sheets rarely occurs by manufacturing the matrix type piezoelectric/electrostrictive device by punching and stacking the ceramic green sheets at the same time (simultaneous punching-stacking), the piezoelectric/electrostrictive substances 4 can be arranged with higher accuracy. This is effective for manufacturing a large-scale matrix device in which a large number of piezoelectric/electrostrictive elements 31 are stacked.

In the simultaneous punching-stacking, the ceramic green sheets are stacked while forming the opening sections by punching the ceramic green sheets, thereby forming a ceramic green laminate containing a piezoelectric/electrostrictive material in which the holes having a specific thickness are formed. Although stacking deviation of the sheets rarely occurs in this method, it is difficult to stack the sheets 116 and 117 shown in FIG. 8(a) while forming the opening sections having a different shape. Therefore, in order to obtain the ceramic green laminate 301 shown in FIG. 8(b), the sheets in which slit-shaped opening sections are processed corresponding to the through holes are provided, and stacked while processing the opening sections having the same shape.

FIGS. 27(a) to 27(e) are views showing a specific method of the simultaneous punching-stacking. In FIGS. 27(a) to 27(e), a mold consisting of a punch 10 and a die 12, in which a stripper 11 for stacking the sheets 116 is disposed, is used. FIG. 27(a) shows a state before punching in which a first sheet 116a is placed on the die 12. In FIG. 27(b), opening sections are punched through the sheet 116a by lowering the punch 10 and the stripper 11.

A second sheet 116b is then punched. As shown in FIG. 27(c), the first sheet 116a is removed from the die 12 by moving the first sheet 116a upward while causing the first sheet 116a to adhere to the stripper 11. The sheet 116 may be caused to adhere to the stripper 11 by applying a vacuum to the sheet 116 through a hole formed in the stripper 11.

The punch 10 and the stripper 11 are pulled up from the die 12 before punching the second sheet 116b. It is preferable not to pull the tip of the punch 10 inside the opening section in the first sheet 116, which is pulled up together with the punch 10. It is important to stop pulling at a position a little upward from the bottom of the first sheet 116a. If the punch 10 is pulled inside the opening in the first sheet 116a, or completely stored in the stripper 11, the opening is deformed since the sheet 116 is soft. As a result, flatness of the side wall which makes up the hole 5 is decreased when forming the hole 5 obtained by stacking the sheets 116.

FIG. 27(d) shows a step of punching the second sheet 116b. The second sheet 116b can be easily placed on the die 12 and punched in the same manner as in the step shown in FIG. 27(b), by causing the first sheet 116a to adhere to the stripper 11. At the same time, the second sheet 116b is superposed on the first sheet 116a.

The second sheet 116b is pulled up from the stripper 11 in a state in which the first sheet 116a is superposed on the second sheet 116b by repeating the steps shown in FIGS. 27(c) and 27(d). A third sheet 116c is then punched. In this case, it is important to stop pulling when the tip of the punch 10 is positioned a little upward from the bottom of the sheet 116. A necessary number of sheets 116 are repeatedly punched and stacked by repeating the step of punching the sheet and overlapping the sheet on the previously punched sheet using the punch as the stacking axis.

FIG. 27(e) is a view showing a state after completing punching. When a necessary number of sheets 116 are punched and stacked, the punched and stacked sheet 116 can be removed from the stripper 11 by releasing the support of the sheet 116 by the stripper 11. The sheet 116 can be securely removed from the stripper 11 by providing removal jigs 17 at the bottom of the stripper 11.

A manufacturing method disclosed in Japanese Patent Application No. 2001-131490 applies to the above-described operations. The ceramic green laminate 301 (FIG. 8(b)) which has a specific thickness and in which the holes 5 are formed can be obtained by forming the through holes 128.

The opening sections 15 are formed in the ceramic green sheet 116 using the punch and die, and the sheets 116 are stacked at the same time by the simultaneous punching-stacking. This prevents deformation of the opening sections 15 punched by the punch using the punch as a layer positioning axis of the sheets 116. Therefore, deviation between the stacked layers of the sheets 116 can be almost eliminated (less than 5 μm), whereby the ceramic green laminate 301 can be obtained with higher accuracy.

In the first method of manufacturing the matrix type piezoelectric/electrostrictive device according to the present invention, the stacking direction (Z axis direction) of the sheets 116 is one of the directions in which the piezoelectric/electrostrictive substances 4 (piezoelectric/electrostrictive elements 31) are arranged in a matrix, as shown in FIGS. 8(a) to 8(f). Therefore, the positional deviation of the piezoelectric/electrostrictive elements 31 is almost eliminated as the accuracy is increased, whereby a further increase in the degree of profile is achieved and a device in which the piezoelectric/electrostrictive elements 31 having a high aspect ratio are disposed with high accuracy and at a high degree of integration can be realized.

In the case of forming tall piezoelectric/electrostrictive elements having a high aspect ratio (the height is greater than the thickness), it is preferable to prevent occurrence of deformation of or damage to the side wall between the holes (piezoelectric/electrostrictive substance) during handling in the manufacturing process including sintering. In FIG. 8(b), it is preferable to attach the ceramic green sheet to (the upper side and the lower side of) the ceramic green laminate 301 so that the holes 5 are closed and sinter the ceramic green laminate 301, for example. Since the through holes 128 become discharge ports for gas generated by decomposition and combustion of organic substances in the green sheet during sintering, cracking or the like does not occur. The closed area (area corresponding to the sheets provided to close the holes) may be removed after sintering by grinding or the like, whereby the holes may be opened.

As a method for forming the electrodes on the sides of the piezoelectric/electrostrictive substance in FIG. 8(c), sputtering, vacuum deposition, CVD, plating, coating, spraying, or the like may be used. In this case, it is preferable to form the electrodes after providing a mask so that short circuits do not occur between a pair of electrodes. Moreover, in the case of strictly setting the initial height of each piezoelectric/electrostrictive element to be uniform, it is preferable to perform grinding before or after the cutting step shown in FIG. 8(e), in order to increase the degree of flatness of the active side so that the piezoelectric/electrostrictive element can effectively act on the object, to make the active side a mirror surface, and the like. The masking treatment for forming the electrodes is not necessarily required. For example, a pair of the electrodes is formed by forming the electrode over the entire surface and disconnecting the electrode by grinding.

Figure 22:
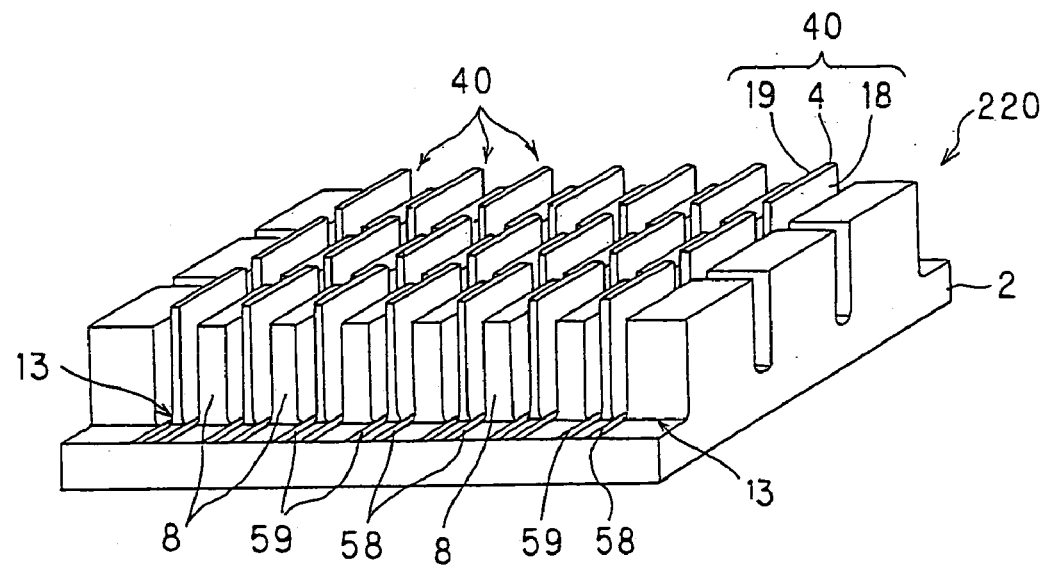
FIG. 22 is an oblique view showing another embodiment of the matrix type piezoelectric/electrostrictive device according to the present invention.
Figure 23:
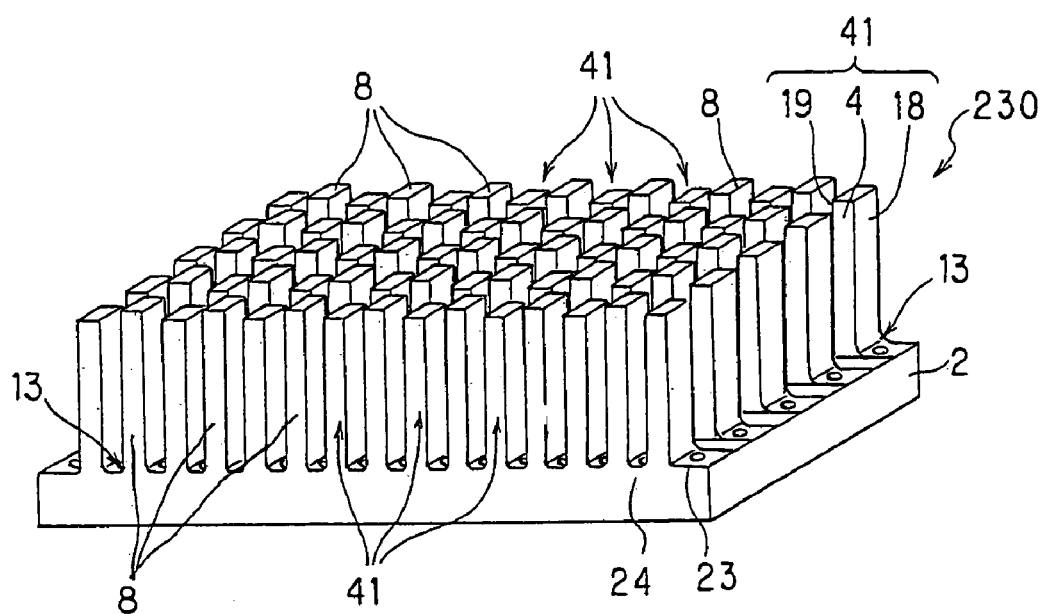
FIG. 23 is an oblique view showing another embodiment of the matrix type piezoelectric/electrostrictive device according to the present invention.

Grinding may be employed to form the matrix type piezoelectric/electrostrictive device shown in FIGS. 22 and 23 in which the height of the wall section differs from the height of the piezoelectric/electrostrictive element. The matrix type piezoelectric/electrostrictive device shown in FIG. 22 can be realized by forming a pair of electrodes and grinding the electrodes in a state in which the piezoelectric/electrostrictive element is operated by applying a voltage to the pair of electrodes, and applying this embodiment to the type of matrix type piezoelectric/electrostrictive device in which the piezoelectric/electrostrictive element is contracted in an operating state, for example. The matrix type piezoelectric/electrostrictive device shown in FIG. 23 can be realized by applying this embodiment to the type of matrix type piezoelectric/electrostrictive device in which the piezoelectric/electrostrictive element is expanded in an operating state.

In the first manufacturing method, it is preferable to sinter the ceramic green laminate after stacking a green sheet in the shape of a plate on the openings of the holes. The shape of the side walls which makes up the holes is stabilized by such a method.

The second method of manufacturing the matrix type piezoelectric/electrostrictive device according to the present invention is described below. The second method of manufacturing the matrix type piezoelectric/electrostrictive device according to the present invention comprises a step A of providing a ceramic green formed product containing a piezoelectric/electrostrictive material as a major component, a step B of sintering a ceramic precursor including at least the ceramic green formed product to obtain an integral ceramic sintered product, a step C of forming a plurality of first slits in the ceramic sintered product by machining utilizing loose abrasives as processing media, a step D of forming electrodes on the sides of the first slits, and a step E of forming a plurality of second slits which intersect the first slits.

In the second method of manufacturing the matrix type piezoelectric/electrostrictive device according to the present invention, since machining using loose abrasives (cutting) is suitably used, damage to the object of processing is small in comparison with the case of processing using a fixed abrasive such as a dicing or slicing in the same manner as in the first method. Therefore, a minute structure can be easily formed. Because of this, the processed surface has little roughness and becomes homogenous. This increases adhesion between the electrodes and the piezoelectric/electrostrictive substance when forming the electrode on the surfaces (sides) of the processed piezoelectric/electrostrictive substances. As a result, the piezoelectric characteristics can be brought out more effectively. The abrasive is preferably silicon carbide at #3000–#8000.

Figure 38:
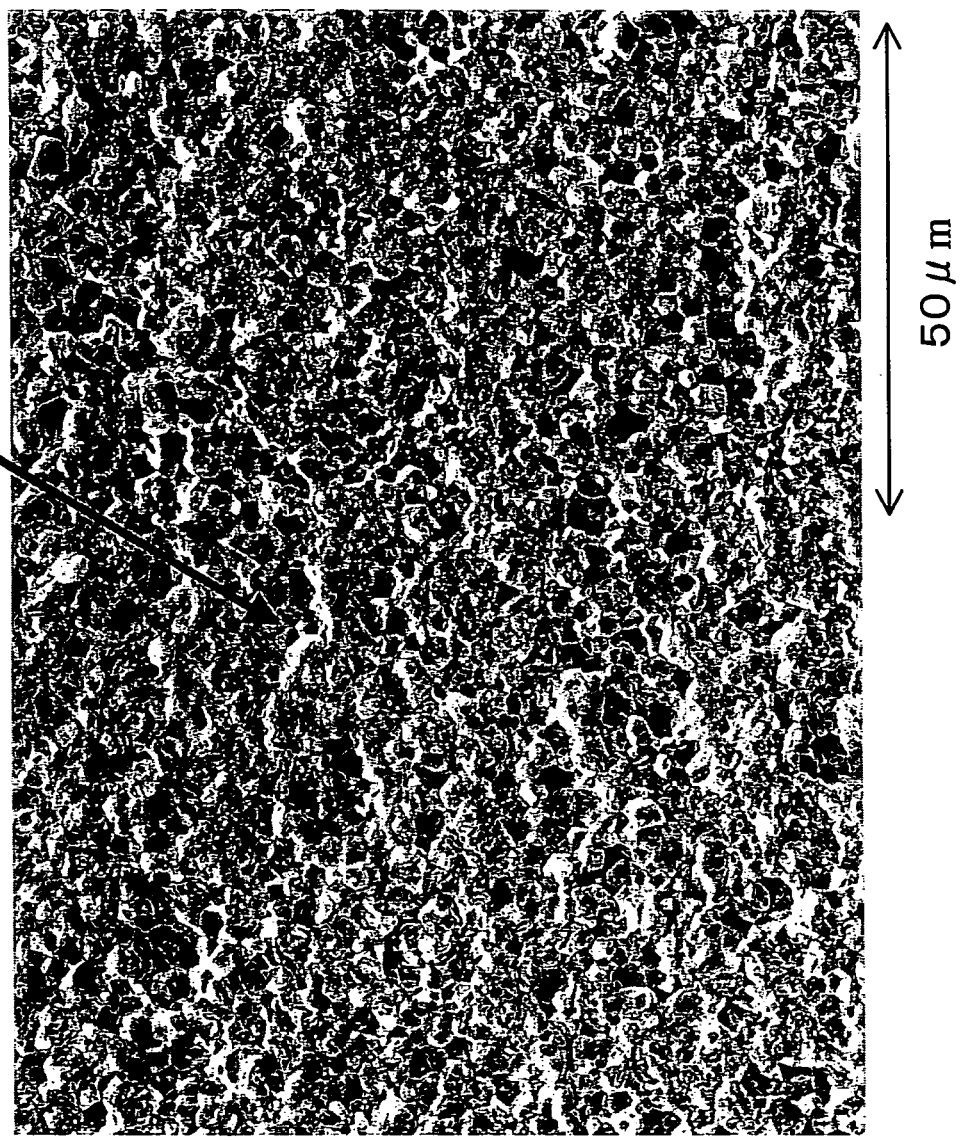
FIG. 38 is a photograph showing a processed surface by the second method of manufacturing the matrix type piezoelectric/electrostrictive device according to the present invention.

FIG. 38 shows an enlarged SEM photograph (magnification: 1000, alternative drawing) showing the processed surface of a specimen consisting of a piezoelectric/electrostrictive material subjected to cutting using loose abrasives (wire saw #6000). As described relating to the first manufacturing method (as shown in FIG. 10), the surface of the piezoelectric/electrostrictive substance is transgranularly fractured in the sample subjected to cutting using a fixed abrasive, whereby the surface of the sample consists of planarly ground crystals. However, such a planarly fractured condition is rarely observed in a sample subjected to cutting using loose abrasives. A region EE is uniformly present in this sample, whereby a homogeneous surface is observed. As described above, cutting using loose abrasives enables the percentage of transgranularly fractured crystal grains on the surface of the processed surface of the sample to be limited to 10% or less. Therefore, deterioration of the characteristics due to compressive residual stress or the like is decreased.

As the machining using loose abrasives as processing media, wire sawing, ultrasonic processing, blasting, or other various types of processing may be employed. It is particularly preferable to use wire sawing, since the state of the curved surfaces (in the shape of R) at the bottom of the cut grooves can be easily controlled. Therefore, fine processing can be performed at high density and damage is small.

In the case of wire sawing, the diameter of the wire is preferably about 30 to 200 μm in view of occurrence of cracks and the surface conditions. The processing speed of the wire sawing is preferably about 10 to 100 μm/min. The wire speed is preferably faster, since uniform opening sections can be reliably formed because of an increase in rigidity of the wire and a decrease in processing deviation. The wire speed is still more preferably adjusted within the range of 10 to 800 m/min. depending on the diameter of the wire, processing width, materials, and dimensions. The percentage of transgranularly fractured crystal grains on the processed surface can be limited to 10% or less by employing the above conditions, even in manufacturing methods in which the piezoelectric/electrostrictive substances are processed after sintering.

An example of the second method of manufacturing the matrix type piezoelectric/electrostrictive device according to the present invention is described below, taking a case of utilizing wire sawing as an example of machining using loose abrasives. FIGS. 31(a) to 31(h) are views schematically showing steps of an example of the second manufacturing method of the piezoelectric/electrostrictive device. This example is described as a method of manufacturing the matrix type piezoelectric/electrostrictive device 1 shown in FIG. 1(a).

A specific number of ceramic green sheets containing a piezoelectric/electrostrictive material described later as a major component is provided. Ceramic green sheets 16, which make up the piezoelectric/electrostrictive element 31, and ceramic green sheets 113, which make up the substrate 2, are punched in FIG. 31(a) into a specific external shape by using a punch and a die. Via holes 112 are formed in the sheets 113. A specific number of ceramic green sheets 16 and a specific number of ceramic green sheets 113 are stacked and compression bonded to obtain a ceramic green laminate 601 and a ceramic green substrate 602 (FIG. 31(*b*)).

The ceramic green laminate 601 and the ceramic green substrate 602 are stacked to form a ceramic precursor containing the piezoelectric/electrostrictive material as a major component. In this case, a laminate of the sheets 16 and a laminate of the sheets 113 may be separately formed, and these laminates may be then stacked. The ceramic precursor may be formed by collectively stacking the sheets 16 and the sheets 113. In this example, no holes are formed in the sheets 16. However, positioning holes for subsequent wire sawing, reference holes for stacking, and the like may optionally be formed in the sheets 16. The ceramic precursor is integrally sintered to obtain a ceramic sintered product 603 (FIG. 31(*c*)).

Figure 31:
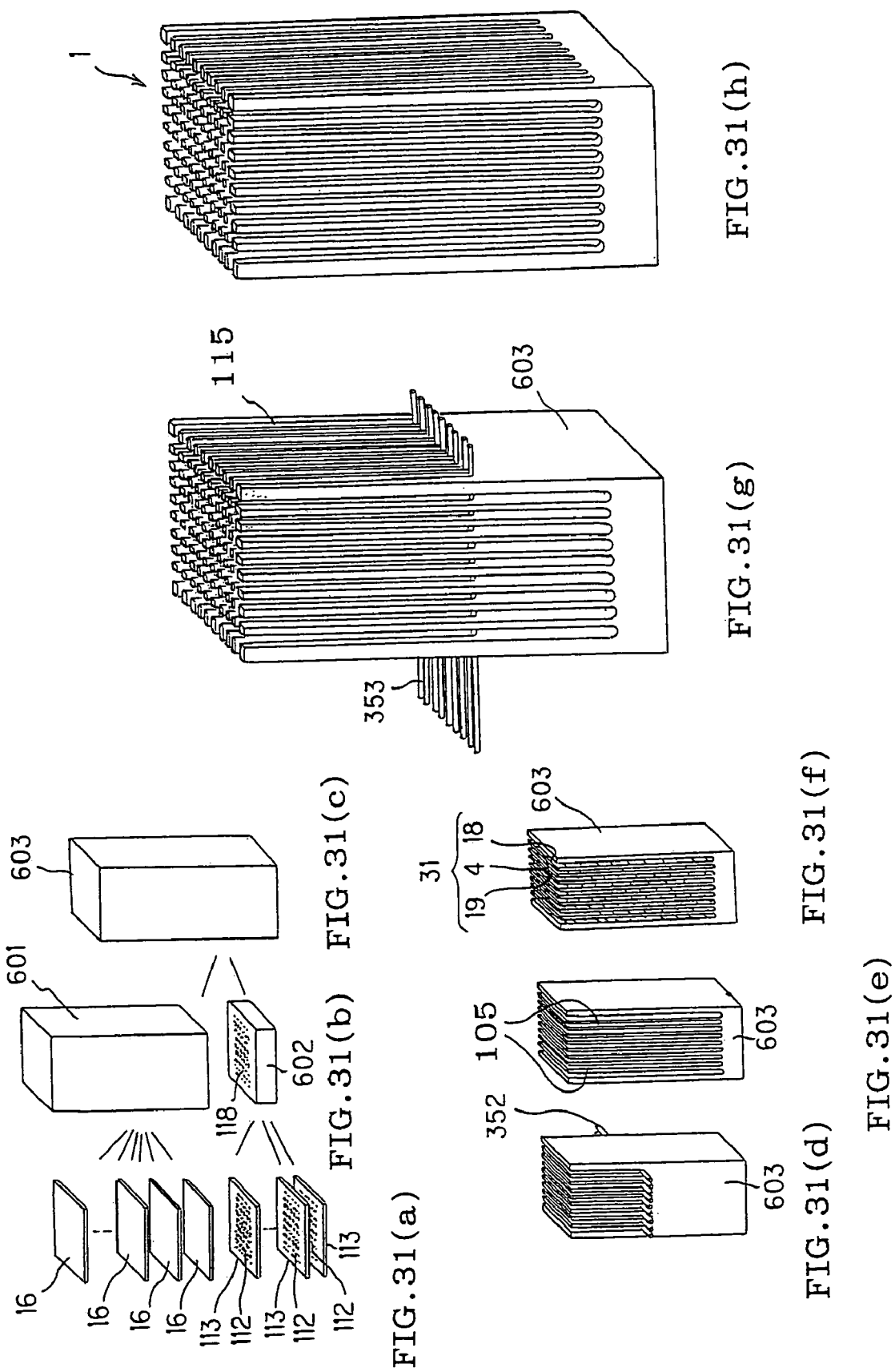
FIGS. 31(*a*) to 31(*h*) are explanatory diagrams showing steps of an example of a second method of manufacturing the matrix type piezoelectric/electrostrictive device according to the present invention.

As shown in FIG. 31(*d*), slits 105 are formed in the ceramic sintered product 603 by cutting uniaxially using a wire saw 352 in which wires are arranged at a specific pitch (FIG. 31(*e*)). The electrodes 18 and 19 are formed on the sides of the piezoelectric/electrostrictive substances 4 by using a coating method or the like (see FIG. 31(*f*) and FIG. 1(*a*)). Slits 115 are formed in the direction which intersects the slits 105 processed in the step shown in FIG. 31(*d*) by using a wire saw 353 in which wires are arranged at a specific pitch. The piezoelectric/electrostrictive substances 4 are optionally polarized to complete the matrix type piezoelectric/electrostrictive device 1 (FIG. 31(*h*)).

It is still more preferable to fill the slits 105 with removable fillers such as a resin between the steps shown in FIGS. 31(*f*) and 31(*g*). This prevents the ceramic sintered product from being damaged during the succeeding slit processing. After filling the slits with a resin or the like, it is preferable to grind the ceramic sintered product before performing the succeeding slit processing in order to make the initial height of the piezoelectric/electrostrictive elements uniform, to decrease the degree of flatness of the active side so that the piezoelectric/electrostrictive element can effectively act on an object of driving, or to make the side of action a mirror surface.

FIGS. 37(*a*) to 37(*i*) are views showing an example of a method of manufacturing a matrix type piezoelectric/electrostrictive device 80 shown in FIG. 33. The manufacturing steps are almost the same as those of the manufacturing method shown FIGS. 31(*a*) to 31(*h*).

Internal electrodes 48 and 49 are formed at specific positions of each ceramic green sheet excluding the uppermost layer by using screen printing or the like (FIG. 37(*a*)). Ceramic green sheets 316 and 317 are alternately stacked to obtain a ceramic green laminate 701 (FIG. 37(*b*)). The ceramic green laminate 701 and a ceramic green substrate 702 separately provided are stacked to obtain a ceramic precursor (FIG. 37(*c*)). The ceramic precursor is integrally sintered to obtain a ceramic sintered product 703 (FIG. 37(*d*)).

The slits 105 are formed by using the wire saw 352 (FIG. 37(*e*)). The internal electrodes 48 and 49 of the ceramic sintered product 703 are exposed through the slits 105. The internal electrodes 49 are not illustrated in FIG. 37(*f*). The electrodes 28 and 29 are formed on the side walls which make up the slits 105 by using a coating method or the like. The slits 115 are formed along cutting lines 351 in the direction which intersects the slits 105 by using a wire saw (FIGS. 37(*g*) and 37(*h*)).

The ceramic sintered product 703 is cut along cutting lines 750 by using the wire saw 353 to complete the matrix type piezoelectric/electrostrictive device 80 (FIG. 37(*i*)). In the manufacturing steps shown in FIGS. 37(*a*) to 37(*i*), use of fillers and grinding may be applied in the same manner as in FIGS. 31(*a*) to 31(*h*).

The examples of the second method of manufacturing of the matrix type piezoelectric/electrostrictive device according to the present invention shown in FIGS. 31(*a*) to 31(*h*) and FIGS. 37(*a*) to 37(*i*) are the cases of forming comparatively narrow slits having a width equal to the diameter of the wire. However, in the case of forming wide slits, other methods may be preferably employed.

In the case of forming wide slits by using wire sawing, thick wires having a width corresponding to the width of the slits are generally employed. If such thick wires are not available, slits having a desired width are formed by repeatedly processing the slits while gradually moving the position.

Use of thick wires increases the processing speed. However, a large amount of stress applied during processing causes a large degree of damage to the side walls of the slits, which become the sides of the piezoelectric/electrostrictive substances. In particular, in the case of forming a piezoelectric/electrostrictive element (piezoelectric/electrostrictive substance) having a small thickness, the piezoelectric/electrostrictive substance may be damaged during processing, or cracks or the like easily occur. Moreover, the thickness of the piezoelectric/electrostrictive substances may become non-uniform, whereby the radius of curvature of the curved surface near the joined section between the ceramic substrate and the piezoelectric/electrostrictive substance is increased. This may hinder characteristics of the piezoelectric/electrostrictive element. In the case where the distance between the slits (thickness of the piezoelectric/electrostrictive elements (piezoelectric/electrostrictive substances)) is small, characteristics of the piezoelectric/electrostrictive element are significantly affected. Therefore, it is preferable to use thin wires when processing using a wire saw from the viewpoint of processing quality.

In the case of repeatedly processing the slits while moving their position, since the width of the processed slits is almost equal to the diameter of the wires, it is necessary to repeatedly process a number of narrow slits when forming wide slits using thin wires. This results in an increase in the number of processing steps, whereby the processing time is increased to the multiple of the number of processing steps. Moreover, since the sample is inevitably subjected to processing for a long period of time, it is necessary to strictly take measures against damage.

A biaxial processing method can solve the above problems. The biaxial processing method enables utilization of thin wires which cause only a small degree of damage, and is capable of processing the slits without depending on the width of the slits and without increasing the number of steps. In the biaxial processing method, a ceramic sintered product is then cut in the direction of the thickness to obtain first cut grooves. The ceramic sintered product is cut in the direction of the thickness while moving the cutting position at a specific distance from the first cutting position to obtain second cut grooves. Then, regions between the first cut grooves and the second cut grooves are removed by cutting the ceramic sintered product from the inside of the second cut grooves to the inside of the first cut grooves to obtain wide slits.

According to the biaxial processing method, processing can be performed using thin wires. Moreover, since the biaxial processing method does not greatly depend on the design of the piezoelectric/electrostrictive device, damage caused by the processing can be minimized and the number of processing steps can be decreased. In this case, it is preferable to use efficient feed processing including a wire retracting cycle (wires are gradually fed by alternately feeding and retracting the wires) during slit processing for forming the first and second cut grooves, and to remove the regions between the first and second cut grooves only by feeding, specifically, by feeding the wires only in one direction. The swing of the wires during processing is further decreased by removing the regions between the first and second cut grooves by feeding the wires only in one direction. In particular, damage to the side walls between the slits (areas which become piezoelectric/electrostrictive elements (piezoelectric/electrostrictive substances)), which may occur due to a change in environment between the initial stage and final stage of the processing, can be effectively prevented.

The biaxial processing method according to the second manufacturing method is described below with reference to FIGS. 35(a) to 35(e).

Figure 35A:
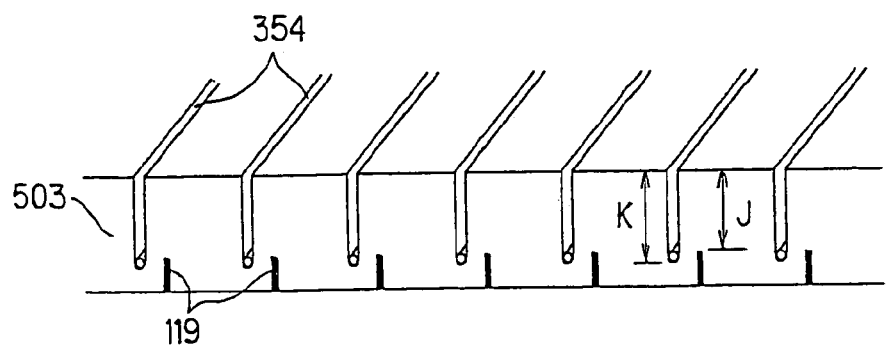
FIGS. 35(*a*) to 35(*e*) are explanatory diagrams showing steps of an example of a biaxial processing method for forming slits in a wire saw processing method which is a means of the second method of manufacturing the matrix type piezoelectric/electrostrictive device according to the present invention.
Figure 35B:
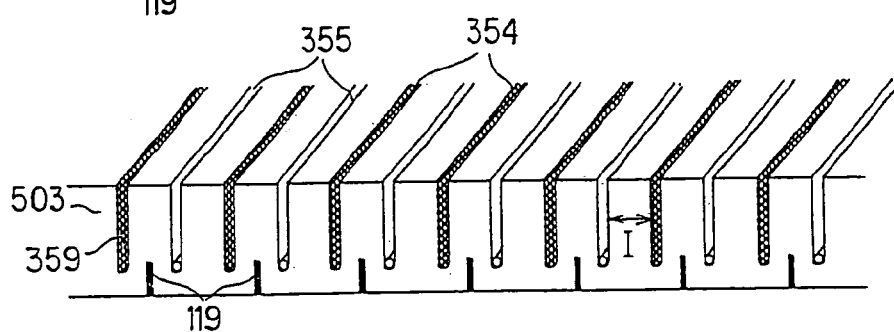

In FIG. 35(a), first cut grooves 354 are cut at specific positions of a ceramic sintered product 503 by using a wire saw in which wires are arranged at a specific pitch, so that the first cut grooves 354 have a depth K which is greater than a distance J from the surface of the ceramic sintered product 503 to via holes 119. The cut grooves 354 obtained by first cutting are filled with fillers 359 such as a resin. The ceramic sintered product 503 is cut at a distance I (thickness (or width) of the piezoelectric/electrostrictive substance) from the cut grooves 354 to obtain cut grooves 355 (FIG. 35(b)).

Figure 35C:
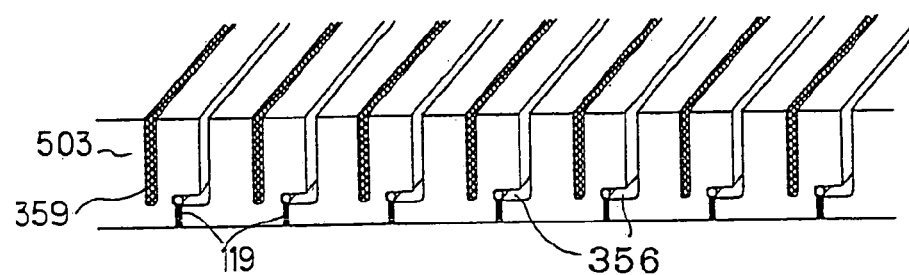
Figure 35D:
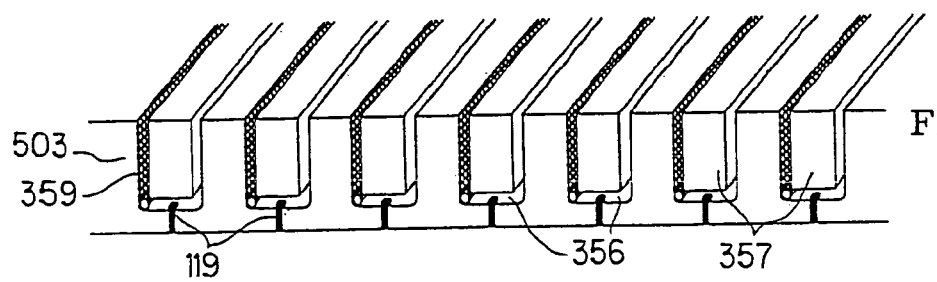
Figure 35E:
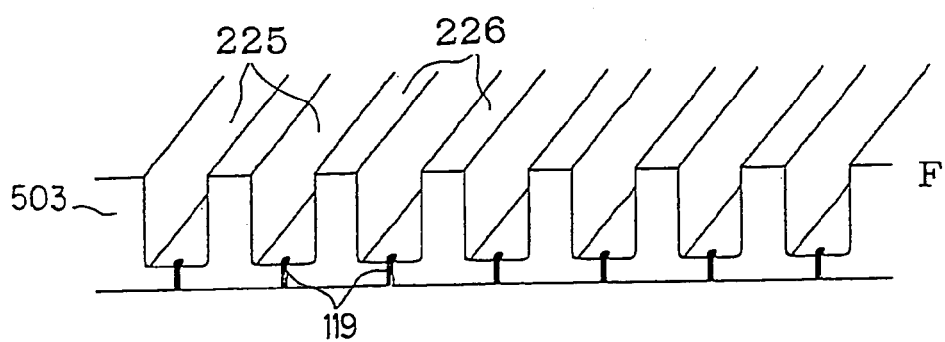

In FIG. 35(c), the ceramic sintered product 503 is cut from the bottom of the cut grooves 355 toward the cut grooves 354 adjacent in the direction opposite to an area which is allowed to remain as the piezoelectric/electrostrictive element. The cut grooves 354 and the cut grooves 355 are connected through cut grooves 356 by this cutting, whereby the via holes 119 are exposed in the cut grooves 356 and unnecessary portions 357 are removed (FIG. 35(d)).

The fillers 359, such as a resin with which the cut grooves 354 are filled, are removed to obtain a structure having wide slits 225 and side walls 226 which become the piezoelectric/electrostrictive substances formed between the slits 225. Slits formed in the direction which intersects the slits 225 as the slits 115 formed in the direction which intersects the slits 105 shown in FIGS. 31(a) to 31(h) may be processed in the same manner as described above.

Figure 36A:
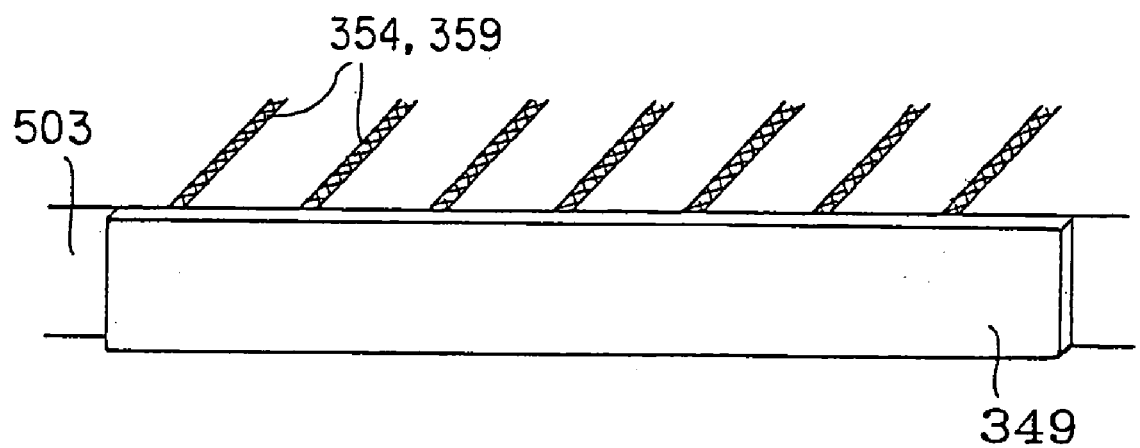
FIGS. 36(*a*) and 36(*b*) are explanatory diagrams showing steps of an example of the biaxial processing method for forming slits in the wire saw processing method which is a means of the second method of manufacturing the matrix type piezoelectric/electrostrictive device according to the present invention.
Figure 36B:
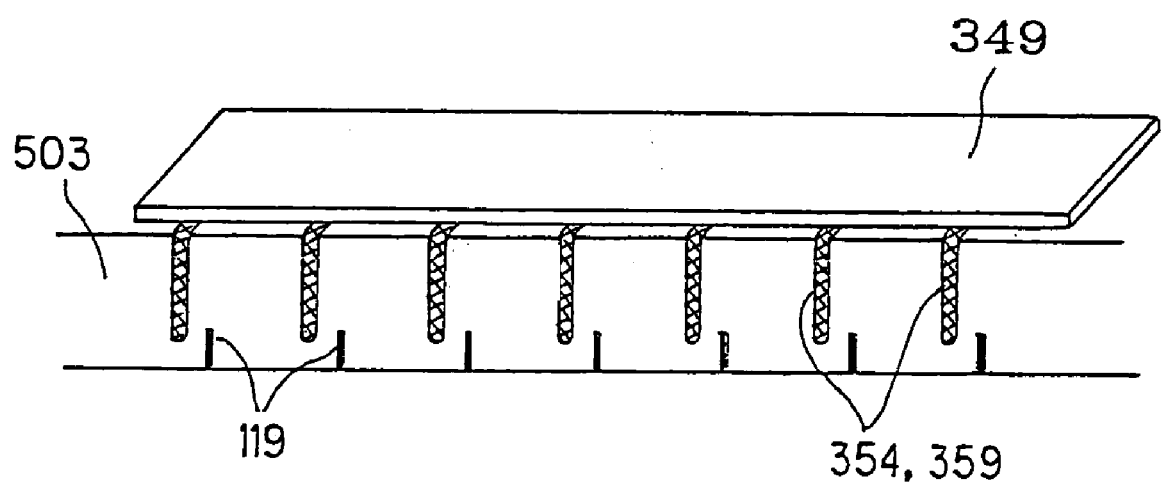

In the biaxial processing method, it is preferable to fill the cut grooves 354 with the fillers 359 and dispose a reinforcement member 349 shown in FIGS. 36(a) and 36(b) on the side (FIG. 36(a)) or the surface (FIG. 36(b)) of the ceramic sintered product 503 before processing the cut grooves 355. There may be a case where rigidity of the ceramic sintered product 503 is decreased by the cut grooves 354 cut in advance, whereby desired processing accuracy cannot be obtained due to escape of the wires or occurrence of processing deviation. However, these problems are solved by securing rigidity of the ceramic sintered product 503 by disposing the reinforcement member 349. It is still more preferable to dispose the reinforcement member 349 both on the side (FIG. 36(a)) and on the upper side (FIG. 36(b)). It is preferable to fill the cut grooves 354 with a plate-shaped hard material having a thickness a little less than the width of the grooves such as a ceramic material (alumina or zirconia, for example), together with the fillers 359.

In the second method of manufacturing the matrix type piezoelectric/electrostrictive device according to the present invention, the ceramic green formed product can be formed by using a press forming method, an injection molding method, or the like in addition to the method of stacking the ceramic green sheets. After forming the through holes or via holes in part of the resulting ceramic green formed product, the ceramic green formed product is sintered. The ceramic green formed product may be subjected to slit processing instead of processing the ceramic sintered product. However, it is preferable to subject the ceramic sintered product to slit processing, since processing accuracy and reproducibility are increased.

The method of manufacturing the matrix type piezoelectric/electrostrictive device according to the present invention is described above. The matrix type piezoelectric/electrostrictive device manufactured by the first manufacturing method has extremely excellent crystal grain conditions, in which occurrence of defects such as cracks in the piezoelectric/electrostrictive substance which makes up the piezoelectric/electrostrictive element is extremely decreased, and the percentage of transgranularly fractured crystal grains at least on the sides of the piezoelectric/electrostrictive substance on which the electrodes are formed is 1% or less. Therefore, deterioration of the piezoelectric characteristics is small and reliability as a structure is increased. Because of this, the matrix type piezoelectric/electrostrictive device is suitable for applications in which high load is applied such as in high-frequency drive.

The second manufacturing method excels in the degree of freedom relating to processing in comparison with the first manufacturing method, and enables the shape of the piezoelectric/electrostrictive element to be designed freely. The matrix type piezoelectric/electrostrictive device manufactured by the second manufacturing method also has extremely excellent crystal grain conditions in which occurrence of defects such as cracks in the piezoelectric/electrostrictive substance which makes up the piezoelectric element is extremely decreased, and the percentage of transgranularly fractured crystal grains at least on the sides of the piezoelectric/electrostrictive substance on which the electrodes are formed is 10% or less. However, since the matrix type piezoelectric/electrostrictive device manufactured by the second manufacturing method is inferior in performance to some extent in comparison with the matrix type piezoelectric/electrostrictive device obtained by the first manufacturing method, the matrix type piezoelectric/electrostrictive device manufactured by the second manufacturing method is suitable as a device which performs low-frequency or static operations in which load applied is relatively low.

The embodiments of the matrix type piezoelectric/electrostrictive device according to the present invention and the method of manufacturing the same are described above. However, the present invention is not limited to the above embodiments. For example, the surface of the piezoelectric/electrostrictive substance may be used as the active side of the piezoelectric/electrostrictive element. However, other member may be bonded to the element as the active side depending on hardness of the object of action, frequency of use, and the like, in addition to the example shown in FIG. 9. The above description mainly focuses on the case where the electrode terminals for driving the piezoelectric/electrostrictive element are formed on the back side of the ceramic substrate. However, the electrode terminals may be formed on the side on which the piezoelectric/electrostrictive elements are formed. In the case where the electrode terminals are formed on the back side of the ceramic substrate, it is preferable to mount a printed board on which a driver IC for driving each piezoelectric/electrostrictive elements or the like is mounted on the electrode terminals.

Materials used for the matrix type piezoelectric/electrostrictive device according to the present invention are described below.

A material for the piezoelectric/electrostrictive substance which is the drive section, specifically, a piezoelectric/electrostrictive material is described below. There are no specific limitations to the piezoelectric/electrostrictive material insofar as the material produces an electric field induced strain such as a piezoelectric effect or electrostrictive effect. The piezoelectric/electrostrictive material may be either crystalline or non-crystalline. Semiconductor ceramics, ferroelectric ceramics, or antiferroelectric ceramics may be used. The piezoelectric/electrostrictive material is appropriately selected corresponding to the purpose of use. The piezoelectric/electrostrictive material may be either a material for which polarization processing is necessary or a material for which polarization processing is unnecessary.

The piezoelectric/electrostrictive material is not limited to ceramics. The piezoelectric/electrostrictive material may be a piezoelectric material consisting of a polymer such as PVDF (polyvinylidene fluoride), or composite material of a polymer and ceramics. In this case, elements are formed by subjecting the polymer material to a heat treatment at about a thermosetting temperature of the polymer material without sintering from the viewpoint of thermal resistance of the polymer material.

A configuration having a high aspect ratio, which is one of the features of the matrix type piezoelectric/electrostrictive device according to the present invention, can be achieved more advantageously by using ceramics excelling in material hardness as the piezoelectric/electrostrictive material. Moreover, generated displacement and stress can be allowed to act effectively. It is preferable to use ceramics excelling in material characteristics because a piezoelectric/electrostrictive element having a high aspect ratio and superior characteristics at low voltage drive can be obtained.

As specific examples of ceramics materials, piezoelectric ceramics or electrostrictive ceramics containing lead zirconate, lead titanate, lead magnesium niobate, lead nickel niobate, lead zinc niobate, lead manganese niobate, lead antimony stannate, lead manganese tungstate, lead cobalt niobate, barium titanate, sodium bismuth titanate, bismuth neodium titanate (BNT), potassium sodium niobate, strontium bismuth tantalate, or the like individually, or as a mixture or a solid solution can be given.

These ceramics are preferably included in the ceramic component which makes up the piezoelectric/electrostrictive substance in an amount of 50 wt % or more as a major component. In particular, use of a material containing lead zirconate titanate (PZT) as a major component, a material containing lead magnesium niobate (PMN) as a major component, a material containing lead nickel niobate (PNN) as a major component, a material containing a mixture or a solid solution of lead zirconate, lead titanate, and lead magnesium niobate as a major component, a material containing a mixture or a solid solution of lead zirconate, lead titanate, and lead nickel niobate as a major component, or a material containing sodium bismuth titanate as a major component is preferably used, since these materials have a high electromechanical coupling factor and a high piezoelectric constant, and a material having a stable composition is easily obtained after sintering.

Ceramics in which an oxide of lanthanum, calcium, strontium, molybdenum, tungsten, barium, niobium, zinc, nickel, manganese, cerium, cadmium, chromium, cobalt, antimony, iron, yttrium, tantalum, lithium, bismuth, tin, or the like is added to the above material either individually or in combination of two or more may also be used. For example, there may a case where advantages such as capability of adjusting a coercive electric field or piezoelectric characteristics are obtained by adding lanthanum or strontium to lead zirconate, lead titanate, and lead magnesium niobate which are major components.

As examples of antiferroelectric ceramics, ceramics containing lead zirconate as a major component, ceramics containing a mixture or a solid solution of lead zirconate and lead stannate as a major component, ceramics containing lead zirconate as a major component to which was lanthanum oxide is added, ceramics containing a mixture or a solid solution of lead zirconate and lead stannate as a major component to which lead niobate is added, and the like can be given. As a material for the ceramic substrate, a material which can be integrated with the piezoelectric/electrostrictive substance by a heat treatment or sintering is used. It is preferable to use a material having the same components as the piezoelectric/electrostrictive substance to be integrated therewith, and still more preferably a material having the same components and composition as the piezoelectric/electrostrictive substance.

The average size of the ceramic crystal grains is preferably 0.05 to 2 µm in a design in which mechanical strength of the piezoelectric/electrostrictive substance as the drive section is important. This is because mechanical strength of the piezoelectric/electrostrictive substance can be increased. The average size of the ceramic crystal grains is preferably 1 to 7 µm in the design in which extraction/contraction characteristics of the piezoelectric/electrostrictive substance as the drive section is important. This is because superior piezoelectric characteristics can be obtained.

There are no specific limitations to a material for the electrodes insofar as the material is solid at ambient temperature. The material for the electrodes may be a single metal or an alloy. The material may be a mixture of insulating ceramics such as zirconium oxide, hafnium oxide, titanium oxide, or cerium oxide and a single metal or an alloy. In the case of forming the electrodes before sintering the piezoelectric, high-melting-point noble metals such as platinum, palladium, or rhodium, an electrode material containing an alloy such as silver-palladium, silver-platinum, or platinum-palladium as a major component, or a mixture of platinum and a substrate material or piezoelectric/electrostrictive material, and a cermet material thereof are suitably used.

In the case of forming the electrodes before sintering the piezoelectric/electrostrictive substance, in addition to the above electrode materials, a single metal such as aluminum, titanium, chromium, iron, cobalt, nickel, copper, zinc, niobium, molybdenum, ruthenium, silver, tin, tantalum, tungsten, gold, or lead, or an alloy of these metals may be used.

As a material for the conductor with which the via holes in the ceramic substrate are filled, a mixture of the substrate material and a high-melting-point noble metal or a cermet material thereof is suitably used since breakage rarely occurs even in the case of sintering the material together with the ceramic substrate, and bonding strength with the ceramic substrate is obtained.

The electrodes may be formed by using these materials by sputtering, vacuum deposition, CVD, plating, or the like. The electrodes may be formed of an objective material by forming a film using an organometallic compound (resinate) containing a metal element for the electrodes by coating or spraying and subjecting the resulting film to a heat treatment.

As described above, the present invention provides a matrix type piezoelectric/electrostrictive device capable of solving the conventional problems, producing large displacement and large force generation at a lower voltage, having a high response speed, excelling in mounting capability, and enabling a high aspect ratio and a high degree of integration in comparison with conventional devices, and a method of manufacturing the same.

The matrix type piezoelectric/electrostrictive device can be suitably applied to an optical modulator, optical switch, electrical switch, microrelay, microvalve, transportation device, image display device such as a display and projector, image drawing device, micropump, droplet discharge device, micromixer, microstirrer, microreactor, various types of sensors, and the like.

What is claimed is:

1. A method of manufacturing a matrix type piezoelectric/electrostrictive device in which a plurality of piezoelectric/electrostrictive elements almost in the shape of a pillar are two-dimensionally arranged on a thick ceramic substrate, wherein each of the piezoelectric/electrostrictive elements includes a piezoelectric/electrostrictive substance and at least a pair of electrodes, the percentage of transgranularly fractured crystal grains on at least the sides of the piezoelectric/electrostrictive substance on which the electrodes are formed is 1% or less, and the piezoelectric/electrostrictive substance forms a curved surface near a joined section between the piezoelectric/electrostrictive substance and the ceramic substrate, characterized in that the method comprises:
   a first step of providing a plurality of ceramic green sheets containing a piezoelectric/electrostrictive material as a major component,
   a second step of forming opening sections having an almost right-angled quadrilateral shape, in which at least two corners are curved, at specific positions of a plurality of the ceramic green sheets,
   a third step of stacking a plurality of the ceramic green sheets in which the opening sections are formed to obtain a ceramic green laminate having holes,
   a fourth step of integrally sintering the ceramic green laminate to obtain a ceramic laminate having holes,
   a fifth step of forming electrodes at least on side walls which make up the holes in the ceramic laminate,
   a sixth step of cutting the ceramic laminate at specific positions in a direction perpendicular to the arrangement of the holes and perpendicular to the openings of the holes to obtain a comb tooth-shaped ceramic laminate, and
   a seventh step of cutting the comb tooth of the comb tooth-shaped ceramic laminate in a direction perpendicular to the cutting surface obtained in the sixth step and perpendicular to the arrangement of the comb tooth.

2. The method of manufacturing a matrix type piezoelectric/electrostrictive device according to claim 1, wherein the ceramic green laminate consists of at least two types of ceramic green sheets, one of the two types of ceramic green sheets is a specific number of ceramic green sheets in which a plurality of opening sections almost in the shape of a right-angled quadrilateral in which two corners are curved are formed, and the other of the two types of ceramic green sheets is a specific number of ceramic green sheets in which a plurality of opening sections almost in the shape of a right-angled quadrilateral and a plurality of other opening sections connected with the opening sections in the shape of a right-angled quadrilateral are formed.

3. The method of manufacturing a matrix type piezoelectric/electrostrictive device according to claim 2, wherein the other opening sections are connected with the opening sections almost in the shape of a right-angled quadrilateral and connected with the ends of the ceramic green sheets.

4. The method of manufacturing a matrix type piezoelectric/electrostrictive device according to claim 2, comprising a step of cutting the ceramic laminate, thereby opening each of the other opening sections.

5. The method of manufacturing a matrix type piezoelectric/electrostrictive device according to claim 1, wherein the cutting in the seventh step is performed by wire saw processing.

6. The method of manufacturing a matrix type piezoelectric/electrostrictive device according to claim 1, comprising a step of filling space between the comb tooth with fillers after the fifth step, but before the seventh step.

7. A method of manufacturing a matrix type piezoelectric/electrostrictive device in which a plurality of piezoelectric/electrostrictive elements almost in the shape of a pillar are two-dimensionally arranged on a thick ceramic substrate, wherein each of the piezoelectric/electrostrictive elements includes a piezoelectric/electrostrictive substance and at least a pair of electrodes, the percentage of transgranularly fractured crystal grains on at least the sides of the piezoelectric/electrostrictive substance on which the electrodes are formed is 10% or less, and the piezoelectric/electrostrictive substance forms a curved surface near a joined section between the piezoelectric/electrostrictive substance and the ceramic substrate,
   characterized in that the method comprises:
   a step A of providing a ceramic green formed product containing a piezoelectric/electrostrictive material as a major component,
   a step B of sintering a ceramic precursor including at least the ceramic green formed product to obtain an integral ceramic sintered product,
   a step C of forming a plurality of first slits in the ceramic sintered product by a machining method utilizing loose abrasives as processing media,
   a step D of forming the electrodes on the sides of the first slits, and
   a step E of forming a plurality of second slits which intersect the first slits.

8. The method of manufacturing a matrix type piezoelectric/electrostrictive device according to claim 7, wherein the ceramic green formed product is formed by stacking a plurality of ceramic green sheets.

9. The method of manufacturing a matrix type piezoelectric/electrostrictive device according to claim 7, wherein the ceramic precursor is formed of at least a ceramic green substrate having through holes or via holes and the ceramic green formed product.

10. The method of manufacturing a matrix type piezoelectric/electrostrictive device according to claim 7, wherein the machining method is a wire sawing method.

11. The method of manufacturing a matrix type piezoelectric/electrostrictive device according to claim 10, wherein the first slits and/or the second slits are formed by performing first cutting which includes processing the ceramic sintered product in the direction of the thickness to obtain first cut grooves, second cutting which includes processing the ceramic sintered product in the direction of the thickness at a specific distance from the first cutting position to obtain second cut grooves, and third cutting which includes cutting the ceramic sintered product from the inside of the second cut grooves toward the inside of the first cut grooves, thereby removing regions between the first cut grooves and the second cut grooves.

12. The method of manufacturing a matrix type piezoelectric/electrostrictive device according to claim 11, wherein the first cut grooves are filled with fillers after the first cutting, but before the second cutting.

13. The method of manufacturing a matrix type piezoelectric/electrostrictive device according to claim 7, comprising a step of filling the first slits with fillers after the step C, but before the step E.

* * * * *